(12) United States Patent
Yamaguchi et al.

(10) Patent No.: US 9,541,684 B2
(45) Date of Patent: *Jan. 10, 2017

(54) SUBSTRATE FOR OPTICS AND LIGHT EMITTING DEVICE

(71) Applicant: Asahi Kasei E-materials Corporation, Tokyo (JP)

(72) Inventors: Fujito Yamaguchi, Tokyo (JP); Jun Koike, Tokyo (JP); Naoki Inoue, Tokyo (JP)

(73) Assignee: ASAHI KASEI E-MATERIALS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/369,126

(22) PCT Filed: Dec. 25, 2012

(86) PCT No.: PCT/JP2012/083497
§ 371 (c)(1),
(2) Date: Jun. 26, 2014

(87) PCT Pub. No.: WO2013/099875
PCT Pub. Date: Jul. 4, 2013

(65) Prior Publication Data
US 2014/0326988 A1    Nov. 6, 2014

(30) Foreign Application Priority Data

Dec. 27, 2011  (JP) ................................. 2011-284820
Feb. 7, 2012  (JP) ................................. 2012-024035

(51) Int. Cl.
*G02B 5/18*  (2006.01)
*H05B 33/02*  (2006.01)
(Continued)

(52) U.S. Cl.
CPC ........... *G02B 5/1861* (2013.01); *G02B 5/1809* (2013.01); *H01L 51/0096* (2013.01);
(Continued)

(58) Field of Classification Search
CPC . G02B 5/1861; G02B 5/1809; H01L 51/5262; H01L 51/0096; H05B 33/02; Y02E 10/549
See application file for complete search history.

(56) References Cited

U.S. PATENT DOCUMENTS 4,794,302 A   12/1988  Nire et al.
6,670,772 B1  12/2003  Arnold et al.
(Continued)

FOREIGN PATENT DOCUMENTS

JP    62-172691 A    7/1987
JP    2001-230069 A  8/2001
(Continued)

OTHER PUBLICATIONS

Korean Office Action dated Apr. 13, 2015, for Korean Application No. 10-2014-7017524.
(Continued)

*Primary Examiner* — John P Dulka
(74) *Attorney, Agent, or Firm* — Birch, Stewart, Kolasch & Birch, LLP

(57) ABSTRACT

To provide a substrate for optics for enabling the color shift caused by diffraction of light to be reduced, a substrate for optics (12) is provided with a fine-structure layer including dots (31) comprised of a plurality of convex portions or concave portions extending in the direction of from a main surface of a substrate to outside the surface, the fine-structure layer has a plurality of dot lines in which a plurality of dots is arranged with a pitch (Py) in the first direction inside the main surface of the substrate, while having a (Continued)

plurality of dot lines in which a plurality of dots is arranged with a pitch (Px) in the second direction orthogonal to the first direction inside the main surface of the substrate, and both of the pitch Py and the pitch Px are inconstant intervals and are of nano-order.

9 Claims, 20 Drawing Sheets

(51) Int. Cl.
H01L 51/00 (2006.01)
H01L 51/52 (2006.01)
(52) U.S. Cl.
CPC ......... *H01L 51/5262* (2013.01); *H05B 33/02* (2013.01); *Y02E 10/549* (2013.01)

(56) References Cited

U.S. PATENT DOCUMENTS

| | | | |
|---|---|---|---|
| 6,734,624 B2 | 5/2004 | Tada et al. | |
| 2001/0019242 A1* | 9/2001 | Tada | H01L 51/5262 313/504 |
| 2005/0007000 A1 | 1/2005 | Chou et al. | |
| 2009/0015142 A1 | 1/2009 | Potts et al. | |
| 2009/0108251 A1* | 4/2009 | Kabir | B82Y 10/00 257/14 |
| 2010/0297795 A1 | 11/2010 | Ishihara | |

FOREIGN PATENT DOCUMENTS

| | | |
|---|---|---|
| JP | 2004-31350 A | 1/2004 |
| JP | 2004-513483 A | 4/2004 |
| JP | 2004-311419 A | 11/2004 |
| JP | 2005-284276 A | 10/2005 |
| JP | 2006-269163 A | 10/2006 |
| JP | 2008-235605 A | 10/2008 |
| JP | 2009-158478 A | 7/2009 |
| JP | 2010-533932 A | 10/2010 |
| JP | 2011-222421 A | 11/2011 |
| JP | 2011-255603 A | 12/2011 |
| WO | WO 2013/032759 A1 | 3/2013 |

OTHER PUBLICATIONS

International Preliminary Report on Patentability and English translation of the Written Opinion of the International Searching Authority dated Jul. 10, 2014, for International Application No. PCT/JP2012/083497.

Base of photo nanotechnology, Ohmsha, Ltd., 2003, pp. 35.

Feng et al., "Enhancement of electroluminescence through a two-dimensional corrugated metal film by grating-induced surface-plasmon cross coupling", Optics Letters, Sep. 1, 2005, vol. 30, No. 17, pp. 2302-2304.

Feng et al., "Enhancement of surface plasmon-mediated radiative energy transfer through a corrugated metal cathode in organic light-emitting devices", Applied Physics Letters, 2008, vol. 93, No. 051106, pp. 1-3.

Gianordoli et al., "Optimization of the emission characteristics of light emitting diodes by surface plasmons and surface waveguide modes", Applied Physics Letters, Oct. 9, 2000, vol. 77, No. 15, pp. 2295-2297.

Gifford et al., "Extraordinary transmission of organic photoluminescence through an otherwise opaque metal layer via surface plasmon cross coupling", Applied Physics Letters, May 20, 2002, vol. 80, No. 20, pp. 3679-3681.

International Search Report, issued in PCT/JP2012/083497, dated Apr. 2, 2013.

Okamoto et al., "Surface-plasmon-enhanced light emitters based on InGaN quantum wells", Nature Materials, Sep. 2004, vol. 3, pp. 601-605.

Supplementary European Search Report dated Jun. 24, 2015, for Euroepan Application No. 12863077.

* cited by examiner

SUBSTRATE FOR OPTICS AND LIGHT EMITTING DEVICE

TECHNICAL FIELD

The present invention relates to a substrate for optics applicable to organic EL used in a display, illumination and the like, and a light emitting device using the substrate.

BACKGROUND ART

In recent years, to improve luminous efficiency in a light emitting device such as organic EL, fluorescence and LED, improvements have been studied in light emitting materials, low voltage, light extraction efficiency and the like.

As a method of improving light extraction efficiency, it is studied to introduce a light scattering layer and low refractive index layer in a light emitting device, and the like (Patent Documents 1 and 2). Further, such a method is known that the travel direction of light in the waveguide mode is polarized to the direction of the light emitting device surface using diffraction of light to improve light extraction efficiency (Patent Document 3). Furthermore, such a technique is invented that metal periodical grid structure or fine-particle dispersing element is provided near a light emitting portion in a light emitting device to excite surface plasmons, thereby extracting light to the outside with high efficiency (Patent Documents 4 and 5, Non-patent Documents 1 to 5).

In propagating surface plasmons on a metal surface, a polarized wave of free electrons generated by an electromagnetic wave (visible light, etc.) incident upon a conductive material surface such as a metal forms an electric field of the transverse wave on the surface. In the case of propagating surface plasmons existing on a flat metal surface, the dispersion straight line of propagated light does not cross a dispersion curve of plasmons, and therefore, the propagated light is not able to directly excite plasmons. However, when the periodical grid structure exists on the metal surface, diffracted light Bragg-reflected by the grid crosses a dispersion curve of plasmons, and the incident electromagnetic wave and the polarized wave of free electrons on the metal surface are capable of generating a resonance state (Non-patent Document 6).

At this point, the wave number vector of surface plasmons is a value equal to the wavelength of light, and exciton and light is coupled coherently to be exciton polariton. Polariton is a state in which the polarized wave of free electron and electromagnetic wave exchange energy by resonance. When the pitch and height of the periodical grid structure are substantially constant, i.e. when crystalline of the periodical grid structure is high, the surface plasmons have one wave number vector, are coupled to light with particular incident angle and wavenumber (wavelength), and an emission enhancement phenomenon is observed by the so-called surface plasmon resonance.

For example, in Non-patent Document 5, it is disclose that, to induce coupling of light and surface plasmons in a light emitting layer inside an organic light emitting device, a grid structure of a periodical waveform is used, thereby prevent transmission and waveguide in the transverse direction of emitted light while enhancing light output and efficiency of the structure body. According to this method, theoretically, it is possible to couple light emitted from the organic light emitting material inside the organic EL light emitting device up to maximum 93%.

Further, Non-patent Document 3 shows that luminous efficiency of blue light by UV excitation of semiconductor quantum well structure is enhanced by periodical structure of silver. Furthermore, Non-patent Document 4 shows that luminous efficiency of an LED is enhanced also by periodical structure of silver.

Moreover, the light emitting device of organic EL or the like adopts a configuration that a high refractive index region is sandwiched between low refractive index regions. Since a light emitting portion is included in the high refractive index region, light emitted in the light emitting portion becomes the waveguide mode, and is confined within the high refractive index region, while being absorbed in the waveguide process to attenuate. Accordingly, it is not possible to extract light outside the device, and light extraction efficiency significantly decreases.

In order to effectively improve light extraction efficiency, it is necessary to disturb the waveguide mode at an early stage before the emitted light attenuates. Therefore, to improve light extraction efficiency, proposed is a method for forming an intermediate refractive index layer between the low refractive index region and the high refractive index region (Patent Document 6).

However, in the method as disclosed in Patent Document 6, it is not possible to disturb total reflection, the totally reflected light maintains the waveguide mode and attenuates, and therefore, significant improvements in light extraction efficiency are not expected. On the other hand, as an example of disturbing the waveguide mode and improving light extraction efficiency, proposed is a method for extracting light confined by the waveguide mode with a periodical structure provided near a substrate as diffracted light (Patent Document 7).

PRIOR ART DOCUMENT

Patent Document

[Patent Document 1] Japanese Unexamined Patent Publication No. 2008-235605
[Patent Document 2] Japanese Patent Translation Publication No. 2004-513483
[Patent Document 3] Japanese Unexamined Patent Publication No. 2001-230069
[Patent Document 4] Japanese Unexamined Patent Publication No. 2004-31350
[Patent Document 5] Japanese Unexamined Patent Publication No. 2009-158478
[Patent Document 6] Japanese Unexamined Patent Publication No. S62-172691
[Patent Document 7] Japanese Patent Translation Publication No. 2010-533932

Non-Patent Document

[Non-patent Document 1] Opt. Lett., 30, 2302 (2005) Enhancement of EL through a two-dimensional corrugated metal film by grating-induced surface plasmon cross coupling
[Non-patent document 2] Appl. Phys. Lett., 93, 051106 (2008) Enhancement of surface plasmon-mediated radioactive energy transfer through a corrugated metal cathode in organic light-emitting devices
[Non-patent Document 3] Nature Mater., 3, 601(2004) Surface Plasmon enhanced light emitters based on InGaN quantum wells

[Non-patent Document 4] Appl. Phys. Lett., 77, 15, 2295 (2000) Optimization of the emission characteristics of LED by SP and surface waveguide mode

[Non-patent Document 5] Appl. Phys. Lett., Vol. 80, No. 20, 3679 (2002)

[Non-patent Document 6] Base of photo nanotechnology, Ohmsha, Ltd. P. 35 (2003)

DISCLOSURE OF INVENTION

Problems to be Solved by the Invention

Among the conventional techniques, in introducing the periodical grid structure of metal near the light emitting portion and extracting light from the light emitting device using surface plasmon resonance, it is necessary to provide a substantially uniform periodical grid structure over the entire surface of the device, and since the periodicity is the size of diffracting visible light, there is a problem of developing an abrupt color shift caused by diffraction of light when the observation direction is varied.

Further, in the method of disturbing the waveguide mode using diffraction of light based on the periodical structure as described in Patent Document 2, glare specific to diffraction of light based on the periodical structure occurs in the light extracted from the light emitting device. Herein, the glare refers to the phenomenon that light with a particular wavelength is observed as a point-shaped bright spot at a particular angle, and is emission in the shape of a bright spot accompanied by the color shift.

The above-mentioned color shift and glare is the fatal problems as a display or light emitting device for illumination, and even when light extraction efficiency is improved as the entire device, it is hard to adopt as practical use. Thus, in the case of using the diffraction structure, light extraction efficiency and light-emitting characteristics of the color shift and glare are mutually contradictory.

The present invention was made in view of such a respect, and it is an object of the invention to provide a substrate for optics and light emitting device for improving light extraction efficiency, and enabling the color shift and glare caused by diffraction of light to be suppressed.

Means for Solving the Problem

A substrate for optics of the present invention is a substrate for optics applied to an organic EL light emitting device comprised of at least an anode, a cathode and a light emitting layer in which the light emitting layer has one or more organic layers, and is characterized of being provided with a fine-structure layer including dots comprised of a plurality of convex portions or concave portions extending in the direction of from a main surface of a substrate to outside the surface, where the fine-structure layer forms a plurality of dot lines in which the plurality of dots is arranged with a pitch Py in the first direction inside the main surface of the substrate, while the plurality of dot lines forms a plurality of dot lines arranged with a pitch Px in the second direction orthogonal to the first direction inside the main surface of the substrate, and one of the pitch Py and the pitch Px is a constant interval of nano-order, while the other one is an inconstant interval of nano-order, or both are inconstant intervals of nano-order.

In the substrate for optics of the invention, the inconstant interval of nano-order preferably has a variable width δ.

In the substrate for optics of the invention, it is preferable that the pitch Py with the inconstant interval is equal to a distance between centers of respective dots, the pitch Px with the inconstant interval is equal to a distance among a plurality of dot lines that the plurality of dots is arranged with the pitch Py, the pitch Py and the pitch Px are larger than a diameter of each dot, pitches Pyn among at least four or more and m or less of adjacent dots ($3 \leq n \leq 2a$ or $3 \leq n = 2a+1$, in addition, m and a are positive integers and $n = m-1$) meet the relationship of following equation (1) while at least one or more dot groups formed with the pitches Py1 to Pyn are arranged in the first direction when the pitch Py is the inconstant interval, and that when the pitch Px is the inconstant interval, pitches Pxn among at least four or more and m or less of adjacent dots ($3 \leq n \leq 2a$ or $3 \leq n \leq 2a+1$. In addition, m and a are positive integers and $n = m-1$) meet the relationship of following equation (2) while at least one or more dot line groups formed with the pitches Px1 to Pxn are arranged in the second direction.

$$Py1 < Py2 < Py3 < \ldots < Pya > \ldots > Pyn \quad (1)$$

$$Px1 < Px2 < Px3 < \ldots < Pxa > \ldots > Pxn \quad (2)$$

In the substrate for optics of the invention, it is preferable that the pitch Py with the inconstant interval is equal to a distance between centers of respective dots, the pitch Px with the inconstant interval is equal to a distance among a plurality of dot lines that the plurality of dots is arranged with the pitch Py, the pitch Py and the pitch Px are larger than a diameter of each dot, pitches Pyn among at least four or more and m or less of adjacent dots ($3 \leq n \leq 2a$ or $3 \leq n \leq 2a+1$, in addition, m and a are positive integers and $n = m-1$) meet the relationship of above-mentioned equation (1) while dot groups formed with the pitches Py1 to Pyn are formed by repeatedly arranging a long-period unit Lyz in the first direction when the pitch Py is the inconstant interval, and that when the pitch Px is the inconstant interval, pitches Pxn among at least four or more and m or less of adjacent dots ($3 \leq n \leq 2a$ or $3 \leq n \leq 2a+1$, in addition, m and a are positive integers and $n = m-1$) meet the relationship of above-mentioned equation (2) while dot line groups formed with the pitches Px1 to Pxn are formed by repeatedly arranging a long-period unit Lxz in the second direction.

In the substrate for optics of the invention, it is preferable that the diameter of each of the dots increases or decreases corresponding to the pitch Py and/or the pitch Px, dot diameters Dyn of at least four or more and m or less of adjacent dots ($3 \leq n \leq 2a$ or $3 \leq n \leq 2a+1$, in addition, m and a are positive integers and $n = m-1$) forming the pitch meet the relationship of following equation (3) while at least one or more dot groups formed with the dot diameters Dy1 to Dyn are arranged in the first direction when the pitch Py is the inconstant interval, and that when the pitch Px is the inconstant interval, dot diameters Dxn of at least four or more and m or less of adjacent dots ($3 \leq n \leq 2a$ or $3 \leq n \leq 2a+1$, in addition, m and a are positive integers and $n = m-1$) forming the pitch meet the relationship of following equation (4) while at least one or more dot groups formed with the dot diameters Dx1 to Dxn are arranged in the second direction.

$$Dy1 < Dy2 < Dy3 < \ldots < Dya > \ldots > Dyn \quad (3)$$

$$Dx1 < Dx2 < Dx3 < \ldots < Dxa > \ldots > Dxn \quad (4)$$

In the substrate for optics of the invention, it is preferable that the diameter of each of the dots increases or decreases corresponding to the pitch Py and/or the pitch Px, dot diameters Dyn of at least four or more and m or less of adjacent dots ($3 \leq n \leq 2a$ or $3 \leq n \leq 2a+1$, in addition, m and a are positive integers and n=m−1) forming the pitch meet the relationship of above-mentioned equation (3) while dot groups formed with the dot diameters Dy1 to Dyn are repeatedly arranged in a long-period unit Lyz in the first direction when the pitch Py is the inconstant interval, and that when the pitch Px is the inconstant interval, dot diameters Dxn of at least four or more and m or less of adjacent dots (3≤n≤2a or 3≤n≤2a+1, in addition, m and a are positive integers and n=m−1) forming the pitch meet the relationship of above-mentioned equation (4) while dot groups formed with the dot diameters Dx1 to Dxn are repeatedly arranged in a long-period unit Lxz in the second direction.

In the substrate for optics of the invention, it is preferable that the height of each of the dots increases or decreases corresponding to the pitch Py and/or the pitch Px, dot heights Hyn of at least four or more and m or less of adjacent dots (3≤n≤2a or 3≤n≤2a+1, in addition, m and a are positive integers and n=m−1) forming the pitch meet the relationship of following equation (5) while at least one or more dot groups formed with the dot heights Hy1 to Hyn are arranged in the first direction when the pitch Py is the inconstant interval, and that when the pitch Px is the inconstant interval, dot heights Hxn of at least four or more and m or less of adjacent dots (3≤n≤2a or 3≤n≤2a+1, in addition, m and a are positive integers and n=m−1) forming the pitch meet the relationship of following equation (6) while at least one or more dot groups formed with the dot heights Hx1 to Hxn are arranged in the second direction.

$$Hy1 < Hy2 < Hy3 < \ldots < Hya > \ldots > Hyn \quad (5)$$

$$Hx1 < Hx2 < Hx3 < \ldots < Hxa > \ldots > Hxn \quad (6)$$

In the substrate for optics of the invention, it is preferable that the height of each of the dots increases or decreases corresponding to the pitch Py and/or the pitch Px, dot heights Hyn of at least four or more and m or less of adjacent dots (3≤n≤2a or 3≤n≤2a+1, in addition, m and a are positive integers and n=m−1) forming the pitch meet the relationship of above-mentioned equation (5) while dot groups formed with the dot heights Hy1 to Hyn are repeatedly arranged in a long-period unit Lyz in the first direction when the pitch Py is the inconstant interval, and that when the pitch Px is the inconstant interval, dot heights Hxn of at least four or more and m or less of adjacent dots (3≤n≤2a or 3≤n≤2a+1, in addition, m and a are positive integers and n=m−1) forming the pitch meet the relationship of above-mentioned equation (6) while dot groups formed with the dot heights Hx1 to Hxn are repeatedly arranged in a long-period unit Lxz in the second direction.

A substrate for optics of the invention is a substrate for optics applied to an organic EL light emitting device comprised of at least an anode, a cathode and a light emitting layer in which the light emitting layer has one or more organic layers, and is characterized by being provided with a fine-structure layer including a plurality of dots comprised of a plurality of convex portions or concave portions extending in the direction of from a main surface of a substrate to outside the surface, where the fine-structure layer forms dot lines in which the plurality of dots is arranged with a pitch Py of a constant interval of nano-order in the first direction inside the main surface of the substrate, the dot lines are provided parallel with a pitch Px of a constant interval in the second direction orthogonal to the first direction, and a shift amount α1 in the first direction between adjacent first dot line and second dot line is different from a shift amount α2 in the first direction between the second dot line and a third dot line adjacent to the second dot line.

In the substrate for optics of the invention, it is preferable that a difference between the shift amount α1 and the shift amount α2 is not constant.

A substrate for optics of the invention is a substrate for optics applied to an organic EL light emitting device comprised of at least an anode, a cathode and a light emitting layer in which the light emitting layer has one or more organic layers, and is characterized in that formed is a fine-structure layer including lines comprised of a plurality of convex portions extending in the direction of from a substrate main surface of the substrate to outside the surface, a line structure is formed along the first direction inside the substrate main surface and has a plurality of line lines with the plurality of lines arranged with a pitch Px in the second direction orthogonal to the first direction inside the substrate main surface, and that the pitch Px is an inconstant interval of nano-order.

In the substrate for optics of the invention, it is preferable that the above-mentioned pitch Px with the inconstant interval is larger than a convex-portion width of the line structure, at least four or more and m or less of adjacent pitches (3≤n≤2a or 3≤n≤2a+1, in addition, m and a are positive integers and n=m−1) meet the relationship of following equation (7), and that a long period Lz formed with the pitches Px1 to Pxn is repeatedly arranged in the second direction.

$$Px1 < Px2 < Px3 < \ldots < Pxa > \ldots > Pxn \quad (7)$$

In the substrate for optics of the invention, the substrate is preferably comprised of a resin.

In the substrate for optics of the invention, it is preferable that a surface of the substrate is coated with a metal film. Further, it is also preferable that the substrate is comprised of a metal.

In the substrate for optics of the invention, it is preferable that the substrate is comprised of at least a substrate and a material constituting the fine-structure layer, and that a difference between a refractive index of the material constituting the fine-structure layer and a refractive index of the substrate is 0.15 or less.

In the substrate for optics of the invention, it is preferable that a surface of the substrate is coated with a metal film.

In the substrate for optics of the invention, it is preferable that the substrate is comprised of a metal.

In the substrate for optics of the invention, it is preferable that the substrate is provided with a transparent dielectric layer, provided on the dots or the lines of the fine-structure layer of the substrate, having a fine concavo-convex structure of a shape associated with the dots comprised of the plurality of convex portions or concave portions or the lines comprised of the plurality of convex portions of the fine-structure layer, and that a surface on the side opposite to a surface having the fine concavo-convex structure of the transparent dielectric layer is flattened.

A light emitting device of the invention is characterized by having at least one substrate for optics as described above, and that the light emitting layer is disposed opposite the main surface on the fine-structure layer side of the substrate for optics.

Advantageous Effect of the Invention

According to the present invention, it is possible to provide the substrate for optics and light emitting device for improving light extraction efficiency, and enabling the color shift and glare caused by diffraction of light to be suppressed.

BEST MODE FOR CARRYING OUT THE INVENTION

Figure 1:
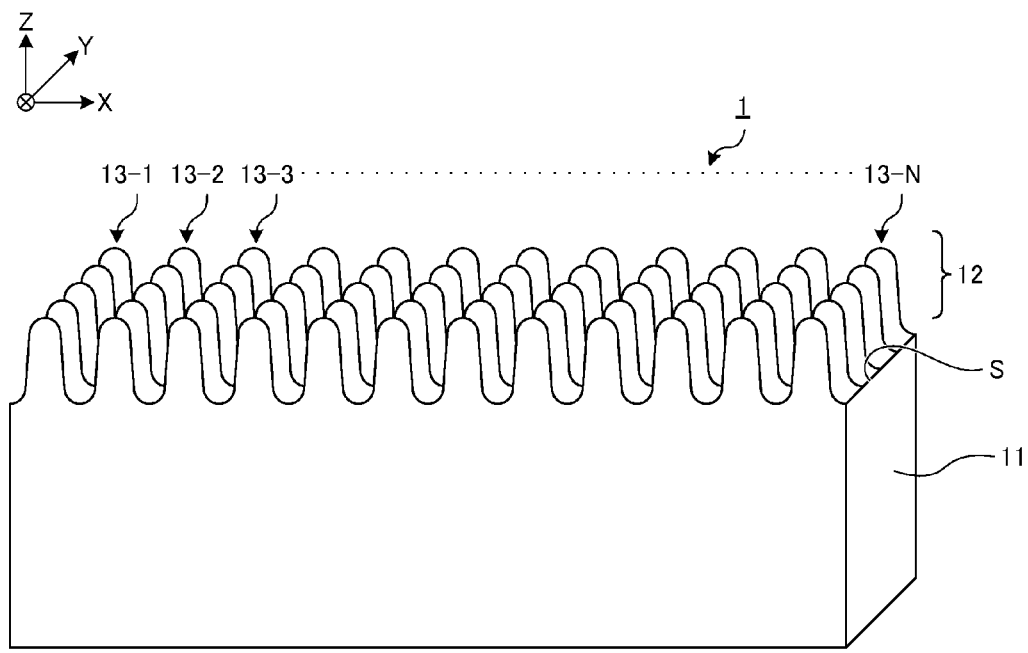
FIG. 1 is a perspective schematic diagram showing an example of a substrate for optics according to Embodiment 1.

Embodiments of the present invention will specifically be described below.

A substrate for optics according to this Embodiment is characterized by being provided with a fine-structure layer including dots comprised of a plurality of convex portions or concave portions extending in the direction of from the main surface of a substrate to outside the surface, where the fine-structure layer forms a plurality of dot lines in which the plurality of dots is arranged with a pitch Py in the first direction inside the main surface of the substrate, while the plurality of dot lines forms a plurality of dot lines arranged with a pitch Px in the second direction orthogonal to the first direction inside the main surface of the substrate, and one of the pitch Py and the pitch Px is a constant interval of nano-order, while the other one is an inconstant interval of nano-order, or both are inconstant intervals of nano-order.

According to this configuration, since concavities and convexities of nano-order are provided on the surface of the substrate, in the case of using surface plasmons, luminous efficiency is improved, and at the same time, periodicity of nano-order is disturbed. It is thereby possible to strongly develop light scattering properties with respect to emitted light from the light emitting device, and to improve light extraction efficiency. Further, the concavo-convex interval of nano-order varies gently in a long period, and by this means, it is possible to relax the color shift in improving light extraction efficiency due to surface plasmon resonance.

Further, also for light of the waveguide mode inside the device, by providing concavities and convexities of nano-order on the substrate surface, since both the pitch Py and the pitch Px or either one is an inconstant interval, periodicity of nano-order is disturbed in the concavities and convexities provided on the substrate surface, and it is thereby possible to strongly develop light scattering properties with respect to emitted light from the light emitting layer. By the light scattering properties, the waveguide mode is disturbed, and it is possible to enhance light extraction efficiency. Further, uniformity of the nano-order is disturbed in the concavities and convexities, the color shift is thereby reduced, it is possible to obtain light-emitting characteristics nearer natural light, and it is possible to suppress glare.

Furthermore, since both the pitch Py and pitch Px or either one is an inconstant interval, periodicity of nano-order is disturbed in the concavities and convexities provided on the surface of the substrate for optics, and it is thereby possible to strongly develop the light scattering properties with respect to emitted light from the light emitting device. By the light scattering properties, the waveguide mode is resolved, and at the same time, it is possible to suppress the color shift and glare.

Herein, in the case where both the pitch Py and the pitch Px are inconstant intervals, it is possible to enhance the light scattering effect and the color shift reduction effect by disturbance of periodicity. In other words, the waveguide mode is effectively disturbed, and it is possible to improve light extraction efficiency while obtaining light-emitting characteristics nearer natural light, being effective in suppression of glare. Also in surface plasmon resonance, the effect of improving luminous efficiency is reduced, but it is possible to more enhance the light scattering effect due to disturbance of periodicity.

Meanwhile, in the case where one of the pitch Py and the pitch Px is an inconstant interval and the other one is a constant interval, as compared with the case where both the pitch Py and the pitch Px are inconstant intervals, disturbance of periodicity is reduced, the scattering effect is reduced, and light-emitting characteristics near natural light thereby decrease, but light extraction efficiency is improved by the diffraction effect. Also in surface plasmon resonance, as compared with the case where both the pitch Py and Px are inconstant intervals, the concave-convex interval of nano-order is more uniformed. By this means, decrease the color shift reduction effect and the light scattering effect due to disturbance of periodicity, but it is possible to enhance the effect of improving light extraction efficiency due to surface plasmon resonance.

With respect to whether to make both the pitch Py and the pitch Px inconstant intervals or one of the pitch Py and the pitch Px an inconstant interval, it is possible to make an optimal structure by selecting various manners corresponding to light-emitting characteristics, use and the like of the light emitting device to which is applied the substrate for optics of the invention. For example, in the case of general illumination uses with the color shift relatively hard to be the problem, in order to more enhance the effect of improving light extraction efficiency by diffraction, the structure may be adopted to make one of the pitch Py and the pitch Px an inconstant interval. Conversely, in the case of display uses with color characteristics and angle dependency tending to be problems, the structure may be adopted to make both the pitch Py and the pitch Px inconstant intervals.

Further, for example, in the case of light emitting devices with the color shift due to surface plasmon resonance relatively hard to occur, in order to enhance the effect of improving light extraction efficiency due to surface plasmon resonance, the structure may be adopted to make one of the pitch Py and the pitch Px an inconstant interval. Furthermore, in the case of light emitting devices or manufacturing conditions with the color shift due to surface plasmon resonance being large, in order to enhance the color shift reduction effect, the structure may be adopted to make both the pitch Py and the pitch Px inconstant intervals.

The substrate for optics according to this Embodiment will be described below. The substrate for optics of the present invention is a substrate for optics applied to an organic EL light emitting device comprised of at least an anode, a cathode and a light emitting layer in which the light emitting layer has one or more organic layers. In addition, in the invention, the pitch means an interval, does not necessarily mean a constant interval, and is assumed to include both a constant interval and an inconstant interval.

A configuration of the substrate for optics according to this Embodiment will be described first with reference to FIG. 1. FIG. 1 is a schematic perspective diagram showing an example of a substrate for optics 1 according to this Embodiment. As shown in FIG. 1, the substrate for optics 1 substantially has the shape of a plate, and is provided with a substrate 11, and a fine-structure layer 12 provided on one main surface of the substrate 11. The fine-structure layer 12 includes a plurality of convex portions 13 (convex-portion lines 13-1~13-N) protruding upward from the main surface of the substrate 11. The convex portions 13 extend in the direction of from the main surface of the substrate 11 to outside the surface, and are arranged with respective particular intervals.

Further, the fine-structure layer 12 may be formed on the main surface of the substrate 11 separately, or the substrate 11 may be directly processed to form the layer. Furthermore, the substrate for optics 1 may be in the shape of a film, as well as the shape of a plate.

Figure 2:
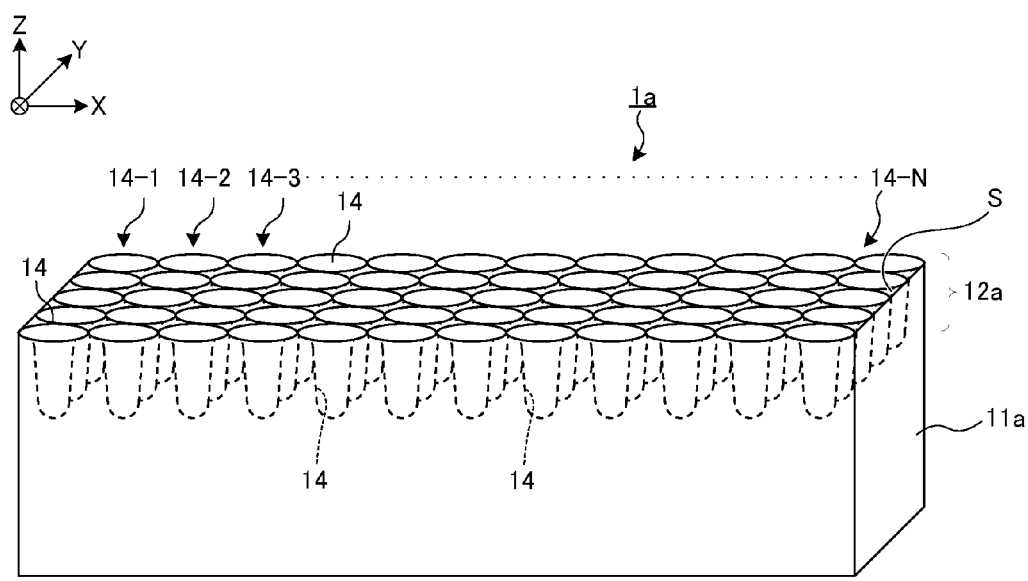
FIG. 2 is a perspective schematic diagram showing another example of the substrate for optics according to Embodiment 1.

In addition, FIG. 1 shows the example in which the fine structure of the fine-structure layer 12 is comprised of a plurality of convex portions 13, but the invention is not limited thereto, and the fine structure of the fine-structure layer may be comprised of a plurality of concave portions (see FIG. 2). FIG. 2 is a perspective schematic diagram showing another example of the substrate for optics 1 according to this Embodiment. As shown in FIG. 2, a substrate for optics 1a substantially has the shape of a plate, and is provided with a substrate 11a, and a fine-structure layer 12a provided on one main surface of the substrate 11a. The fine-structure layer 12a includes a plurality of concave portions 14 (concave-portion lines 14-1~14-N) caved in toward the main surface side of the substrate 11a from the surface S of the fine-structure layer 12a. The concave portions 14 extend in the direction of from the main surface of the substrate 11a to outside the surface, and are arranged with respective particular intervals.

Further, the fine-structure layer 12a may be formed on the main surface of the substrate 11a separately, or the substrate 11a may be directly processed to form the layer. Furthermore, the substrate for optics 1a may be in the shape of a film, as well as the shape of a plate.

Hereinafter, the convex portions 13 or concave portions 14 respectively forming the fine structure of the fine-structure layer 12, 12a in the substrate for optics 1, 1a are referred to as "dots".

(Fine-Structure Layer Dot Arrangement)

Figure 3:
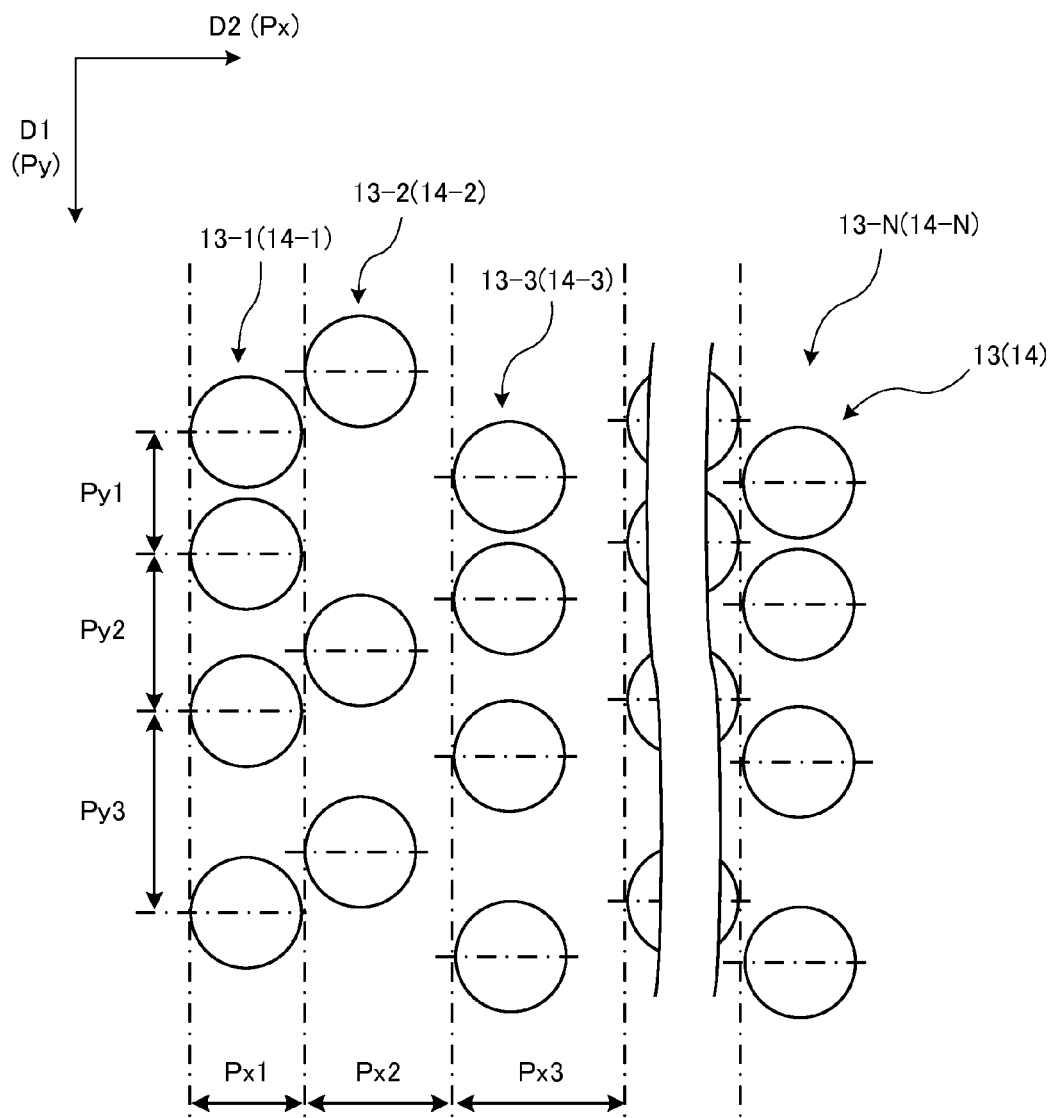
FIG. 3 is a plan schematic diagram of the substrate for optics according to Embodiment 1.

FIG. 3 is a plan schematic diagram of the substrate for optics 1. As shown in FIG. 3, the dots (convex portions 13 or concave portions 14) form a plurality of dot lines (convex-portion lines 13-1~13-N or concave-portion lines 14-1~14-N) in which a plurality of dots is arranged at inconstant intervals Py (pitches Py1, Py2, Py3, . . . ) in a D1 direction inside the main surface of the substrate 11. Further, each dot line is arranged at an inconstant interval Px (pitches Px1, Px2, Px3, . . . ) in a second direction (D2 direction) orthogonal to the first direction (D1 direction) inside the main surface of the substrate 11.

Moreover, in the substrate for optics of this Embodiment, inconstant intervals of nano-order preferably have a variable width δ. More specifically, in FIG. 3, pitches Py1, Py2, Py3 are in the range of Pyav±δ.

Figure 4:
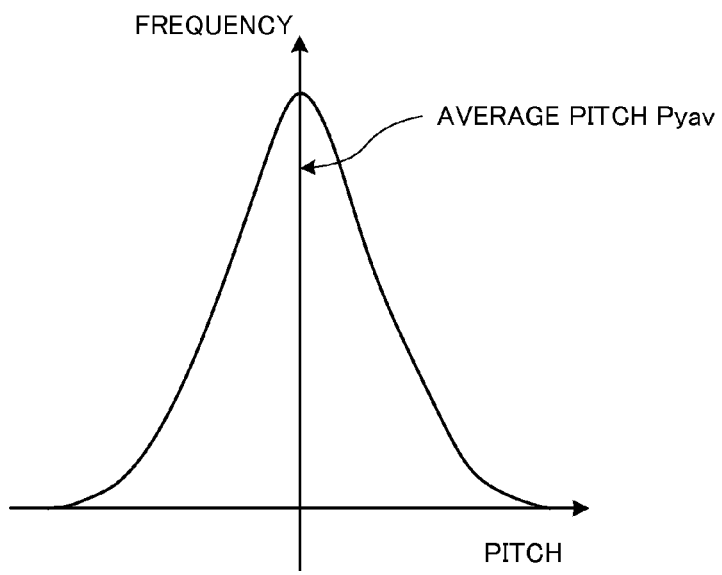
FIG. 4 is a conceptual diagram of an average pitch in the substrate for optics according to Embodiment 1.

FIG. 4 illustrates a conceptual diagram of the average pitch. Herein, the variable width δ is a value three times the standard deviation σ of pitches Py among dots 13-1 in the D1 direction, and is defined as a value calculated by measuring the pitch Py in 100 points or more in the D1 direction. Further, the variable width δ is preferably smaller than the average pitch Pyav. Particularly, when the variable width δ is in the range of 1% to 50% of the average pitch Pyav, since the sizes of pitches Py among a plurality of dots forming the dot line 13-1 are in a moderate range, it is possible to achieve the effect of improving luminous efficiency and color shift reduction effect by the light scattering properties. Further, when the variable width δ is in the range of 5% to 30% of the average pitch Pyav, it is possible to further obtain both the effect of improving light extraction efficiency by diffraction and the effect of improving light extraction efficiency by surface plasmon resonance, in addition to the effect of improving light extraction efficiency and color shift reduction effect by the light scattering properties, and such a range is more preferable.

The above-mentioned description is the description on the pitch Py in the D1 direction, and with respect to Px in the D2 direction, Px is defined by reading Py with Px.

Figure 5:
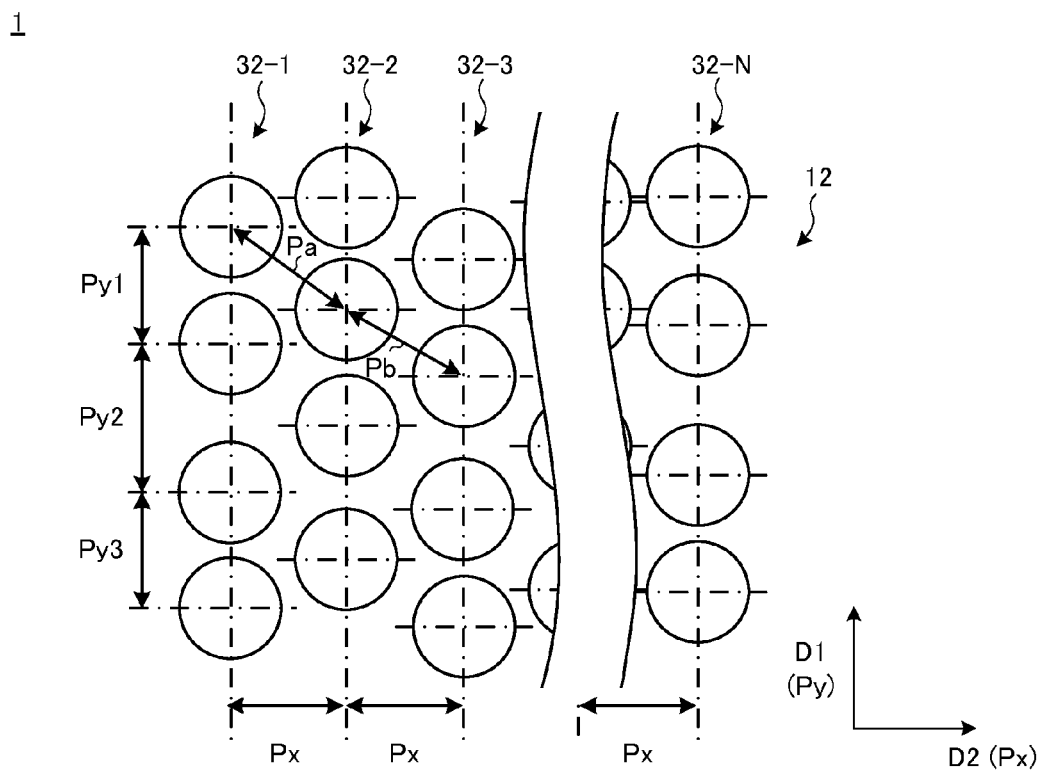
FIG. 5 is another plan schematic diagram of the substrate for optics according to Embodiment 1.

FIG. 5 is another plan schematic diagram of the substrate for optics 1 according to Embodiment 1. As shown in FIG. 5, in the concavo-convex structure 12, a plurality of dot lines 32-1 to 32-N is provided parallel in which a plurality of dots 31 is arranged in the D1 direction belonging to the inside of the main surface of the substrate 11 body. A plurality of dots 31 belonging to each of the dot lines 32-1 to 32-N is arranged at inconstant intervals with mutually different pitches (Py1, Py2, Py3, . . . ). Further, the dot lines 32-1 to 32-N are provided parallel with a pitch Px of the constant interval in the D2 direction orthogonal to the D1 direction inside the main surface of the substrate 11 body.

In other words, in the substrate for optics 1 according to Embodiment 1, a plurality of dots 31 belonging to each of the dot lines 32-1 to 32-N is arranged at inconstant intervals Py1, Py2, Py3 in the D1 direction, while the dot lines 32-1 to 32-N are provided at constant intervals Px in the D2 direction. By this configuration, in the case of viewing the substrate 11 body from the D2 direction, periodicity of the repetition pattern is reduced among the plurality of dots arranged inside the main surface (main surface S in FIG. 1). For example, pitches Pa and Pb in a slanting direction inside the main surface S of the substrate 11 body are different values. By this means, it is possible to enhance the effect of improving light extraction efficiency due to the diffraction effect and surface plasmon resonance. Further, the light scattering properties are improved by the concavo-convex structure 12, and therefore, the effect of improving light extraction efficiency is expected also due to resolution of the waveguide mode by scattering, and also the color shift reduction effect can also be expected.

Figure 6:
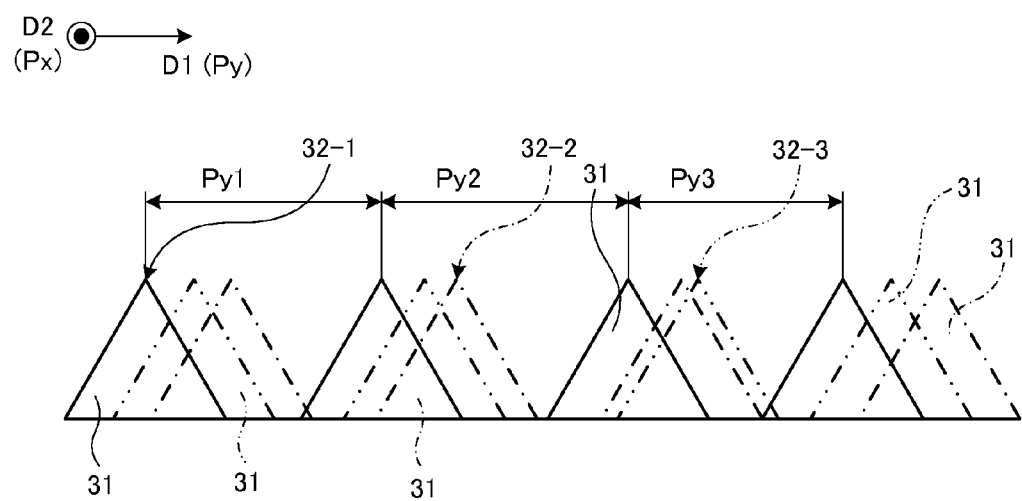
FIG. 6 is a schematic diagram illustrating an arrangement of a plurality of dots of the substrate for optics according to Embodiment 1, viewed from the D2 direction.

FIG. 6 is a schematic diagram illustrating an arrangement of a plurality of dots in viewing, from the D2 direction, the substrate for optics 1 of Embodiment 1 in which the plurality of dots has a plurality of dot lines arranged with the pitch Px of the constant interval in the D2 direction, while being arranged with the pitch Py having the variable width δ in the D1 direction. In FIG. 6, a plurality of dots 31 is divided into dots belonging to the dot line 32-1 (shown by solid lines in the figure), dots belonging to the dot line 32-2 (shown by one-dot dashed lines in the figure) and dots belonging to the dot line 32-3 (shown by two-dot dashed lines in the figure). A plurality of dots 31 belonging to the same dot line is arranged at inconstant intervals Py1, Py2, Py3 in the D1 direction. By this means, a plurality of dots 31 mutually deviates and is arranged irregularly as shown in FIG. 6, the arrangement is disturbed and it is thereby possible to produce the light scattering effect.

Figure 7:
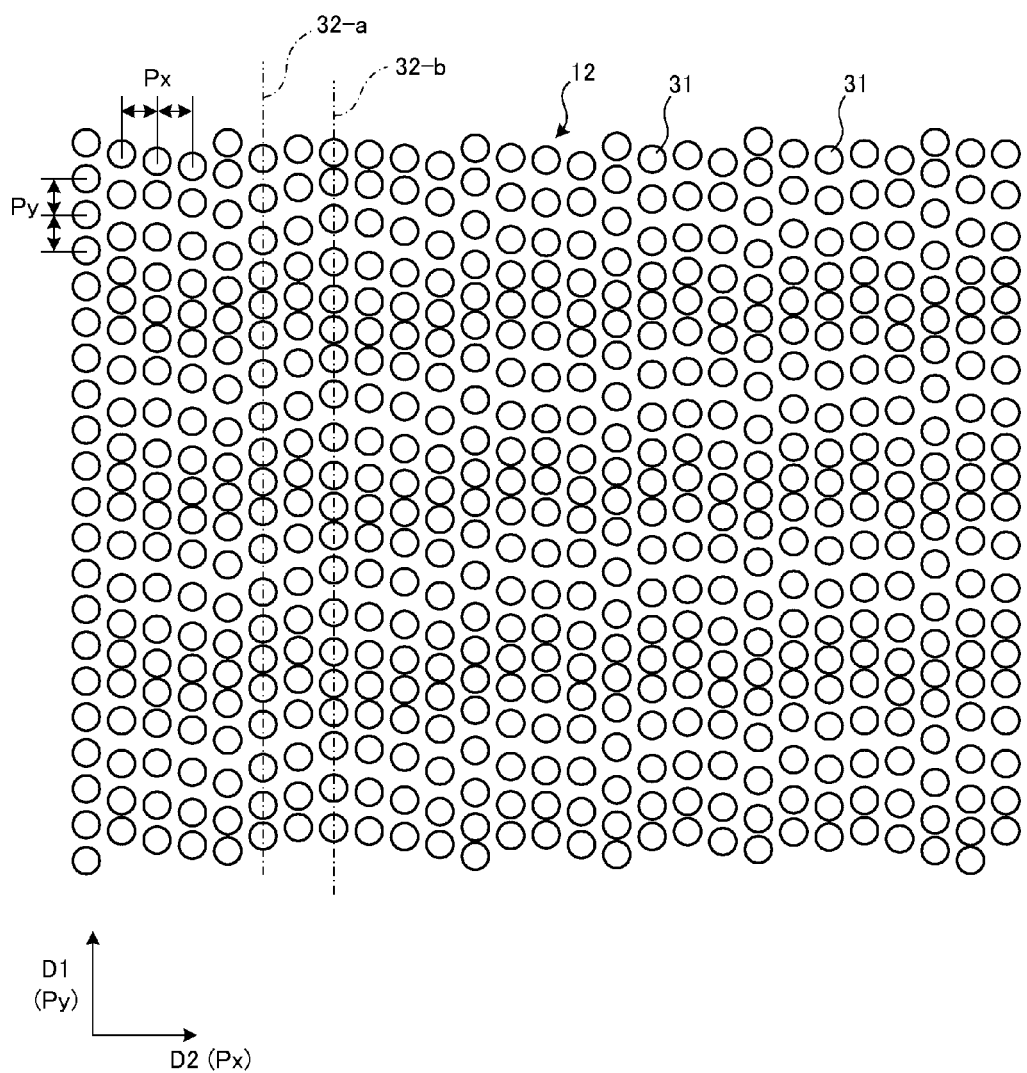
FIG. 7 is a schematic diagram showing an example of an arrangement of a plurality of dots in the substrate for optics according to Embodiment 1.

FIG. 7 is a schematic diagram showing an example of the arrangement (dot pattern) of a plurality of dots 31 constituting the concavo-convex structure 12 in the substrate for optics 1 according to Embodiment 1. FIG. 7 shows the example in which the pitch Py and pitch Px of the dots 31 are substantially equal and the variable width δ is 20% of the pitch Pyav. As shown in FIG. 7, also when the dot lines 32-a and 32-b are aligned at constant intervals, it is understood that the pitch Py between dots 31 in the D1 direction does not have periodicity. Thus, by the existence of a plurality of dots 31, it is possible to enhance the effect of improving light extraction efficiency from the organic EL provided on the substrate for optics 1, and further, by disturbance of the arrangement of a plurality of dots 31, it is possible to produce the light scattering effect and color shift reduction effect.

Figure 8:
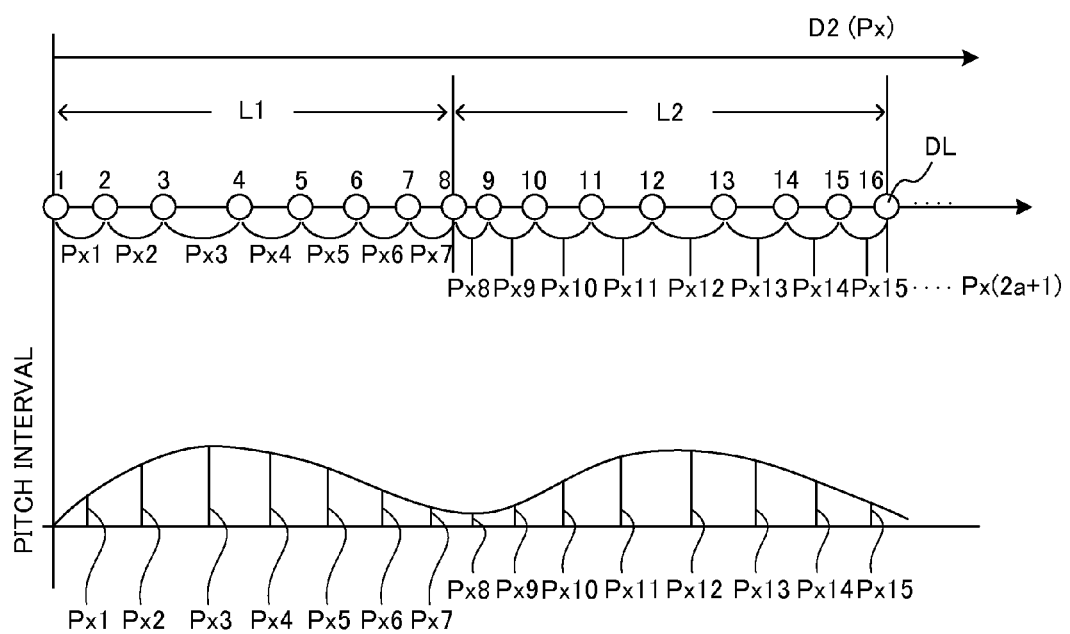
FIG. 8 is a schematic diagram showing an arrangement example of dots in the D2 direction in the substrate for optics according to Embodiment 1.

Herein, described is an arrangement example of dot lines in the D2 direction arranged at inconstant intervals with mutually different pitches Px. FIG. 8 is a schematic diagram showing an arrangement example of dot lines in the D2 direction. As shown in FIG. 8, in the dot lines (DL in FIG. 8) in the D2 direction, eight lines are arranged at particular intervals (pitches Px), and eight dot lines are repeatedly arranged. The unit comprised of a plurality (z) of dot lines is referred to as a long-period unit Lxz (in addition, z is a positive integer). In addition, in dots in the D1 direction that are arranged at inconstant intervals with mutually different pitches Py, by using a long-period unit Lyz, it is possible to arrange the dots in the same manner as in the following description.

The pitch Px with the inconstant interval is equal to a distance between centers of respective dots, and the pitches Px with the inconstant intervals are equal to distances among a plurality of dot lines in which a plurality of dots is arranged with the pitch Py. Further, the pitch Py and pitch Px are larger than a diameter of each dot.

It is preferable that when the pitch Py is an inconstant interval, pitches Pyn among at least four or more and m or less of adjacent dots ($3 \leq n \leq 2a$ or $3 \leq n \leq 2a+1$, in addition, m and a are positive integers and n=m−1) meet the relationship of following equation (1), while dot groups formed with the pitches Py1 to Pyn are of the configuration where the long-period unit Lyz is repeatedly arranged in the first direction, and that when the pitch Px is an inconstant interval, pitches Pxn among at least four or more and m or less of adjacent dots ($3 \leq n \leq 2a$ or $3 \leq n \leq 2a+1$, in addition, m and a are positive integers and n=m−1) meet the relationship of following equation (2), while dot line groups formed with the pitches Px1 to Pxn are of the configuration where the long-period unit Lxz is repeatedly arranged in the second direction.

$$Py1 < Py2 < Py3 < \ldots < Pya > \ldots > Pyn \tag{1}$$

$$Px1 < Px2 < Px3 < \ldots < Pxa > \ldots > Pxn \tag{2}$$

FIG. 8 shows the case where the long-period unit Lxz is comprised of eight dot lines i.e. the case of m=8. In this case, since n=7 and a=3, in the long period L1, the relationship of the following equation holds for the pitches Pxn among dot lines.

$$Px1 < Px2 < Px3 > Px4 > Px5 > Px6 > Px7$$

Further, the pitches Px in the long-period unit Lxz are set so that the maximum phase deviation δ expressed by a difference between the maximum value (Px(max)) and the minimum value (Px(min)) of the pitch Px meets (Px(min))×0.01<δ<(Px(min))×0.66, preferably (Px(min))×0.02<δ<(Px(min))×0.5, and more preferably (Px(min))×0.1<δ<(Px(min))×0.4.

For example, in the long-period unit L1 as shown in FIG. 8, the Pxn between dot lines is expressed as described below.

$Px1 = Px(\min)$ $Px2 = Px(\min) + \delta a$ $Px3 = Px(\min) + \delta b = Px(\max)$ $Px4 = Px(\min) + \delta c$ $Px5 = Px(\min) + \delta d$ $Px6 = Px(\min) + \delta e$ $Px7 = Px(\min) + \delta f$ In addition, values of δa to δf meet $Px(\min) \times 0.01 < (\delta a \sim \delta f) < Px(\min) \times 0.5$, and are the same as in an adjacent long-period unit L2.

Further, the maximum value of z in the long-period unit Lxz or long-period unit Lyz is set so as to meet $4 \leq z \leq 1{,}000$, preferably $4 \leq z \leq 100$, and more preferably $4 \leq z \leq 20$.

In addition, the long-period units Lxz and Lyz in the D1 direction and D2 direction do not need to be the same as each other.

In the substrate for optics 1 of this Embodiment, it is preferable that at least one or more dot groups having the above-mentioned long-period unit Lyz are arranged in the D1 direction, and that at least one or more dot groups having the above-mentioned long-period unit Lxz are arranged in the D2 direction.

The arrangement arranged at inconstant intervals with pitches Py is defined by reading the dot lines with dots in the arrangement example of dot lines in the second direction arranged at inconstant intervals with mutually different pitches Px as described above. In other words, it is preferable that when the pitch Py is an inconstant interval, pitches Pyn among at least four or more and m or less of adjacent dots ($3 \leq n \leq 2a$ or $3 \leq n \leq 2a+1$, in addition, m and a are positive integers and n=m−1) meet the relationship of above mentioned equation (1), while at least one or more dot groups formed with the pitches Py1 to Pyn are arranged in the first direction, and that when the pitch Px is an inconstant interval, pitches Pxn among at least four or more and m or less of adjacent dots ($3 \leq n \leq 2a$ or $3 \leq n \leq 2a+1$, in addition, m and a are positive integers and n=m−1) meet the relationship of above mentioned equation (2), while at least one or more dot line groups formed with the pitches Px1 to Pxn are arranged in the second direction.

Figure 9:
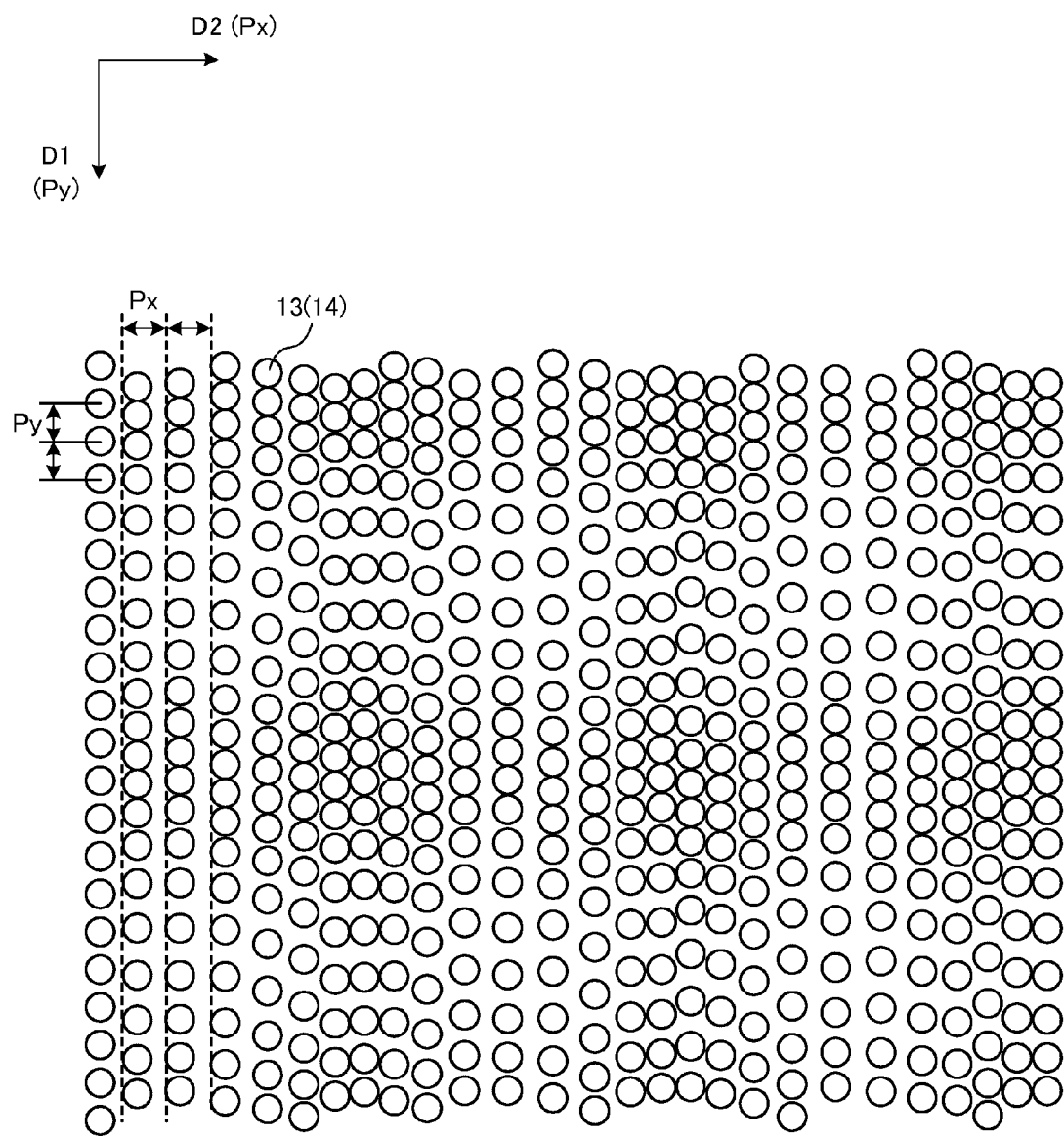
FIG. 9 is a schematic diagram showing another example of the arrangement of a plurality of dots in the substrate for optics according to Embodiment 1.
Figure 10:
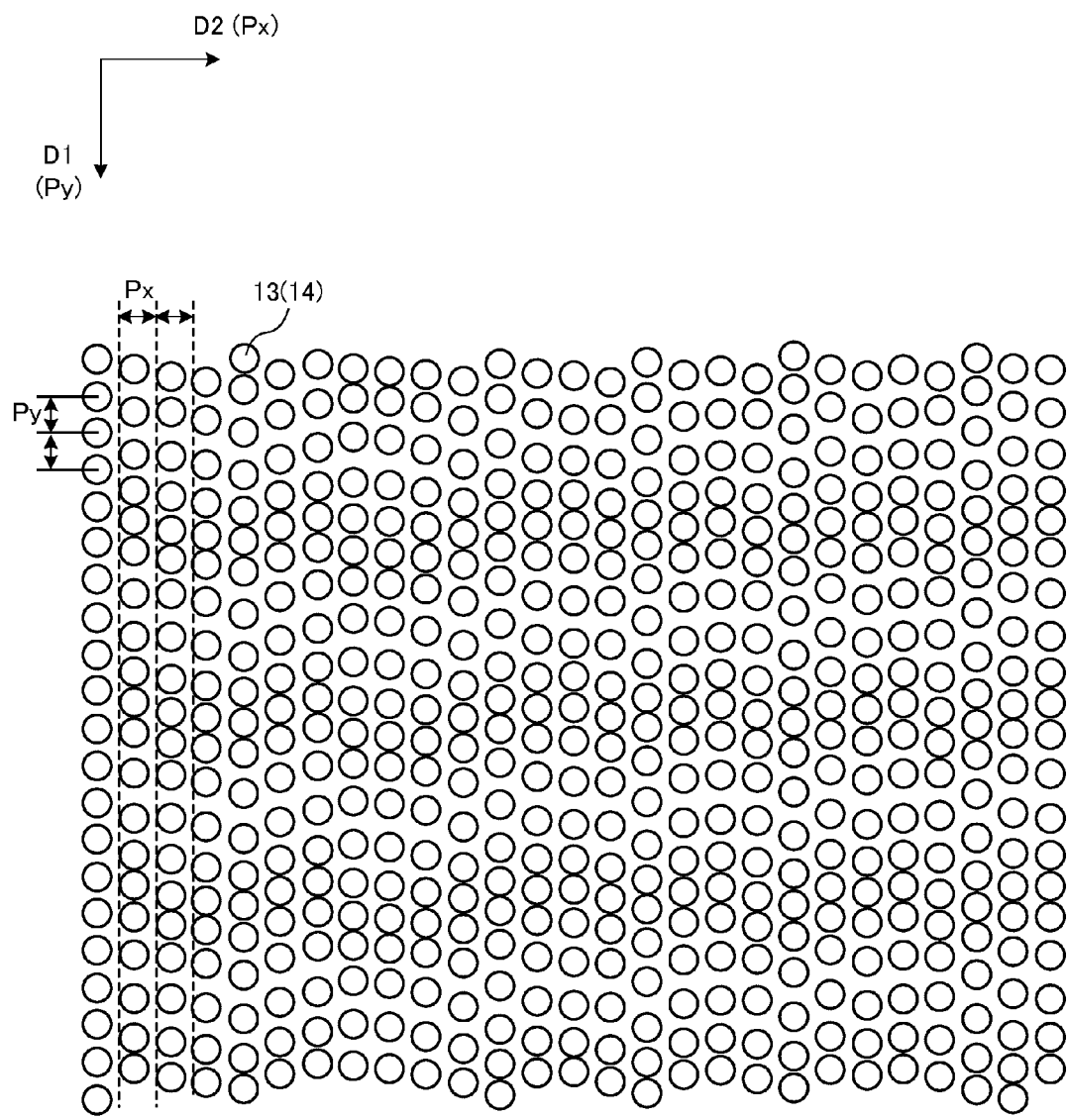
FIG. 10 is a schematic diagram showing still another example of the arrangement of a plurality of dots in the substrate for optics according to Embodiment 1.

In the substrate for optics 1 according to Embodiment 1, dots forming the fine structure of the fine-structure layer 12 (12a) can be arranged with pitches Px and Py of inconstant intervals as described above in both the D1 direction and the D2 direction (see FIG. 9), and can also be arranged with pitches of inconstant intervals as described above in only one of the D1 direction and the D2 direction, while being arranged with pitches of constant intervals in the other direction (see FIG. 10). In addition, in FIG. 10, dots in the D1 direction are arranged at inconstant intervals, and dot lines in the D2 direction are arranged at constant intervals.

Further, it is possible to adopt an arrangement with adjacent first dot line and second dot line or first dot line and third dot line being identical (see FIGS. 11, 12, 13 and 14).

In the case where one of the pitch Py and the pitch Px is a constant interval and the other one is an inconstant interval, as compared with the case where both the pitch Py and the pitch Px are inconstant intervals, disturbance of periodicity is reduced, the scattering effect is reduced, and light-emitting characteristics near natural light thereby decrease, but light extraction efficiency is improved by the diffraction effect. Also in surface plasmon resonance, as compared with the case where both the pitch Py and Px are inconstant intervals, the concave-convex interval of nano-order is more uniformed. By this means, decrease the color shift reduction effect and the light scattering effect due to disturbance of periodicity, but it is possible to enhance the effect of improving light extraction efficiency due to surface plasmon resonance.

On the other hand, in the case where both the pitch Py and the pitch Px are inconstant intervals, it is possible to enhance the light scattering effect and the color shift reduction effect by disturbance of periodicity. In other words, the waveguide mode is effectively disturbed, and it is possible to improve light extraction efficiency while obtaining light-emitting characteristics nearer natural light, being effective in suppression of glare. Also in surface plasmon resonance, the effect of improving light extraction efficiency is reduced, but it is possible to more enhance the light scattering effect due to disturbance of periodicity.

With respect to whether to make both the pitch Py and the pitch Px inconstant intervals or one of the pitch Py and the pitch Px an inconstant interval, it is possible to make an optimal structure by selecting various manners corresponding to light-emitting characteristics, use and the like of the light emitting device to which is applied the substrate for optics of the invention. For example, in the case of general illumination uses with the color shift relatively hard to be the problem, in order to more enhance the effect of improving light extraction efficiency by diffraction, the structure may be adopted to make one of the pitch Py and the pitch Px an inconstant interval. Conversely, in the case of display uses with color characteristics and angle dependency tending to be problems, the structure may be adopted to make both the pitch Py and the pitch Px inconstant intervals.

Further, for example, in the case of light emitting devices with the color shift due to surface plasmon resonance relatively hard to occur, in order to enhance the effect of improving light extraction efficiency due to surface plasmon resonance, the structure may be adopted to make one of the pitch Py and the pitch Px an inconstant interval. Furthermore, in the case of light emitting devices or manufacturing conditions with the color shift due to surface plasmon resonance being large, in order to enhance the color shift reduction effect, the structure may be adopted to make both the pitch Py and the pitch Px inconstant intervals.

Moreover, in the case of an arrangement in which the distance between dots in the D1 direction or the distance between dot lines in the D2 direction is a constant interval, the ratio of the pitches of inconstant intervals to the pitch of the constant interval is preferably in a particular range.

Herein, described is an example in which dots in the D1 direction are arranged at constant intervals Pyc and dot lines in the D2 direction are arranged at inconstant intervals Px. In this case, it is preferable that the ratio of the pitches Px of the inconstant intervals to the pitch Pyc of the constant interval is in the range of 85% to 100%. When the ratio of the pitches Px of the inconstant intervals to the pitch Pyc of the constant interval is 85% or more, overlapping of adjacent dots is small, and such ratios are preferable. Further, when the ratio of the pitches Px of the inconstant intervals to the pitch Pyc of the constant interval is 100% or less, the filling rate of the convex portions 13 forming the dots improves, and such ratios are preferable. In addition, it is more preferable that the ratio of the pitches Px of the inconstant intervals to the pitch Pyc of the constant interval is in the range of 90% to 95%.

Further, when one long-period unit Lxz or Lyz is comprised of five or more dots (the number of pitches Px or Py belonging thereto is four or more), long-period variations in the refractive index of light generated inside the organic EL light emitting device go away from nano-order, light scattering tends to occur, and therefore, such a case is preferable. Meanwhile, in order to obtain the sufficient effect of improving light extraction efficiency, it is preferable that the long-period unit Lxz or Lyz is comprised of 1,001 or less dots (pitches Px or Py belonging thereto is 1,000 or less.)

In the substrate for optics 1 (1a) according to Embodiment 1, by meeting the relationships of the fine structure of the fine-structure layer 12 (12a) as described above, the light scattering effect is sufficient, while the interval between dots (convex portions 13 or concave portions 14) is nano-order, and therefore, the effect of improving light extraction efficiency develops due to surface plasmon resonance. As a result, light extraction efficiency is improved due to surface plasmon resonance and the diffraction effect by concavities and convexities of nano-order, periodicity of nano-order is concurrently disturbed, and it is possible to strongly develop the light scattering properties with respect to emitted light from the organic EL light emitting device. Further, since the concavo-convex interval of nano-order varies more gently due to long-period variations, the color shift is reduced in improving light extraction efficiency due to surface plasmon resonance and the diffraction effect, it is possible to obtain light-emitting characteristics nearer natural light, and it is possible to suppress glare.

Figure 15:
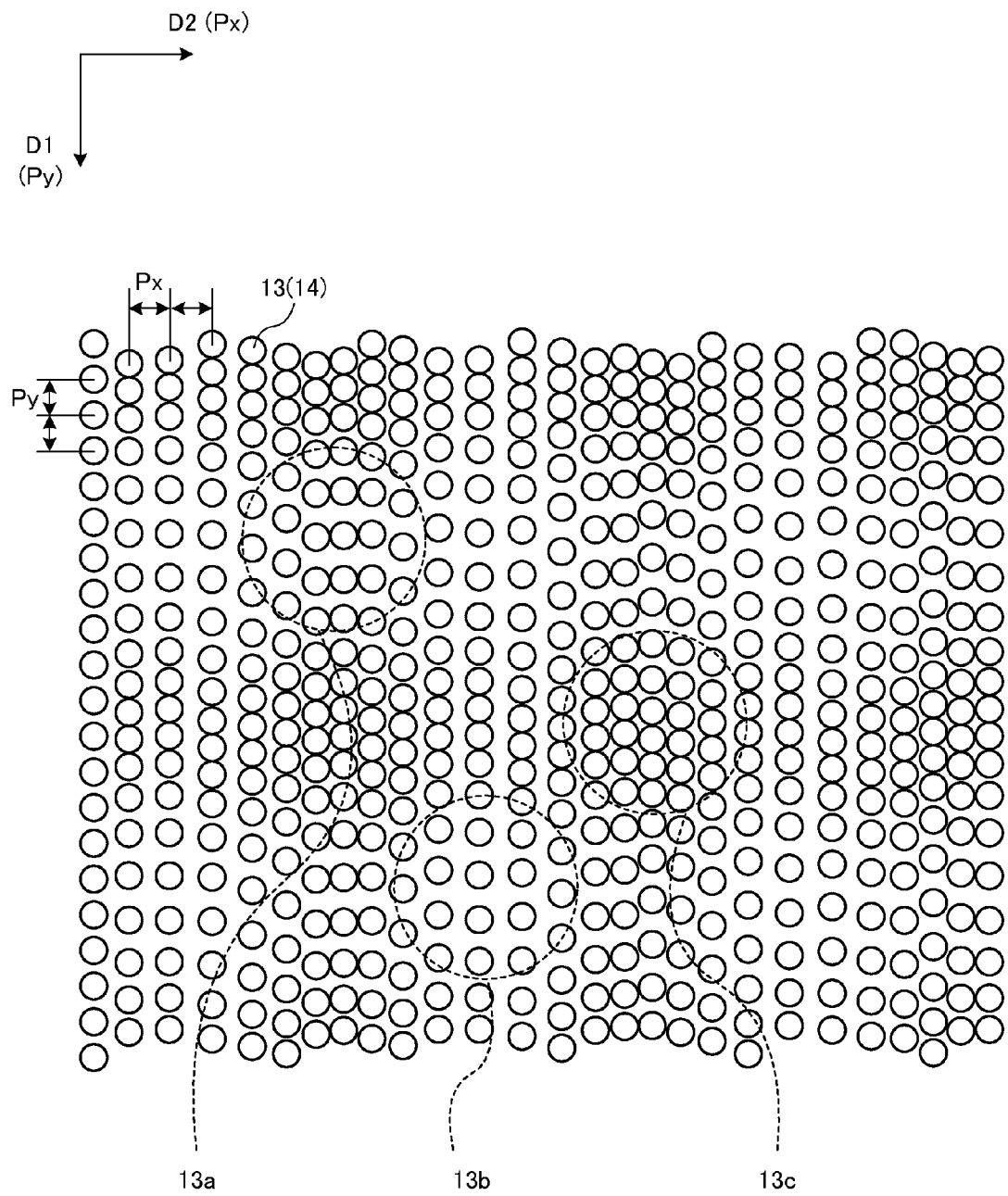
FIG. 15 is a schematic diagram showing still another example of the arrangement of a plurality of dots in the substrate for optics according to Embodiment 1.

Further, as shown in FIG. 15, distances between dots (convex portions 13 or concave portions 14) are divided into regions corresponding to the size of the pitch (FIGS. 13a to 13c). Therefore, the excitation wavelength of surface plasmons excited in each region varies, the boundary is smooth, and therefore, it is possible to adjust the wavelength at which luminous efficiency is improved in a wide range. It is possible to adjust the distance between dots (convex portions 13 or concave portions 14) and a variation in the long period Lxz or Lyz arbitrarily, and therefore, it is possible to adjust the emission wavelength as appropriate corresponding to a use of the light emitting device. For example, for illumination uses, by selecting the emission wavelength, it is possible to select a warm color system, natural color system, cool color system or the like.

Subsequently, described is the dot shape (concavo-convex structure) constituting the fine structure of the fine-structure layer 12 (12a) of the substrate for optics 1 according to this Embodiment. The shapes of the convex portion 13 and the concave portion 14 are not limited particularly, as long as the shapes are in the scope that enables the effects of the present invention to be obtained, and it is possible to change as appropriate corresponding to uses. As the shapes of the convex portion 13 and the concave portion 14, for example, it is possible to use the shape of a pillar, the shape of a hole, the shape of a cone, the shape of a pyramid, the shape of an elliptic cone, line-and-space structure and the like. Moreover, a fine structure may further be provided on the side surface (inner surface) of these structures.

When the fine structure of the fine-structure layer 12 (12a) in the substrate for optics 1 is comprised of the line-and-space structure, the long-axis direction of the line is defined as the first direction. In a plurality of line lines arranged in the first direction, the shortest distance between center lines of adjacent lines corresponds to the pitch Px. In other words, in the above-mentioned description of the dot shape, the pitch Py of dot lines arranged with the pitch Py in the first direction asymptotically approaches zero, and a state in which adjacent dots are connected corresponds to the line in the line-and-space structure.

In addition, in the line shape comprised of a plurality of convex portions in the invention, the ratio of the length of the line to the convex-portion width (line length convex-portion width) is defined as 1 or more. In other words, the shape includes the scope of an elliptical shape with the long radius short radius more than 1 to the palisade body continued over the surface of the substrate for optics 1 without disconnection.

As the shape forming the lines, it is possible to select the shape in which the lines are continued over the entire surface of the substrate for optics 1 without disconnection or the shape in which the line length convex-portion width is disconnected in the range more than 1 as appropriate corresponding to an application purpose to use. In the case of the shape continued without disconnection, the limitation degree (anisotropy) is strong in the direction of light extracted by diffraction, the diffraction effect is also large, and such a case is suitable for a use with low requirements for the color shift. On the other hand, in the case of the shape with the line length convex-portion width disconnected in the range more than 1, as the line length approaches the pitch Px, it is possible to more develop the effect of light scattering, and it is possible to suppress the color shift. Therefore, the case of the disconnected structure is suitable for a use with high requirements for suppressing the color shift.

In addition, the line length convex-portion width is capable of being selected as appropriate corresponding to a use, is preferably 1.5 or more, more preferably 2.5 or more, and most preferably 5.0 or more.

When the pitch Px is an inconstant interval, it is possible to extract light of the waveguide mode by diffracted light due to the line structure, and also to exhibit the scattering effect, it is thereby possible to suppress glare, and therefore, such a pitch is preferable.

Further, as the pitch Px described in the dot shape, by providing the pitch Px with the long period Lxz, it is possible to more exert the effect.

In the dot shape (concavo-convex structure) constituting the fine structure of the fine-structure layer 12 (12a) of the substrate for optics 1 (1a) according to this Embodiment, it is preferable that the diameter of each of dots increases/decreases corresponding to the pitch Py and or the pitch Px. In addition, in the present invention, the diameter of each of dots increasing/decreasing corresponding to the pitch Py and/or the pitch Px refers to either of the facts that the diameter of each of the dots increases or decreases as the pitch Py or the pitch Px increases.

The example in which the diameter of the dot increases or decreases corresponding to the pitch will specifically be described below.

In the substrate for optics 1 (1a) according to this Embodiment, it is preferable that when the pitch Py is the inconstant interval, dot diameters Dyn of at least four or more and m or less of adjacent dots ($3 \leq n \leq 2a$ or $3 \leq n \leq 2a+1$, in addition, m and a are positive integers and $n=m-1$) forming the pitch meet the relationship of following equation (3) while at least one or more dot groups formed with the dot diameters Dy1 to Dyn are arranged in the first direction, and that when the pitch Px is the inconstant interval, dot diameters Dxn of at least four or more and m or less of adjacent dots ($3 \leq n \leq 2a$ or $3 \leq n \leq 2a+1$, in addition, m and a are positive integers and $n=m-1$) forming the pitch meet the relationship of following equation (4) while at least one or more dot groups formed with the dot diameters Dx1 to Dxn are arranged in the second direction.

$$Dy1<Dy2<Dy3<\ldots<Dya>\ldots>Dyn \quad (3)$$

$$Dx1<Dx2<Dx3<\ldots<Dxa>\ldots>Dxn \quad (4)$$

Further, in the substrate for optics according to this Embodiment, it is preferable that when the pitch Py is the inconstant interval, dot diameters Dyn of at least four or more and m or less of adjacent dots ($3 \leq n \leq 2a$ or $3 \leq n \leq 2a+1$, in addition, m and a are positive integers and n=m−1) forming the pitch meet the relationship of above-mentioned equation (3) while dot groups formed with the dot diameters Dy1 to Dyn are repeatedly arranged in the long-period unit Lyz in the first direction, and that when the pitch Px is the inconstant interval, dot diameters Dxn of at least four or more and m or less of adjacent dots ($3 \leq n \leq 2a$ or $3 \leq n \leq 2a+1$, in addition, m and a are positive integers and n=m−1) forming the pitch meet the relationship of above-mentioned equation (4) while dot groups formed with the dot diameters Dx1 to Dxn are repeatedly arranged in the long-period unit Lxz in the second direction.

Figure 16:
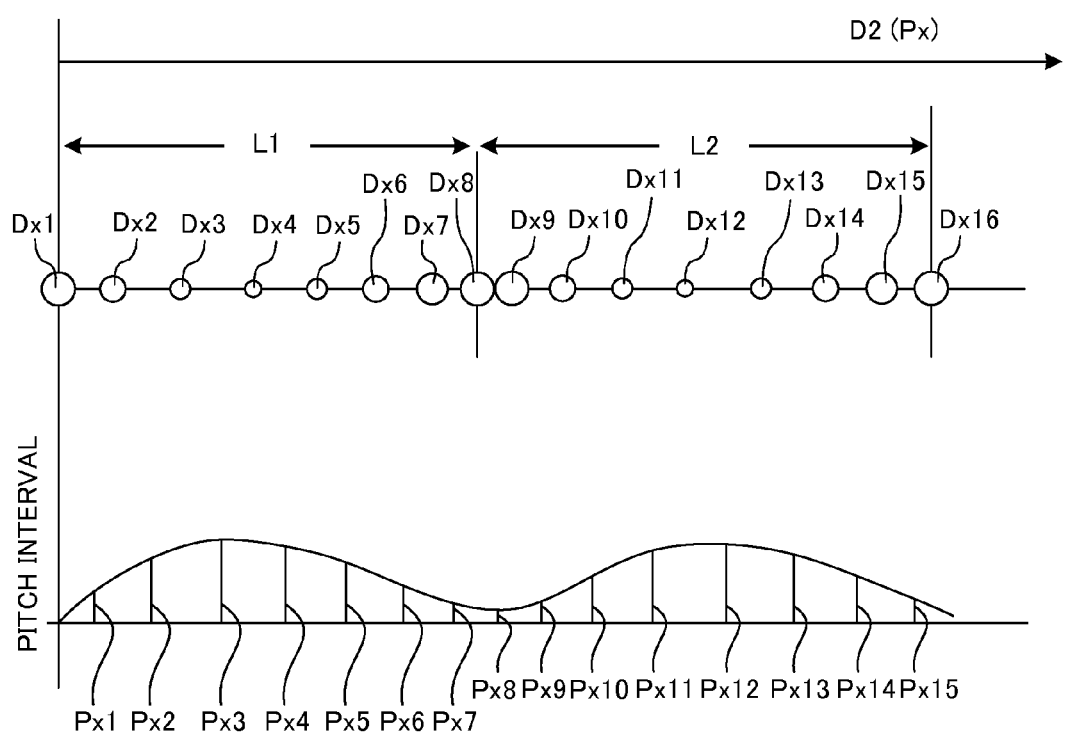
FIG. 16 is a schematic diagram showing an arrangement example of dots having different dot diameters in the D2 direction in the substrate for optics according to Embodiment 1.

FIG. 16 shows the case where the long-period unit Lxz is comprised of eight dot lines i.e. the case of m=8. In this case, since n=7 and a=3, in the long period L1, the relationship of above-mentioned equation (4) holds for the diameter Dxn of each of dots forming the dot line.

In FIG. 16, when the interval between adjacent dots widens, the dot diameter decreases, and when the dot interval narrows, the dot diameter increases. In the increase/decrease range in which the dot diameter increases and decreases, in the case of too large, adjacent dots contact each other, and such a case is not preferable. In the case of too small, light extraction efficiency decreases, and such a case is not preferable. In the case of within ±20% with respect to the average diameter of dots in the same long-period unit Lxz, light extraction efficiency increases, and such a case is preferable.

The above-mentioned description is given on the example where the dot diameter increases when the pitch forming the dots decreases, and similarly, when the pitch forming dots decreases, the dot diameter may decrease corresponding to the decrease. In either case, it is preferable that the long period of the decrease/increase of the dot diameter coincides with the long period of the increase/decrease of the pitch forming dots.

By the above-mentioned configuration, disturbance of periodicity due to dots with respect to emitted light is large, and light extraction efficiency increases in the organic EL light emitting device.

Further, in the dot shape (concavo-convex structure) constituting the fine structure of the fine-structure layer 12 (12a) of the substrate for optics 1 (1a) according to this Embodiment, it is preferable that the height of each of dots increases/decreases corresponding to the pitch Py and/or the pitch Px.

The example in which the height of the dot increases or decreases corresponding to the pitch will specifically be described below.

In the substrate for optics 1 (1a) according to this Embodiment, it is preferable that when the pitch Py is the inconstant interval, dot heights Hyn of at least four or more and m or less of adjacent dots ($3 \leq n \leq 2a$ or $3 \leq n \leq 2a+1$, in addition, m and a are positive integers and n=m−1) forming the pitch meet the relationship of following equation (5) while at least one or more dot groups formed with the dot heights Hy1 to Hyn are arranged in the first direction, and that when the pitch Px is the inconstant interval, dot heights Hxn of at least four or more and m or less of adjacent dots ($3 \leq n \leq 2a$ or $3 \leq n \leq 2a+1$, in addition, m and a are positive integers and n=m−1) forming the pitch meet the relationship of following equation (6) while at least one or more dot groups formed with the dot heights Hx1 to Hxn are arranged in the second direction.

$$Hy1<Hy2<Hy3<\ldots<Hya>\ldots>Hyn \quad (5)$$

$$Hx1<Hx2<Hx3<\ldots<Hxa>\ldots>Hxn \quad (6)$$

Further, in the substrate for optics 1 (1a) according to this Embodiment, it is preferable that when the pitch Py is the inconstant interval, dot heights Hyn of at least four or more and m or less of adjacent dots ($3 \leq n \leq 2a$ or $3 \leq n \leq 2a+1$, in addition, m and a are positive integers and n=m−1) forming the pitch meet the relationship of above-mentioned equation (5) while dot groups formed with the dot heights Hy1 to Hyn are repeatedly arranged in the long-period unit Lyz in the first direction, and that when the pitch Px is the inconstant interval, dot heights Hxn of at least four or more and m or less of adjacent dots ($3 \leq n \leq 2a$ or $3 \leq n \leq 2a+1$, in addition, m and a are positive integers and n=m−1) forming the pitch meet the relationship of above-mentioned equation (6) while dot groups formed with the dot heights Hx1 to Hxn are repeatedly arranged in the long-period unit Lxz in the second direction.

Figure 17:
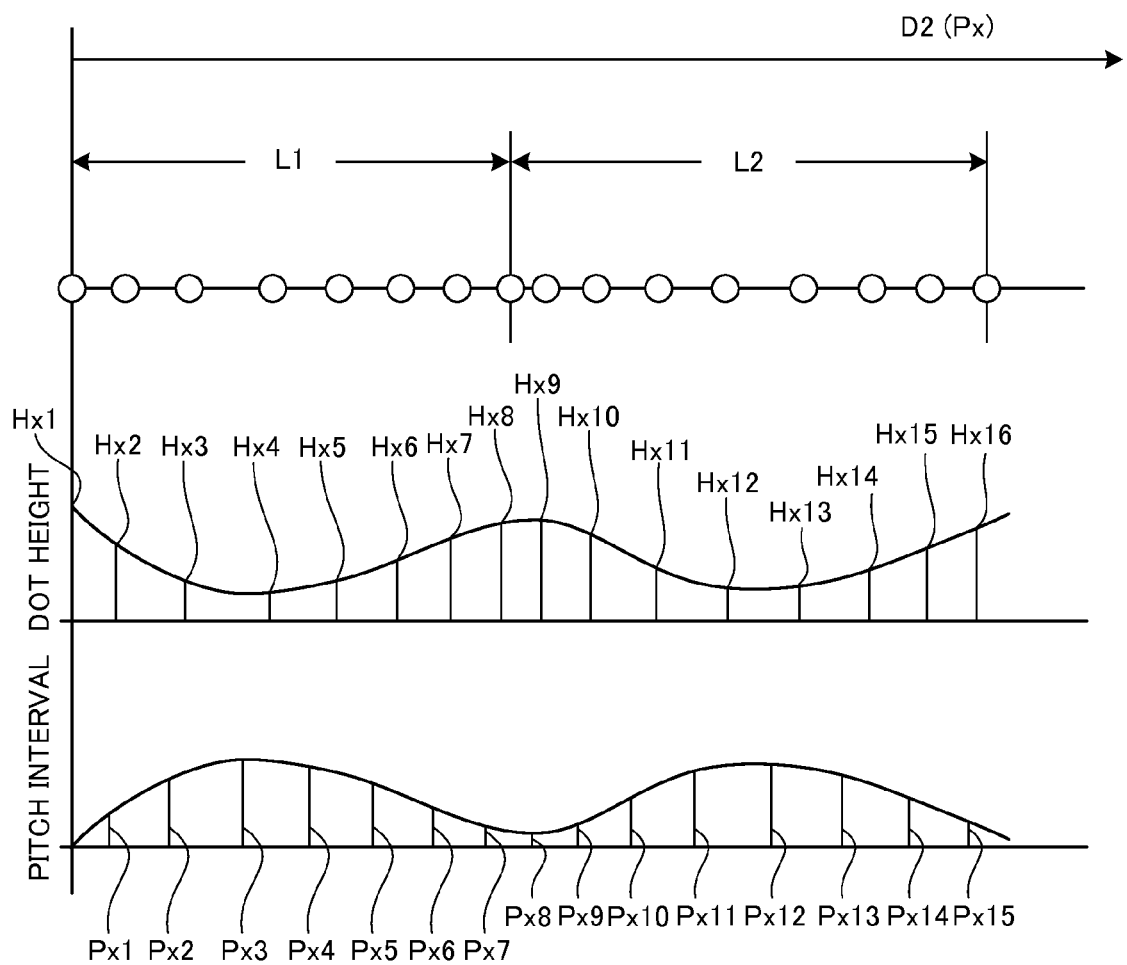
FIG. 17 is a schematic diagram showing an arrangement example of dots having different dot heights in the D2 direction in the substrate for optics according to Embodiment 1.

FIG. 17 shows the case where the long-period unit Lxz is comprised of eight dot lines i.e. the case of m=8. In this case, since n=7 and a=3, in the long period L1, the relationship of above-mentioned equation (6) holds for the height Hxn of each of dots forming the dot line.

In FIG. 17, when the interval between adjacent dots widens, the dot height decreases, and when the dot interval narrows, the dot height increases. In the increase/decrease range in which the dot height increases and decreases, in the case of too large, fluctuations in light extraction efficiency are large in the portion, and such a case is not preferable. In the case of too small, the effect of enhancing light extraction efficiency due to increase/decrease in the dot height decreases, and such a case is not preferable. In the case of within ±20% with respect to the average height of dots in the same long-period unit Lxz, light extraction efficiency increases without fluctuations, and such a case is preferable.

By the above-mentioned configuration, disturbance of periodicity due to dots with respect to emitted light is large, and light extraction efficiency increases in the organic EL light emitting device.

Further, the substrate for optics 1 (1a) according to this Embodiment is provided with the fine-structure layer 12 (12a) including a plurality of dots comprised of a plurality of convex portions 13 or concave portions 14 extending in the direction of from the main surface of the substrate 11 (11a) to outside the surface, and it is preferable that the fine-structure layer 12 (12a) forms dot lines in which a plurality of dots is arranged at constant intervals Py in the first direction inside the main surface of the substrate 11 (11a), the dot lines are provided parallel with the pitch Px of the constant interval in the second direction orthogonal to the first direction, and that a shift amount α1 in the first direction between adjacent first dot line and second dot line is different from a shift amount α2 in the first direction between the second dot line and a third dot line adjacent to the second dot line.

According to this configuration, first, the pitch Py and pitch Px are both of the constant interval, and have the periodical structure, while the shift amounts α1 and α2 in the first direction between dot lines are different from each other, periodicity is thereby disturbed in the arrangement of a plurality of dots forming the fine-structure layer 12 (12a), and it is thereby possible to produce the light scattering effect.

Further, according to this configuration, in the fine-structure layer, since a plurality of dot lines provided parallel with the constant interval pitch Px of nano-order is provided on the surface of the substrate, light extraction efficiency increases by the diffraction effect and surface plasmon resonance.

Figure 18:
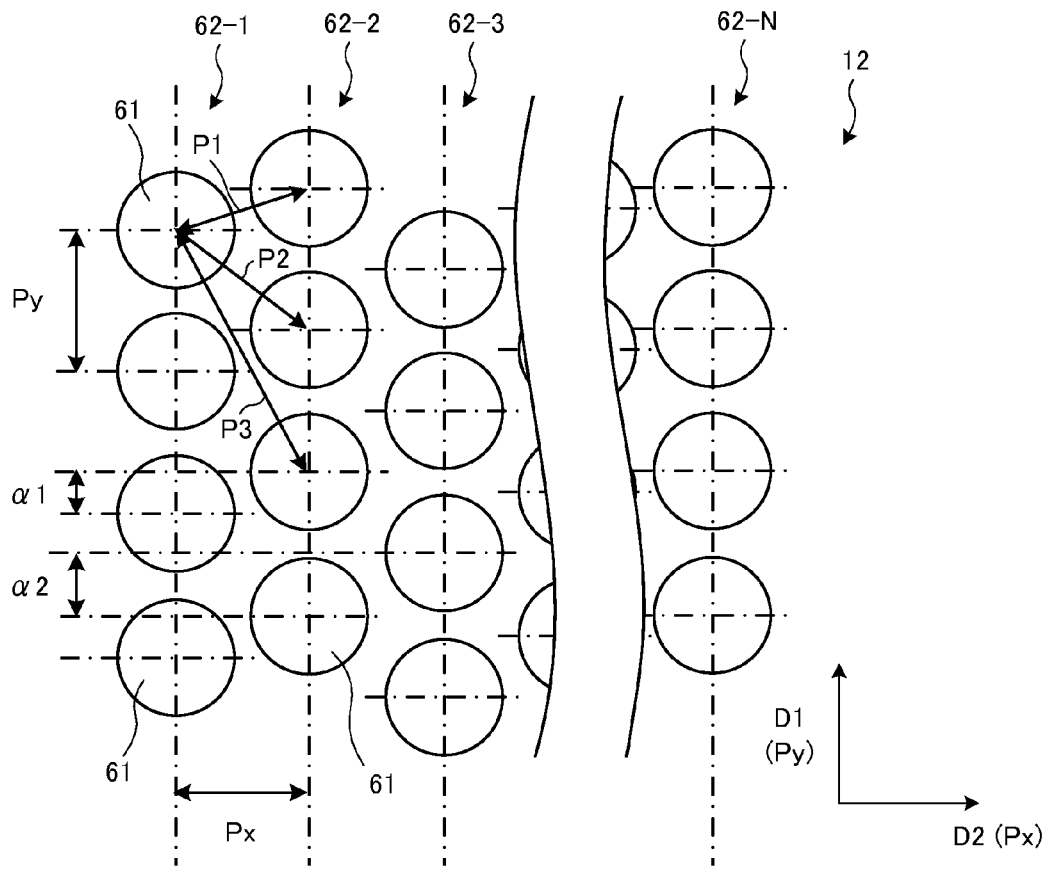
FIG. 18 is a plan schematic diagram of a substrate for optics in Embodiment 2.

FIG. 18 is a plan schematic diagram of a substrate for optics according to Embodiment 2 of the present invention. In a substrate for optics 60 according to Embodiment 2, a plurality of dots 61 is arranged at constant intervals with a pitch Py in the D1 direction inside the main surface of the substrate body and forms dot lines 62-1 to 62-N. The dot lines 62-1 to 62-N are provided parallel with a pitch Px of a constant interval in the D2 direction orthogonal to the D1 direction inside the main surface of the substrate body. Then, the lines are arranged so as to create a shift amount α (position difference) in the D1 direction between mutually adjacent dot lines.

In other words, in the substrate for optics 60 according to Embodiment 2, the concavo-convex structure is provided so that a shift amount α1 in the D1 direction between the first dot line 62-1 and the second dot line 62-2 adjacent to each other in the D2 direction is different from a shift amount α2 between the second dot line 62-2 and the third dot line 62-3 adjacent to the second dot line 62-2.

By this configuration, pitches P1 to P3 among a plurality of dots 61 in the slanting direction inside the main surface of the substrate body are irregular, periodicity of the repetition pattern is thereby reduced, and the light scattering properties due to the concavo-convex structure are thereby more enhanced.

Further, in the substrate for optics 60 according to Embodiment 2, it is preferable that a difference between the shift mount al and the shift amount α2 is not constant. By this configuration, periodicity of the arrangement of the plurality of dots 62 forming the concavo-convex structure i.e. periodicity of the repetition pattern is more reduced, it is possible to further strengthen the light scattering properties, it is thereby possible to improve light extraction efficiency in the organic EL light emitting device, and it is possible to reduce the color shift and suppress glare.

Furthermore, in the substrate for optics 60 according to Embodiment 2, the pitch Py and pitch Px are provided to be both constant intervals. Therefore, as compared with the case where only the pitch Px is the constant interval, and the pitch Py in the D1 direction has the variable width δ and is the inconstant interval in the substrate for optics 1 according to Embodiment 1, intervals among the dots 61 are decreased. By this means, the light scattering effect due to disturbance of periodicity decreases, but it is possible to more improve light extraction efficiency by the diffraction effect and surface plasmon resonance.

Still furthermore, as compared with the substrate for optics 1 according to Embodiment 1 in which the pitch Py is the inconstant interval, the light extraction effect due to the diffraction effect or surface plasmon resonance decreases, but it is possible to more enhance the light scattering effect due to disturbance of periodicity of the arrangement of the plurality of dots 61, and it is possible to increase light extraction efficiency by resolving the waveguide mode and to suppress the color shift and glare.

In this case, it is preferable that a difference between the shift mount al and the shift amount α2 is not constant. By this configuration, the light scattering effect is further improved, it is thereby possible to resolve the waveguide mode and to further enhance light extraction efficiency, and it is possible to suppress the color shift and glare.

Further, in the substrates for optics according to Embodiments l and 2 as described above, it is preferable that each of the pitch Px and the pitch Py ranges from 100 nm to 1,000 nm. When the pitches Px and Py are in this range, the concavities and convexities of nano-order are provided on the surface of the substrate for optics 1 (60), and it is thereby possible to enhance luminous efficiency from the light emitting layer by the diffraction grating effect and surface plasmon resonance in the case where the organic EL light emitting device is provided on the substrate for optics 1 (60). By the pitches Px and Py of 100 nm or more, light extraction efficiency of the organic EL device increases, and the effect of enhancing luminous efficiency appears due to surface plasmon resonance. Further, by the pitches Px and Py of 1,000 nm or less, the effect of luminous efficiency appears due to the diffraction effect and surface plasmon resonance.

Furthermore, as described above, in the case of the fine-structure layer including lines comprised of a plurality of convex portions extending in the direction of from the substrate main surface of the substrate to outside the surface, i.e. in the case where the fine structure of the fine-structure layer 12 (12a) is comprised of the line-and-space structure, it is preferable that the structure forms a line structure along the first direction inside the substrate main surface, and has a plurality of line lines with a plurality of lines arranged with the pitch Px in the second direction orthogonal to the first direction inside the substrate main surface, and that the pitch Px is an inconstant interval of nano-order.

In this case, it is preferable that the pitch Px with the inconstant interval is larger than a convex-portion width of the line structure, at least four or more and m or less of adjacent pitches Pxn (3≤n≤2a or 3≤n≤2a+1, in addition, m and a are positive integers and n=m−1) meet the relationship of following equation (7), and that a long period Lz formed with the pitches Px1 to Pxn is repeatedly arranged in the second direction.

$$Px1 < Px2 < Px3 < \ldots < Pxa > \ldots > Pxn \quad (7)$$

Subsequently, described are principles that light extraction efficiency is improved by the substrate for optics according to this Embodiment. Described herein is the case where the fine structure of the fine-structure layer 12 (12a) is a plurality of dots.

As described previously, by providing the substrate for optics 1 with the fine-structure layer comprised of concavities and convexities (dots) of nano-order, it is possible to obtain four effects of 1) improvements in light extraction efficiency due to surface plasmon resonance, 2) improvements in light extraction efficiency due to the diffraction effect, 3) improvements in light extraction efficiency by resolving the waveguide mode due to light scattering, and 4) the effect of suppressing the color shift and glare due to light scattering.

By repeatedly setting the long-period unit Lxz comprised of a plurality of dots, the refractive index changes each long-period unit Lxz, and the same effect is exerted as in the case where a plurality of dots forming the long-period unit Lxz is repeated as a single unit. In other words, in the case of a plurality of dots of the same order as the wavelength, since it is possible to explain the behavior of light by the average distribution of the refractive index (effective medium approximation), in calculating the spatial average refractive index distribution, light is acted as if a plurality of dots of the long-period unit Lxz is repeated as a single unit. A plurality of dots thus arranged in the long-period unit Lxz exhibits the light scattering effect.

Further, by providing concavities and convexities of nano-order on the surface of the substrate for optics 1, surface plasmon resonance develops in harmony with the interval of the concavities and convexities, and it is possible to enhance luminous efficiency of light energy generated from the organic EL light emitting device. Alternatively, diffraction occurs in harmony with the interval of the concavities and convexities, and it is possible to effectively extract emitted light confined by the waveguide mode.

Furthermore, in the substrate for optics according to this Embodiment, the diameter of each of dots increases or decreases corresponding to the pitch. The spatial average refractive index distribution changes, while depending on the volume fraction of the configuration unit. Therefore, in a plurality of dots of the long-period unit Lxz, when the volume of each dot changes, a change in the average refractive index distribution is increased corresponding thereto, and the light scattering effect is further increased even in the same long-period unit Lxz. This effect is remarkable by increasing the diameter of the dot when the pitch between dots is narrow, or decreasing the diameter of the dot when the pitch between dots is wide.

Still furthermore, in the substrate for optics according to this Embodiment, the height of the dot also increases or decreases corresponding to the pitch between dots. Also in this case, by the same reason as described above, by increasing the height of the dot when the pitch between dots is narrow, or decreasing the height of the dot when the pitch between dots is wide, the average refractive index distribution inside the long-period unit Lxz is large, and the light scattering effect is increased.

Moreover, in the arrangement in which the long-period unit Lxz comprised of a plurality of dots is repeatedly arranged, in the case of increasing or decreasing both the diameter of each of the dots and the height of the dot as described above corresponding to the pitch, the difference in the refractive index distribution described by effective medium approximation is further increased, and such a case is preferable. In this case, by increasing the diameter of the dot and the height of the dot when the pitch between dots is narrow, or decreasing the diameter of the dot and the height of the dot when the pitch between dots is wide, in the spatial average refractive index distribution, the difference in the volume fraction of the configuration unit is large, the light scattering effect is further increased, and such a case is preferable.

It is possible to resolve the waveguide mode by the above-mentioned light scattering effect and enhance light extraction efficiency. In addition thereto, uniformity is disturbed in the nano-order of concavities and convexities, the color shift is thereby reduced, it is possible to obtain light-emitting characteristics nearer natural light, and it is possible to suppress glare.

(Configuration of Organic EL Light Emitting Device)

Figure 19:
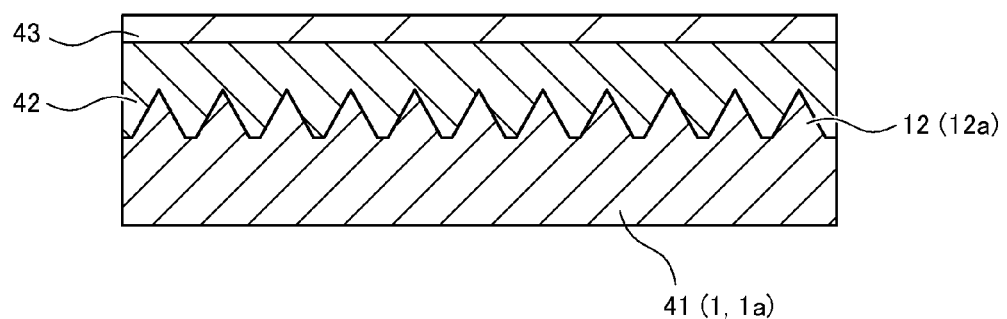
FIG. 19 is a cross-sectional schematic diagram showing an example of an organic EL light emitting device of the invention.

FIG. 19 is a cross-sectional schematic diagram of an organic EL light emitting device 40 to which is applied the substrate for optics 1 (1a) according to this Embodiment. As shown in FIG. 19, the organic EL light emitting device 40 has at least one substrate for optics 1 (1a), and the light emitting layer is disposed opposite the main surface on the fine-structure layer 12 (12) side of the substrate for optics 1 (1a). The organic EL light emitting device 40 is comprised of a light emitting portion 42 and a transparent conductive film layer 43 (TCO layer typified by ITO layer) successively layered on a substrate for optics 41 (1, 1a) having the fine-structure layer 12 (12a). Materials constituting the substrate for optics 41 (1, 1a) are not limited, and it is possible to use materials of dielectric, semiconductor, metal or the like. In the organic EL light emitting device 40, a light diffusion substrate may be provided on the other main surface of the transparent conductive film layer 43 in contact with the light emitting portion 42. In this case, the light diffusion substrate diffuses light output from the light emitting portion 42 and light reflected by the substrate for optics 41 (1, 1a), and is capable of further reducing the color shift caused by diffraction of light.

Herein, the light emitting portion 42 is prepared by successively layering a cathode (metal electrode), electron injection layer, electron transport layer, light emitting layer, hole transport layer, hole injection layer, and anode (transparent conductive film layer), and is comprised of at least three layers of the cathode, light emitting layer and anode, and the light emitting layer is at least one or more organic layers. In this case, when the surface of the substrate for optics 41 (1, 1a) exists as a metal surface, the substrate for optics 41 (1, 1a) may be used as a cathode to omit cathode formation of the light emitting portion 42. For the electron injection layer, electron transport layer, light emitting layer, hole transport layer, and hole injection layer, one layer may have two or more functions, and the hole transport layer and electron transport layer may be omitted. The light emitting layer is necessary as a place in which a hole and electron meet. As the simplest system, it is essential only that the light emitting layer sandwiched between the anode conductive layer and the cathode conductive layer exists.

As shown in FIG. 19, in the case where the substrate for optics 41 (1, 1a) is the reflection type, it is possible to form the substrate for optics 41 (1, 1a) using a dielectric, semiconductor, or combination thereof with a metal.

In the light emitting portion 42 according to this Embodiment of the invention, the concavo-convex structure formed on the substrate for optics 41 (1, 1a) is intended to develop diffracted light of EL-emitted light and generate a resonance state with surface plasmons of the cathode. The light emitted from the organic EL light emitting device forms light traveling in the direction of the light extraction surface and light traveling to the metal surface of the cathode that cannot be extracted, and the light is temporarily transformed into energy of surface plasmons by the concavities and convexities of the metal film on the cathode surface, and then is radiated toward the extraction surface side from the cathode surface as radiated light with high intensity. The radiated light radiated from the cathode surface is high in directivity, and enables light extraction efficiency to be improved. For this purpose, since suitable as a material of the cathode is a material with a high electron transport number and small loss (material with a low work function), Ag, Au or the like may be selected, or code position (Al/Ag, etc.) with Al or the like that is generally selected may be used, but material selection is not particularly limited thereto.

In the case of bottom emission type organic EL light emitting device, an anode (transparent conductive film) is first formed on the substrate for optics 41 (1, 1a), and next, the hole injection layer, hole transport layer, light emitting layer, electron transport layer, electron injection layer, and cathode are successively layered to complete. By this operation, the shape of fine concavities and convexities of the substrate for optics 41 (1, 1a) is transferred to the cathode, and the cathode generates a surface plasmon resonance state.

In order to transfer the shape, the thickness of each layer needs to be as thin as possible, and each of the layers of the organic EL light emitting device is usually formed in about 20 nm to 100 nm, and does not have any problem.

Figure 20:
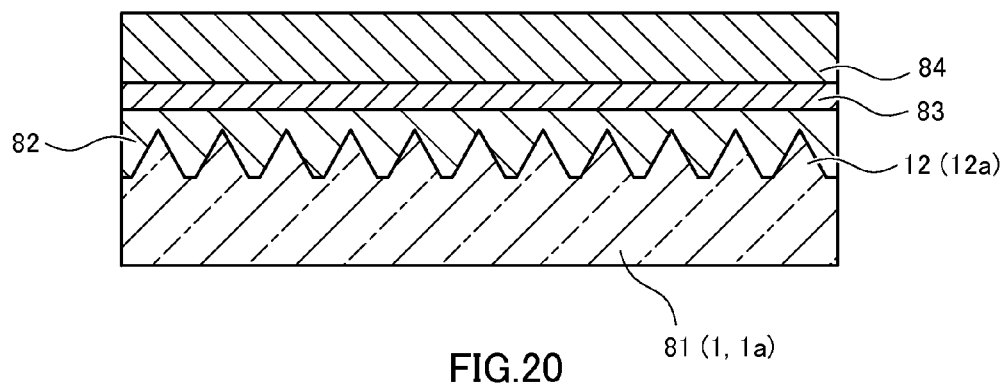
FIG. 20 is a cross-sectional schematic diagram showing another example of the organic EL light emitting device of the invention.

FIG. 20 is a cross-sectional schematic diagram of an organic EL light emitting device 80 of another form to which is applied the substrate for optics 1 (1a) according to this Embodiment. As shown in FIG. 20, in the organic EL light emitting device 80, a transparent conductive film layer 83 is formed on a substrate for optics 81 (1, 1a) having the fine-structure layer 12 (12a) via a transparent dielectric layer 82, and a light emitting portion 84 is layered on the transparent conductive film layer 83.

Herein, the light emitting portion 84 is prepared by successively layering an anode (transparent conductive film layer), hole injection layer, hole transport layer, light emitting layer, electron transport layer, electron injection layer, and cathode (metal electrode), and is comprised of at least three layers of the cathode, light emitting layer and anode, and the light emitting layer is at least one or more organic layers. Since the transparent conductive film layer 83 is formed, anode formation of the light emitting portion 84 may be omitted. For the hole injection layer, hole transport layer, light emitting layer, electron transport layer and electron injection layer, one layer may have two or more functions, and the hole transport layer and electron transport layer may be omitted. The light emitting layer is necessary as a place in which a hole and electron meet. As the simplest system, it is essential only that the light emitting layer and cathode exist.

A preparation method of each of the anode, hole injection layer, hole transport layer, light emitting layer, electron transport layer, electron injection layer, and cathode used in the present invention is not limited particularly, and is as described below when the description is given using a general bottom emission type organic EL light emitting device as an example. In other words, the anode (transparent conductive film layer) and cathode are prepared by a vacuum deposition method, sputtering method or the like, and the hole injection layer, hole transport layer, light emitting layer, electron transport layer and electron injection layer are prepared by an organic deposition method or thin film coating method.

Layering of each layer is performed in the order in which the layer is closer to the substrate, and therefore, the anode (transparent conductive film layer) is first deposited. In the case of the bottom emission type organic EL light emitting device, since the anode conductive layer needs to be transparent, selected as materials are transparent conductive materials (TCO) such as ITO (Indium Tin Oxide), ZnO (Zinc Oxide), and ZTO (Zinc Tin Oxide) and the like.

Next, as the hole injection layer, and transport layer, a film of an aromatic amine compound or the like is deposited. Aromatic amine compounds such α-NPD and CuPc are suitable in ionization potential and hole transport properties, are reversible electrochemically, and are used the most as hole transport materials. Next, the light emitting layer is layered. Among materials used alone in the light emitting layer are BBA, DTE and the like that are fluorescent dye compounds, and the hole or electron transport compound may be doped with the fluorescent dye compound. As a substitute for the fluorescent dye material, using a phosphorescence light emitting material improves theoretical transform efficiency from about 25% to about 100%, and therefore, is preferable.

Next, the electron transport layer is layered. As the electron transport layer, the oxadiol system (PBD, etc.), triazole system (TAZ) and the like are used. When a substance of the metal complex system (Alq3 and the like) is used, the substance serves as the electron transport layer and the light emitting layer, and is convenient.

Finally, the cathode conductive layer is layered. As materials of the cathode conductive layer, such a method is general that LiF, Li-based compound or the like is added in a slight amount, and that Al, Ag, Al/Ag alloy or the like is then layered.

In the light emitting device 80, a light diffusion layer not shown may be provided between the transparent dielectric layer 82 and the transparent conductive film layer 83. In this case, it is possible to more suppress the color shift.

Further, in the light emitting device 80, a light reflection layer not shown may be provided on the main surface on the side opposite to the main surface of the light emitting portion 84 in contact with the transparent conductive film layer 83. In this case, it is possible to enhance the intensity of light reaching the substrate for optics 81 (1, 1a).

Figure 21:
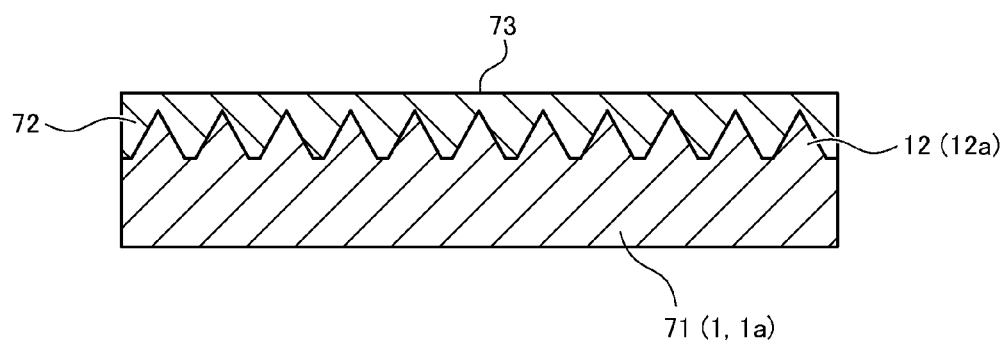
FIG. 21 is a cross-sectional schematic diagram of the substrate for optics according to the Embodiment of the invention.

Herein, the dielectric layer provided on the surface of the substrate for optics according to this Embodiment will specifically be described. As shown in FIG. 21, a substrate for optics 71 (1, 1a) according to this Embodiment may be provided with a transparent conductive film layer 72 having a shape associated with the dot shape or line shape on the dot surface of the fine-structure layer 12 (12a). Further, it is preferable that a main surface 73 on the side opposite to the fine-structure layer 12 (12a) in the transparent dielectric layer 72 is flattened. In addition, the shape associated with the dot shape or line shape means that the dot shape or line shape that the transparent dielectric layer 72 has and the dot shape or line shape that the fine-structure layer 12 (12a) has are in the relationship of transfer shape. In other words, it is meant that the fine structure of the fine-structure layer 12 (12a) is filled with the transparent dielectric layer 72.

By flattening the main surface 73 on the side opposite to the fine-structure layer 12 (12a) in the transparent dielectric layer 72, in the case of using as an organic EL light emitting device, it is possible to suppress an electrical short circuit of the organic EL light emitting device, leading to improvements in reliability. It is possible to select the degree of flattening as appropriate according to properties of a used light emitting device. For example, from the viewpoint of suppressing a short circuit, Ra≤10 nm is preferable, Ra≤5 nm is more preferable, Ra≤2 nm is further preferable, and Ra≤1 nm is the most preferable. In addition, it is possible to measure Ra with an atomic force microscope (AFM), and the range of AFM measurement in calculating Ra is 5 μm×5 μm to measure.

Figure 22:
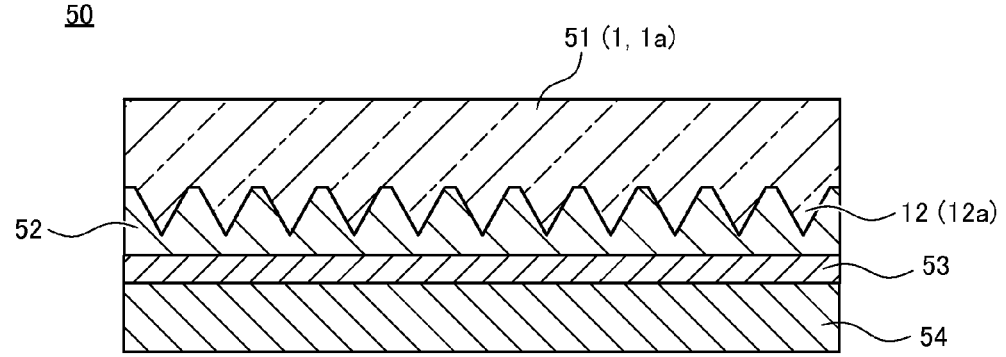
FIG. 22 is a cross-sectional schematic diagram showing still another example of the organic EL light emitting device of the invention.

FIG. 22 is a cross-sectional schematic diagram of an organic EL light emitting device 50 of another form to which is applied the substrate for optics 1 (1a) according to this Embodiment. As shown in FIG. 22, the organic EL light emitting device 50 is configured by layering a transparent conductive film layer 53 on a light emitting portion 54, and bonding a substrate for optics 51 (1, 1a) onto the transparent conductive film layer 53 via a transparent dielectric layer 52. At this point, the substrate for optics 51 (1, 1a) is disposed so that the transparent dielectric layer 52 side is in contact with the transparent conductive film layer 53. In other words, the exposed surface of the substrate 11 in the substrate for optics 51 (1, 1a) is disposed farthest from the light emitting portion 54.

In the organic EL light emitting device 50, a light diffusion layer not shown may be provided on the main surface on the side opposite to the main surface in contact with the transparent conductive film layer 53 of the light emitting portion 54. In this case, it is possible to more suppress the color shift. Further, in the light emitting device 50, a light reflection layer not shown may be provided on the main surface on the side opposite to the main surface in contact with the transparent conductive film layer 53 of the light emitting portion 54. In this case, it is possible to enhance the intensity of light reaching the substrate for optics 51 (1, 1a).

In addition, in the case of the organic EL light emitting device 50 as shown in FIG. 22, the substrate in the substrate for optics 51 (1, 1a) may be disposed on the organic EL light emitting device 50 without being removed, or may be removed after bonding the substrate for optics 51 (1, 1a) onto the transparent conductive film layer 53. Further, the substrate and fine-structure layer 12 (12a) may be removed after bonding the substrate for optics 51 (1, 1a) onto the transparent conductive film layer 53.

(Material Configuration of the Substrate for Optics)

The substrate for optics 1 (1a) of the present invention is not limited particularly, as long as the substrate has the periodical dot structure on its surface, and it is possible to use any one of materials of resin, dielectric, semiconductor and metal.

As shown in FIG. 19, when the emitted light from the organic EL light emitting device is reflected by the substrate for optics 41 (1, 1a) of the invention and thus is emitted from the light emitting device, the surface of the substrate for optics 41 (1, 1a) of the invention needs to be comprised of at least a reflective material such as a metal. When a metal is used as the substrate for optics 41 (1, 1a), in the case of providing the organic EL light emitting device on the substrate for optics 41 (1,1a), the light extraction effect by surface plasmon resonance is easy to obtain, and such a case is preferable.

In this case, the substrate for optics 41 (1, 1a) is preferably formed by applying a metal film onto the surface of the substrate for optics having the dot structure comprised of a dielectric. Alternately, the substrate is obtained by techniques for forming a flat metal film on the surface of a dielectric or the like, and then, performing patterning on the metal film, and the manufacturing method is not limited particularly. When the substrate for optics 41 (1, 1a) is comprised of a resin substrate, the substrate is obtained by the method of applying a metal film onto the resin substrate having the dot structure.

The metal applied to the substrate for optics 41 (1, 1a) is selected as appropriate according to the intended wavelength. For example, in the case of using in a light emitting device of UV light, aluminium is preferable which is high in the frequency (plasma frequency) at which free electrons of the metal are not able to follow by vibration of electromagnetic waves. In the case of using in light emitting devices of blue to green in the visible region e.g. in the region of 380 nm to 650 nm, it is preferable to use silver or aluminium exhibiting high reflectance in the entire visible wavelength region, and further, it is particularly preferable to use silver with low in the absolute value of the real part of dielectric constant. In red of the visible region e.g. 580 nm to 780 nm, it is preferable to use silver or gold with high in reflectance at the wavelengths.

As shown in FIGS. 20 and 22, in the case of the configuration of the light emitting device in which the emitted light from the organic EL light emitting device passes through the substrate for optics 1 (1a) of the present invention, the substrate for optics 1 (1a) of the invention needs to be comprised of a light transmissive material.

Further, the substrate 11 (11a) and fine-structure layer 12 (12a) may be comprised of the same material or may be comprised of different materials. In the case where the substrate 11 (11a) and fine-structure layer (12a) are comprised of different materials, it is possible to select various properties required of each as appropriate, and such a case is preferable.

(Materials of the Substrate 11 (11a))

As the substrate 11 (11a), it is possible to use any one of materials of resin, dielectric, semiconductor and metal. For example, it is possible to use inorganic substrates such as quartz, glass, metal, silicon and ceramic, resin substrates, etc. As the resin substrate, for example, it is possible to use amorphous thermoplastic resins such as polyvinyl alcohol resin, polyacrylonitrile resin, polymethacrylate methyl resin, polycarbonate resin, polystyrene resin, cycloolefin resin (COP), crosslinked polyethylene resin, polyvinyl chloride resin, polyvinyl chloride copolymer resin, polyvinylidene chloride resin, polyvinylidene chloride copolymer resin, polyallylate resin, polyphenylene ether resin, modified polyphenylene ether resin, polyether imide resin, polyether sulfone resin, polysulfone resin, and polyether ketone resin. Further, as the resin substrate, it is possible to use crystalline thermoplastic resins such as polyethylene terephthalate (PET) resin, polyethylene naphthalate resin, polyethylene resin, polypropylene resin, polybutylene terephthalate resin, aromatic polyester resin, polyacetal resin, polyamide resin, and polyimide resin. Furthermore, it is possible to use ultraviolet (UV)-curable resins and thermosetting resins of acrylic system, epoxy system and urethane system, and the like. Still furthermore, as the substrate for optics 41 (51), complex substrates may be used which are obtained by combining the UV-curable resin or thermosetting resin with inorganic substrate such as glass, the thermoplastic resin, triacetate resin, or the like.

When the resin substrate is used as the substrate 11 (11a), it is possible to obtain the substrate for optics 1 (1a) that is flexible and light. Further, such a substrate has many merits in industrial production such as being applicable to the roll-to-roll type manufacturing method with ease.

(Materials of the Fine-Structure Layer 12 (12a))

As shown in FIG. 19, when the emitted light from the organic EL light emitting device is reflected by the substrate for optics 1 (1a) of the invention and thus is emitted from the light emitting device, it is preferable that at least the fine-structure layer 12 (12a) is a reflective material such as a metal. When a metal is used as the fine-structure layer 12 (12a), in the case of providing the organic EL light emitting device on the substrate for optics 1 (1a), the light extraction effect by surface plasmon resonance is easy to obtain, and such a case is preferable. Meanwhile, in the case of using a material such as a dielectric other than a metal, the surface is coated with a metal film.

In this case, the metal applied to the fine-structure layer 12 (12a) is selected as appropriate according to the intended wavelength. For example, in the case of using in a light emitting device of UV light, aluminium is preferable which is high in the frequency (plasma frequency) at which free electrons of the metal are not able to follow by vibration of electromagnetic waves. In the case of using in light emitting devices of blue to green in the visible region e.g. in the region of 380 nm to 650 nm, it is preferable to use silver or aluminium exhibiting high reflectance in the entire visible wavelength region, and further, it is particularly preferable to use silver with low in the absolute value of the real part of dielectric constant. In red of the visible region e.g. 580 nm to 780 nm, it is preferable to use silver or gold with high in reflectance at the wavelengths.

(Materials of the Fine-Structure Layer 12 (12a) that are Light Transmissive Materials)

As shown in FIGS. 20 and 22, in the case of the configuration of the light emitting device in which the emitted light from the organic EL light emitting device passes through the substrate for optics 1 (1a) of the present invention, the substrate for optics 1 (1a) of the invention needs to be comprised of a light transmissive material as described below.

Further, it is preferable that a difference between a refractive index of the material constituting the fine-structure layer 12 (12a) and a refractive index of the material constituting the substrate 11 (11a) is 0.15 or less. When the refractive index difference is in the range, reflection of the emitted light passing through the substrate 11 (11a) from the fine-structure layer 12 (12a) is suppressed in the interface between the fine-structure layer 12 (12a) and the substrate 11 (11a), and light extraction efficiency is thereby improved. From the viewpoint of further exerting this effect more, the refractive index difference is more preferably 0.1 or less. The most preferable case is that the refractive index of the material constituting the fine-structure layer 12 (12a) is substantially equal or equal to the refractive index of the material constituting the substrate 11 (11a).

Herein, the refractive indexes being substantially equal include the case of having a refractive index difference to such an extent that reflection in the interface does not become any problem with respect to light extraction efficiency. For example, when the refractive index of the substrate 11 (11a) is 1.45, in order to achieve the interface reflectance of 0.1% or less that does not become any problem as light extraction efficiency, the refractive index of the material constituting the fine-structure layer 12 (12a) in the interface needs to range from 1.37 to 1.54 (the refractive index difference is about 0.08 to 0.09 or less.) Therefore, the substantially equal refractive indexes include the above-mentioned range. In addition, the range in which the above-mentioned refractive indexes are equal includes the case (the refractive index difference is 0) where the refractive index of the material constituting the fine-structure layer 12 (12a) is the same as the refractive index of the material constituting the substrate 11 (11a). When the fine-structure layer 12 (12a) is formed by directly processing the substrate 11 (11a) to be the fine-structure layer 12 (12a), the refractive indexes thereof are substantially equal in the interface between the fine-structure layer 12 (12a) and the substrate 11 (11a). On the other hand, when the fine-structure layer 12 (12a) is formed on the substrate 11 (11a) independently, it is preferable to select materials such that the refractive index of the material constituting the fine-structure layer 12 (12a) and the refractive index thereof are substantially equal in the interface between the fine-structure layer 12 (12a) and the substrate 11 (11a). In this case, the material constituting the fine-structure layer 12 (12a) is not limited particularly, as long as the material meets the above-mentioned range of the refractive index, and for example, it is possible to use various publicly-known resin organic resins, organic-inorganic composite resins, inorganic precursors, inorganic condensation products, metal oxide fillers, metal oxide fine particles and the like, or compositions in combination thereof.

It is preferable that the material constituting the fine-structure layer 12 (12a) is optically transparent also after heat treatment. Herein, the heat treatment temperature is preferably 150° C. or more, and more preferably 200° C. or more. The heat time is preferably 10 minutes or more. Further, the heat atmosphere is preferably in a low-oxygen environment (for example, vacuum state, nitrogen substitution state or the like).

As inorganic substances applied to the material constituting the fine-structure layer 12 (12a), for example, it is possible to contain a sol-gel material and inorganic filler (inorganic fine particles). By containing the sol-gel material or inorganic filler (inorganic fine particles), it is possible to adjust the refractive index in the above-mentioned range with ease, it is also possible to suppress deterioration of the fine-structure layer 12 (12a) in the case of using the substrate for optics 1 according to this Embodiment as a light emitting device, and such materials are preferable. The material constituting the fine-structure layer 12 (12) is capable of containing the sol-gel material and inorganic filler (inorganic fine particles) as described above, and may be comprised of only the sol-gel material, comprised of an organic-inorganic hybrid material with an organic resin (photopolymerizable resin, thermopolymerizable resin, thermoplastic resin or the like), or comprised of only an organic resin. Particularly, from the viewpoint of formability and formation velocity of the fine-structure layer 12 (12a), it is preferable to contain a photopolymerizable resin.

Among the photopolymerizable groups contained in the fine-structure layer 12 (12a) are an acryloyl group, methacryloyl group, acryloxy group, methacryloxy group, acrylic group, methacrylic group, vinyl group, epoxy group, ally group, and oxetanyl group.

Further, preferable as the metal element contained in the fine-structure layer 12 (12a) is at least one selected from the group consisting of titanium (Ti), zirconium (Zr), chromium (Cr), zinc (Zn), tin (Sn), bromine (B), indium (In), aluminium (Al), and silicon (Si). Particularly, titanium (Ti), zirconium (Zr) and silicon (Si) are preferable.

Among the resins contained in the fine-structure layer 12 (12a) are both photopolymerizable resin and thermopolymerizable resin or one of the resins. Examples thereof are photosensitive resins used as a hard coat material, and photopolymerizable resins and thermopolymerizable resins for use in nanoimprint lithography.

The material constituting the fine-structure layer 12 (12a) preferably contains the sol-gel material. By containing the sol-gel material, heat resistance of the fine-structure layer 12 (12a) is improved, and therefore, the sol-gel material is preferable. As the sol-gel material, it is possible to use only a metal alkoxide having a single metal species, or metal alkoxides having different metal species together, and it is preferable to contain at least two kinds of metal alkoxides of a metal alkoxide having a metal species M1 (in addition, M1 is at least one kind of metal element selected from the group consisting of Ti, Zr, Zn, Sn, Mg and In) and a metal alkoxide having a metal species Si. Further, it is also possible to use a hybrid of these sol-gel materials and publicly-known photopolymerizable resin.

From the viewpoint of meeting the above-mentioned refractive index range, the sol-gel material preferably contains at least two kinds of metal alkoxides with different metal species. Examples of combinations of metal species of two kinds of metal alkoxides with different metal species are Si and Ti, Si and Sn, Si and Zr, Si and Zn, Si and In, Si and Mg, Ti and Zr, Ti and Zn, and Ti and Mg and likes. Particularly, in the case where the sol-gel material contains two kinds of metal alkoxides with different metal species and the metal species of one of the metal alkoxides is Si, a ratio CM1/CSi, between the molar concentration (CSi) of the metal alkoxide having Si as the metal species and the molar concentration (CM1) of the metal alkoxide having the metal species M1 except Si, preferably ranges from 0.2 to 15. From the viewpoint of formability of the fine-structure layer 12, CM1/CSi preferably ranges from 0.5 to 15, and more preferably ranges from 5 to 8.

The fine-structure layer 12 (12a) may be a hybrid containing inorganic segments and organic segments. Examples of the hybrids are combinations of inorganic fine particles (inorganic filler) and photopolymerizable (or thermopolymerizable) resin, inorganic precursors and photopolymerizable thermopolymerizable) resin, molecules with an organic polymer and inorganic segment bound by covalent bonds, and polymers (PVP, etc.) for forming hydrogen bonds with inorganic fine particles (inorganic filler). In the case were the sol gel material is used as an inorganic precursor, it is meant contain a photopolymerizable resin as well as the sol-gel material containing a silane coupling agent. In the case of the hybrid, for example, it is possible to mix the metal alkoxide, silane coupling agent provided with photopolymerizable groups, radical polymerization-system resin and like. In order to more improve formability, silicone may be added thereto. Further, from the viewpoint of improving formability of the fine-structure layer 12 (12a), the sol-gel material may undergo preliminary condensation to be a prepolymer. From the viewpoint, of formability of the fine-structure layer 12, the mixture ratio between the metal alkoxide containing the silane coupling agent and the photopolymerizable resin is preferably in the range of 3:7 to 7:3. The ratio is more preferably in the range of 3.5:6.5 to 6.5:3.5. The resin used in the hybrid is not particularly limited when the resin is photopolymerizable, and can be the radical polymerization system or cation polymerization system.

As the photopolymerizable radical polymerization-system resin constituting the fine-structure layer 12 (12a), for example, it is possible to use a resin composition that is a mixture of meth (acrylate) and a photoinitiator.

The (meth)acrylates are not limited particularly when the glass transition temperature after curing is 100° C., or more, and more preferably 120° C. or more. Among preferable (meth)acrylates are monomers having an acryloyl group or a methacryloyl group, monomers having a vinyl group, and monomers having an allyl group. The monomers having an acryloyl group or a methacryloyl group are more preferable. Herein, the glass transition temperature after curing means the glass transition temperature of a cured material of the mixture of (meth)acrylates to use. For example, in the case of using (meth)acrylate A, (meth)acrylate B, and (meth) acrylate C and the glass transition temperatures of (meth) acrylates A, B and C after curing are respectively 60° C., 100° C. and 120° C., when the glass transition temperature of the mixture ((meth)acrylate A+(meth)acrylate B+(meth) acrylate C) after curing is 105° C., 105° C. is adopted as the glass transition temperature.

Polymerizable monomers are preferably polyfunctional monomers provided with a plurality of polymerizable groups, and the number of polymerizable groups is preferably an integer of from 1 to 6 in terms of excellent polymerizable properties. Further, in the case of mixing two kinds of polymerizable monomers or more to use, the average number of polymerizable groups preferably ranges from 2 to 5. In the case of using a single kind of monomers, in order to increase the crosslinking points after a polymerization reaction to obtain physical stability (strength, heat resistance, etc.) of the cured material, the monomers are preferably monomers with the number of polymerizable groups being 3 or more. Furthermore, in the case of monomers with the number of polymerizable groups being 1 or 2, it is preferable to use the monomers together with monomers with the different number of polymerizable groups. Particularly, from the viewpoint of refractive index adjustment, it is preferable to have a styrene portion (benzene ring portion).

As specific examples of (meth)acrylate monomers, there are the following compounds. Examples of monomers having an acryloyl group or a methacryloyl group are (meth) acrylic acids, aromatic(meth)acrylates [phenoxyethyl acrylate, benzyl acrylate, etc.], hydrocarbon (meth)acrylates [stearyl acrylate, lauryl acrylate, 2-ethylhexyl acrylate, allyl acrylate, 1,3-butanediol diacrylate, 1,4-butanediol diacrylate, 1,6-hexanediol diacrylate, trimethylolpropane triacrylate, pentaerythritol, triacrylate, dipentaerythritol hexaacrylate, etc.], ethereal oxygen atom-containing hydrocarbon (meth)acrylates [ethoxyethyl acrylate, methoxyethyl acrylate, glycidyl acrylate, tetrahydrofurfuryl acrylate, diethylene glycol diacrylate, neopentylglycol diacrylate, polyoxyethylene glycol diacrylate, tripropylene glycol diacrylate, etc.], functional group-containing hydrocarbon (meth)acrylates [2-hydroxyethyl acrylate, 2-hydroxypropyl acrylate, 4-hydroxybutyl vinyl ether, N, N-diethylamino ethyl acrylate, N,N-dimethylamino ethyl acrylate, N-vinyl pyrolidone, (dimethylamino)ethyl methacrylate, etc.], and silicone-based acrylates. Further, other samples are EO-modified glycerol tri(meth)acrylate, ECH-modified glycerol tri(meth) acrylate, PO-modified glycerol tri(meth)acrylate, pentaerythritol triacrylate, EO-modified phosphoric acid triacrylate, trimethylolpropane tri(meth)acrylate, caprolactone-modified trimethylolpropane tri(meth)acrylate, PO-modified trimethylolpropane tri(meth)acrylate, tris(acryloxyethyl) isocyanurate, EO-modified trimethylolpropane tri(meth) acrylate, dipentaerythritol hexa(meth)acrylate, caprolactone-modified dipentaerythritol hexa(meth)acrylate, dipentaerythritol hydroxy penta(meth)acrylate, alkyl-modified dipentaerythritol penta(meth)acrylate, dipentaerythritol poly (meth)acrylate, ditrimethylol propane tetra(meth)acrylate, alkyl-modified dipentaerythritol tri(meth)acrylate, pentaerythritol ethoxy tetra(meth)acrylate, pentaerythritol tetra (meth)acrylate, di(ethylene glycol) monoethyl ether (meth) acrylate, dimethylol dicyclopentane di(meth)acrylate, di(meth)acrylated isocyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth)acrylate, acryloxy polyethylene glycol acrylate, 1,9-nonanediol di(meth)acrylate, EO-modified bisphenol A di(meth)acrylate, PO-modified bisphenol A di(meth)acrylate, modified-bisphenol A di(meth)acrylate, EO-modified bisphenol F di(meth)acrylate, ECH-modified hexahydrophthalic acid diacrylate, neopentyl glycol di(meth)acrylate, hydroxy pivalic acid neopentyl glycol di(meth) acrylate, EO-modified neopentyl glycol diacrylate, caprolactone-modified hydroxy pivalic acid ester neopentyl glycol, stearic acid-modified pentaerythritol di(meth)acrylate, ECH-modified propylene glycol di(meth)acrylate, ECH-modified phthalic acid di(meth)acrylate, poly(ethylene glycol-tetramethylene glycol) di(meth)acrylate, poly(propylene glycol-tetramethylene glycol) di(meth)acrylate, polypropylene glycol di(meth)acrylate, silicone di(meth) acrylate, tetraethylene glycol di(meth)acrylate, triethylene glycol di(meth)acrylate, polyester (di)acrylate, polyethylene glycol di(meth)acrylate, dimethylol tricyclodecane di(meth) acrylate, neopentyl glycol-modified trimethylol propane di(meth)acrylate, dipropylene glycol di(meth)acrylate, tripropylene glycol di(meth)acrylate, triglycerol di(meth) acrylate, EO-modified tripropylene glycol di(meth)acrylate, divinyl ethylene urea, divinyl propylene urea, 2-ethyl-2-butyl propanediol acrylate, 2-ethylhexyl (meth)acrylate, 2-ethylhexyl carbitol (meth)acrylate, 2-hydroxyethyl (meth) acrylate, 2-hydroxypropyl (meth)acrylate, 2-hydroxybutyl (meth)acrylate, 2-methoxyethyl (meth)acrylate, 3-methoxybutyl (meth)acrylate, 4-hydroxybutyl (meth)acrylate, acrylic acid dimer, benzyl (meth)acrylate, butanediol mono(meth) acrylate, butoxyethyl (meth)acrylate, butyl (meth)acrylate, cetyl (meth)acrylate, EO-modified cresol (meth)acrylate, ethoxyed phenyl (meth)acrylate, ethyl (meth)acrylate, dipropylene glycol (meth)acrylate, isoamyl (meth)acrylate, isobutyl (meth)acrylate, iso-octyl (meth)acrylate, cyclohexyl (meth)acrylate, dicyclo pentanyl (meth)acrylate, isobornyl (meth)acrylate, dicyclo pentanyl oxyethyl (meth)acrylate, iso myristyl (meth)acrylate, lauryl (meth)acrylate, methoxy dipropylene glycol (meth)acrylate, methoxy polyethylene glycol (meth)acrylate, methoxy triethylene glycol (meth) acrylate, methyl (meth)acrylate, methoxy tripropylene glycol (meth)acrylate, neopentyl glycol benzoate (meth)acrylate, nonylphenoxy polyethylene glycol (meth)acrylate, nonylphenoxy polypropylene glycol (meth)acrylate, octyl (meth)acrylate, paracumyl phenoxy ethylene glycol (meth) acrylate, ECH-modified phenoxy acrylate, phenoxy diethylene glycol (meth)acrylate, phenoxy hexaethylene glycol (meth)acrylate, phenoxy tetraethylene glycol (meth)acrylate, phenoxy ethyl (meth)acrylate, polyethylene glycol (meth)acrylate, polyethylene glycol-polypropylene glycol (meth)acrylate, polypropylene glycol (meth)acrylate, stearyl (meth)acrylate, EO-modified succinic acid (meth)acrylate, tert-butyl (meth)acrylate, tribromo phenyl (meth)acrylate, EO-modified tribromo phenyl (meth)acrylate, tridodecyl (meth)acrylate, isocyanuric acid EO-modified di/triacrylate, ε-caprolactone-modified tris(acryloxyethyl)isocyanurate, and di(trimethylolpropane) tetraacrylate. Examples of monomers having an ally group include p-isopropenyl phenol, and examples of monomers having a vinyl group include styrene, α-methyl styrene, acrylonitrile, and vinylcarbazole. In addition, EO-modified means ethylene oxide-modified, ECH-modified means epichlorohydrin-modified, and PO-modified means propylene oxide-modified. Further, for example, as the bisphenol A system, it is possible to adopt dimethacrylate of polyalkylene glycol with average 2 moles of propylene oxides and average 6 moles of ethylene oxides added to each of both ends of bisphenol A, dimethacrylate (made by Shin-Nakamura Chemical Co., Ltd. NK Ester BPE-500) of polyethylene glycol with average 5 moles of ethylene oxides added to each of both ends of bisphenol A, and dimethacrylate (made by Shin-Nakamura Chemical Co., Ltd. NK Ester BPE-200) of polyethylene glycol with average 2 moles of ethylene oxides added to each of both ends of bisphenol A. Examples are 1,6-hexanediol di(meth) acrylate, 1,4-cyclohexanediol di(meth)acrylate, polypropylene glycol di(meth)acrylate, polyethylene glycol di(meth) acrylate, 2-di(p-hydroxyphenyl) propane di(meth)acrylate, glycerol tri(meth)acrylate, trimethylolpropane tri(meth) acrylate, poly(oxypropyl) trimethylolpropane tri(meth)acrylate, poly(oxyethyl) trimethylolpropane triacrylate, pentaerythritol tetra(meth)acrylate, dipentaerythritol penta (meth)acrylate, trimethylolpropane triglycidyl ether tri (meth)acrylate, bisphenol A diglycidyl ether di(meth) acrylate, β-hydroxypropyl-β'-acryloyloxy propyl phthalate, phenoxy polyethylene glycol (meth)acrylate, nonyl phenoxy polyethylene glycol (meth)acrylate, nonyl phenoxy polyalkylene glycol (meth)acrylate, and polypropylene glycol mono(meth)acrylate. As the urethane compounds, examples thereof are urethane compounds obtained by a reaction between a diisocyanate compound such as hexane methylene diisocyanate, tolylene diisocyanate, or 2,2,4-trimethylhexamethylene diisocyanate and a compound having a hydroxy group and (meth)acrylic group in one molecule (2-hydroxypropyl acrylate, oligo(propyleneglycol) monomethacrylate, and the like). More specifically, there is a reactant of hexane methylene diisocyanate and oligo (propyleneglycol) monomethacrylate (made by NOF CORPORATION, Blenmer PP1000).

From the viewpoint of adjusting the refractive index, a binder resin may be contained. Containing a binder resin improves adjustments of the refractive index and heat resistance, and is thereby preferable.

The binder resin may be a reactive binder. The weight average molecular weight of the binder resin preferably ranges from 5,000 to 500,000 from the viewpoint of formability, more preferably ranges from 5,000 to 100,000 to further exert the above-mentioned effect more, and further preferably ranges from 5,000 to 60,000. The degree of dispersion (often called the molecular weight distribution) is expressed by the ratio of the weight average molecular weight to the number average molecular weight of the following equation. (Degree of dispersion)=(weight average molecular weight) (number average molecular weight). The degree of dispersion substantially ranging from about 1 to 6 is used, and preferably, the degree ranges from 1 to 4. In addition, the molecular weight is obtained as a weight average molecular weight (in terms of polystyrene) using Gel Permeation Chromatography (GPC) made by JASCO Corporation (Pump: Gulliver, PU-1580 type, Column: Shodex (Registered Trademark) made by SHOWA DENKO K.K. (KF-807, KF-806M, KF-806M, KF-802.5) four parallel, mobile phase solvent: tetrahydrofuran, use of calibration curve by polystyrene standard sample).

The binder resin is not limited particularly, and for example, it is possible to use a resin obtained by copolymerizing one or more monomers from each of two kinds of monomers as described below as the binder resin.

As the first monomers, for example, it is possible to use alkyl (meth)acrylates such as methyl (meth)acrylate, ethyl (meth)acrylate, butyl (meth)acrylate and 2-ethylhexyl (meth)acrylate, aryl acrylates such as 2-hydroxyethyl (meth) acrylate, 2-hydroxypropyl (meth)acrylate, (meth)acrylonitrile, benzyl (meth)acrylate, methoxybenzyl (meth)acrylate, chlorobenzyl (meth)acrylate, furfuryl (meth)acrylate, tetrahydrofurfuryl (meth)acrylate, phenoxyethyl (meth)acrylate, phenyl (meth)acrylate, cresyl (meth)acrylate, and naphthyl (meth)acrylate, vinyl compounds (for example, styrene) having phenyl groups, and the like.

It is preferable to use benzyl (meth)acrylate or a vinyl compound (for example, styrene) having a phenyl group as the above-mentioned second monomer. It is preferable that benzyl (meth)acrylate or the vinyl compound (for example, styrene) having a phenyl group is copolymerized in an amount of 10 mass % to 95 mass % in one molecule of the resin for a binder. Particularly, the amount preferably ranges from 20 mass % to 90 mass %.

Photoinitiators are not limited particularly, and are preferably photoinitiators that do substantially not absorb at used wavelengths in an environment of using the substrate for optics 1. The photoinitiator causes a radical reaction or ion reaction by light, and is preferably photoinitiators that caused radical reaction. As the photoinitiators, for example, there are photoinitiators as described below.

Among acetophenone-series photoinitiators are acetophenone, p-tert-butyltrichloro acetophenone, chloro acetophenone, 2-2-diethoxy acetophenone, hydroxy acetophenone, 2,2-dimethoxy-2'-phenyl acetophenone, 2-amino acetophenone, dialkylamino acetophenone, etc. Among benzoin-series photoinitiators are benzyl, benzoin, benzoin methyl ether, benzoin ethyl ether, benzoin isopropyl ether, benzoin isobutyl ether, 1-hydroxycylohexyl phenyl ketone, 2-hydroxy-2-methyl-1-phenyl-2-methylpropane-1-one, 1-(4-isopropylphenyl)-2-hydroxy-methylpropane-1-one, benzyl dimethyl ketal, Among benzophenone-series photoinitiators are benzophenone, benzoylbenzoic acid, methyl benzoyl benzoate, methyl-o-benzoyl benzoate, 4-phenyl benzophenone, hydroxy benzophenone, hydroxypropyl, benzophenone, acrylic benzophenone, 4,4'-bis(d methy amino)benzophenone, perfluoro benzophenone, etc.)

Among thioxanthone-series photoinitiators are thioxanthone, 2-chlorothioxanthone, 2-methyl thio thane, diethyl thioxanthone, dimethyl thioxanthone, etc.

Among anthraquinone-series photoinitiators are 2-methyl anthraquinone, 2-ethyl anthraquinone, 2-tert-butyl anthraquinone, 1-chloro anthraquinone, 2-amyl anthraquinone, etc.

Among ketal-series photoinitiators are acetophenone dimethyl ketal, benzyl dimethyl ketal, etc.

Among other photoinitiators are α-acyl oxime ester, benzyl-(o-ethoxycarbonyl)-α-monoxime, acyl phosphine oxide, glyoxy ester, 3-keto coumarin, 2-ethyl anthraquinone, camphor quinone, tetramethyl thiuram sulfide, azobis isobutylnitrile, benzoyl peroxide, dialkyl peroxide, tert-butyl peroxy pivalate, etc and photoinitiators having fluorine atoms: perfluoro tert-butyl peroxide, perfluoro benzoyl peroxide, etc. It is possible to use publicly-known such photoinitiators alone or in combination of two kinds or more.

Examples of commercially available photoinitiators are "Irgacure (Registered Trademark)" (for example, Irgacure 651, 184, 500, 2959, 127, 754, 907, 369, 379, 379EG, 819, 1800, 784, O26E01, O26E02) and "Darocur (Registered Trademark)" (for example, Darocur 1173, MBF, TPO, 4265) made by BASF Japan Ltd.

The photopolymerizable cation polymerization system resin constituting the fine-structure layer 12 means a composition containing at least a cation curable monomer and photoacid generator. The cation curable monomer in the cation curable resin composition is a compound such that the cured material is obtained by performing curing treatment e.g. UV irradiation, heating and the like in the presence of a cation initiator. Among the cation curable monomers are epoxy compounds, oxetane compounds, vinyl ether compounds and the like, and among the epoxy compounds are cycloaliphatic epoxy compounds, glycidyl ethers and the like. Among the compounds, the cycloaliphatic epoxy compound improves the polymerization initiating rate and is thus preferable to use, the oxetane compound has the effect of improving the rate of polymerization and is thus preferable to use, and the glycidyl ether reduces the viscosity of the cation curable resin composition, has the effect in coating, and is thus preferable to use. It is more preferable to use the cycloaliphatic epoxy compound and oxetane compound together, and it is further preferable to use the cycloaliphatic epoxy compound and oxetane compound together in the range of weight ratio of 99:1 to 51:49 thereof.

As specific examples of the cation curable monomers are as described below. Examples of the cycloaliphatic epoxy compounds are 3',4'-epoxycyclohexane carboxylic acid-3,4-epoxycyclohexylmethyl, 3',4'-epoxy-6'-methylcyclohexane carboxylic acid-3,4-epoxy-6'-cyclohexylmethyl, vinyl cyclohexane monoxide-1,2-epoxy-4-vinylcyclohexane, and 2-(3,4-epoxycyclohexyl)ethyltrimethoxysilane.

Examples of glycidyl ethers are bisphenol A glycidyl ether, bisphenol F glycidyl ether, hydrogenated-bisphenol A glycidyl ether, hydrogenated-bisphenol F glycidyl ether, 1,4-butanediol glycidyl ether, 1,6-hexanediol glycidyl ether, trimethylolpropane triglycidyl ether, glycidyl methacrylate, 3-glycidyloxy propyl trimethoxy silane, 3-glycidyloxy propyl ethyl diethoxy silane, and 3-glycidyloxy propyl triethoxy silane.

Examples of the oxetane compounds are 3-ethyl-3-(phenoxymethyl)oxetane, di[1-ethyl(3-oxetanyl)]methyl ether, 3-ethyl-3-allyl-oxy methyl oxetane, 3-ethyl-3-(2-ethylhexyloxymethyl) oxetane, and 3-ethyl-3-{[3-(triethoxysilyl)propoxy]methyl}oxetane.

Examples of the vinyl ethers are 2-hydroxybutyl vinyl ether, diethylene glycol monovinyl ether, 2-hydroxybutyl vinyl ether, 4-hydroxybutyl vinyl ether, triethyleneglycol divinyl ether, cyclohexanedimethanol divinyl ether, and 1,4-butanediol divinyl ether.

The photoacid generator is not particularly as long as the generator generates photoacid by light irradiation. For example, there are aromatic onium salts such as sulfonium salts and iodonium Salts. Examples of the photoacid generators are sulfonium hexafluoroantimonate, benzyltriphenylphosphonium hexafluorophosphate, benzylpyridinium hexafluorophosphate, diphenyliodonium hexafluorophosphate, triphenylsulfonium hexafluorophosphate, benzoin tosylate, ADEKA OPTOMER sp-170 (made by ADEKA CORPORATION) ADEKA OPTOMER sp-172 (made by ADEKA CORPORATION), WPAG-145 (made by Wake Pure Chemical Industries Co., Ltd.), WPAG-170 (made by Wake Pure Chemical Industries Co., Ltd.), WPAG-199 (made by Wake Pure Chemical Industries Co., Ltd.), WPAG-281 (made by Wake Pure Chemical Industries Co., Ltd.), WPAG-336 (made by Wako Pure Chemical Industries Co., Ltd.), WPAG-367 (made by Wake Pure Chemical Industries Co., Ltd.), CPI-100P (made by San-Apro Ltd.), CPI-101A (made by San-Apro Ltd.), CPI-200K (made by San-Apro Ltd.), CPI-210S (made by San-Apro Ltd.), DTS-102 (made by Midori Kagaku Co., Ltd.), TPS-TF (made by Toyo Gosei Co., Ltd.) and DTBPI-PFBS (made by Toyo Gosei Co., Ltd.).

(Materials or the Transparent Dielectric Layer)

As shown in FIG. 21, the transparent dielectric layer 72 may be provided on the surface of the substrate for optics according to this Embodiment.

The refractive index of the transparent dielectric layer 72 preferably ranges from 1.7 to 2.4. By this means, using the substrate for optics 71 (1, 1a), it is possible to more effectively extract the emitted light which is made the waveguide mode inside the organic EL light emitting device and confined inside the light emitting device. Particularly, it is preferable flat the refractive index of the material constituting the transparent dielectric layer 72 is substantially equal to the refractive index of the material constituting a layer layered on the surface 73 in the interface between the surface 73 on the side opposite to the fine-structure layer 12 (12a) in the transparent dielectric layer 72 and the layer layered the surface 73. Particularly, when the layer layered on the surface 73 is a transparent conductive film, the film develops the function as a light emitting device, and is preferable. From the foregoing, the refractive index of the transparent dielectric layer 72 is capable of being selected as appropriate within the above-mentioned range corresponding to characteristics of the used light emitting device.

The material constituting the transparent dielectric layer 72 may include fluctuations (phase separation) of the density. Particularly, in the case where the density fluctuations of 50 nm to 800 nm exist, it is possible to exert the scattering effect inside the transparent dielectric layer 72, and such a case is preferable. It is possible to achieve the fluctuations of the density by phase separation of the material constituting the transparent dielectric layer 72, addition of fine particles and/or filler to the material constituting the transparent dielectric layer 72, or the like. Further, when the fluctuations of the density are measured as the refractive index, the case where the density fluctuations exits such that the refractive index decreases from the surface side (surface 73 side) on the side opposite to the fine structure of the transparent dielectric layer 72 to the fine structure surface side, in addition to the above-mentioned effects, possible to more suppress reflection of the light in the interface between the transparent dielectric layer and the light emitting device formed on the transparent dielectric layer, and therefore, such a case is preferable. As the fluctuation of the density, for example, there is the fine-particle (filler) concentration gradient of fine particles or filler.

The material constituting the transparent dielectric layer 72 is not limited particularly, as long as the above-mentioned refractive index range is met. It is possible to use various publicly-known resins (organic products), inorganic precursors, inorganic condensation products, metal oxide fillers, metal oxide fine particles and the like. From the viewpoints of meeting the above-mentioned refractive index range, flattening the surface 73 on the side opposite to the fine-structure layer 12b (12a), and environmental resistance of the substrate for optics 71 (1,1a), the material constituting the transparent dielectric layer 72 is preferably inorganic precursors, inorganic condensation products, inorganic precursors or inorganic condensation products and metal fillers, organic-inorganic hybrids comprised of inorganic precursors or inorganic condensation products and organic substances, or organic-inorganic hybrids comprised of inorganic precursors or inorganic condensation products, metal fillers and organic substances. Particularly, in the case where the material constituting the transparent dielectric layer contains at least one species of metal element selected from the group consisting of In, Sn, Ti, Zr, Zn and Mg, the adjustment to meet the range of refractive index is easy, and therefore, such a case is preferable.

It is preferable that the material constituting the transparent dielectric layer 72 is optically transparent also after heat treatment. Herein, the heat treatment temperature is preferably 150° C. or more, and more preferably 200° C. or more. The heat time is preferably 10 minutes or more. Further, the heat atmosphere is preferably in a low-oxygen environment (for example, vacuum state, nitrogen substitution state or the like).

In addition, from the viewpoints of refractive index adjustments and environmental resistance, it is particularly preferable that the organic substance contained in the organic-inorganic hybrid material contains a thermopolymerizable resin, thermoplastic resin, or both or either of a photopolymerizable group allowing photopolymerization and a polymerizable group allowing thermopolymerization. Further, it is preferable to have a portion that forms hydrogen bonds with at least one inorganic substance selected from among the inorganic precursor, inorganic condensation product, and inorganic filler.

For example, the inorganic substance contained in the material constituting the transparent dielectric layer is capable of containing the sol-gel material. By containing the sol-gel material, it is possible to adjust the refractive index with ease in the above-mentioned range, it is also possible to suppress deterioration of the fine-structure layer 12 (12a) in the case of using the substrate for optics 71 (1, 1a) according to this Embodiment as an organic EL light emitting device, and therefore, it is preferable containing the sol-gel material. The material constituting the fine-structure layer 12 (12a) is capable of containing the sol-gel material as described above, and may be comprised of only the sol-gel material, may contain metal oxide fine particles (filler) in the sol-gel material, or may be comprised of an organic-inorganic hybrid material of the sol-gel material and an organic resin.

Further, as the sol-gel material, as well as monomers and dimers, it is also possible to use a partially cured product (prepolymer). It is possible to obtain a prepolymer such that metal species are joined via oxygen atoms by the fact that the sol-gel material, particularly metal alkoxide is partially condensed. In other words, it is possible to fabricate a prepolymer with a large molecular weight by partially condensing. By this means, the number of unreacted functional groups is decreased to make a high density. Therefore, it is possible to change the refractive index to a higher direction. Further, by partial condensation, the viscosity increases as the unreacted functional groups are decreased, the number of functional groups to react with water vapor or the like is decreased, and stability is thereby improved. Furthermore, flatness is improved on the surface 73 on the side opposite to the fine-structure layer 12 (12a) of the transparent dielectric layer 72.

The sol-gel material is a compound group such that hydrolytic polycondensation proceeds by action of heat and catalyst and are cured. Examples thereof are metal alkoxides (metal alcoholates), silsesquioxane compounds, metal chelate compounds, metal halides, silane halides, liquid glass, spin-on glass, silane coupling agents, reactants thereof, and these compounds or reactants with a catalyst to promote curing contained. Corresponding to required physical properties, the compounds or reactants may be used alone, or in combination of a plurality of kinds. Further, siloxane materials including silicone, reaction inhibitor and the like may be contained in the sol-gel material.

From the viewpoint of adjusting the refractive index highly and the viewpoint of flatness of the surface the sol-gel material as the material constituting the transparent dielectric layer 72 preferably contains a metal alkoxide having a metal species M1 (in addition, M1 is at least one kind of metal element selected from the group consisting of In, Sn, Ti, Zr, Zn, and Mg). Further, the material may contain at least two kinds of metal alkoxides of the metal alkoxide having the metal species M1 and a metal alkoxide having a metal species Si. By containing the metal alkoxide having the metal species M1, it is possible to adjust the refractive index. On the other hand, by containing the metal alkoxide having the metal species Si, stability of the material constituting the transparent dielectric layer 72 is improved with respect to water vapor. It is possible to use the metal alkoxide having the metal species M1 as two components or more, or use the metal alkoxide having tae metal species Si as two components or more. Furthermore, as well as the metal alkoxide the metal species M1 and the metal alkoxide having the metal species Si, it is also possible to use a metal alkoxide having a metal species M2 (in addition, M2≠M1 and M2≠Si). Similarly, it is also possible to use a metal oxide having a metal species M3 (in addition, M3≠M2, M3≠M1 and M3≠Si).

Examples of combinations of metal species of two kinds of metal alkoxides with different metal species are Si and Ti, Si and Zr, Si and Zn, Si and Sn, Si and In, Si and Mg, Ti and Zr, Ti and Zn, Ti and Mg, In and Sn, Zn and Mg, Zn and Zr, and Zn and Sn. Particularly, in the case of containing two kinds of metal alkoxides with different metal species where the metal species of one of the metal alkoxides is Si, a ratio CM1/CSi, between molar concentration (CSi) of the metal alkoxide having Si as the metal species and molar concentration (CM1) the metal alkoxide having the metal species M1 except Si, preferably ranges from 0.2 to 15. From the viewpoint of formability of the fine-structure layer 12, CM1 CSi preferably ranges from 0.5 to 15, and more preferably ranges from 5 to 8. As combinations of metal species of three kinds of metal alkoxides with different metal species, examples thereof are Si, Ti and Zn, Si, Ti and Mg, Si, Ti and Zr, Si, Ti and In, Si, Ti and Sn, Si, Zr and Zn, Si, Zr and In, Si, Zr and Mg, Si, In and Sn, Si, Zn and Sn, Ti, Zn and Zr, Ti, Zn and Mg, and Zn, Mg and Zr.

By varying the ratio between the molar concentration (CM1) of the metal alkoxide having the metal species M1 and the molar concentration (CSi) of the metal alkoxide having the metal species Si, it is possible to change the atomic distance, and as a result, it is possible to change the refractive index. The ratio between CM1 and CSi is capable of being selected within the range of meeting 0.2≤CM1/CSi≤25, and it is thereby possible to change the refractive index flexibly. Herein, the molar concentration (CSi) of the metal alkoxide having the metal species Si means the entire concentration of the metal alkoxide having the metal species Si contained in the material constituting the transparent dielectric layer 72.

On the other hand, the molar concentration (CM1) of the metal alkoxide having the metal species M1 means the total of molar concentrations of all metal alkoxides having the metal species except the metal alkoxide having the metal species Si contained in the material constituting the transparent dielectric layer 72. For example, when metal alkoxides having metal species Ti, metal species Zr and metal species Mg exist in molar concentrations of CTi, CZr and CMg, respectively, CM1 is CTi+CZr+CMg.

As the metal species M1, M1 is preferably at least one kind selected from the group consisting of In, Sn, Ti, Zr, Zn and Mg, from the viewpoint of variability of the refractive index. The metal species of the metal alkoxide to use may be selected from the viewpoints of handling and layer configuration of the light emitting device.

Further, the material constituting the transparent dielectric layer may contain a binder polymer, reactive diluent and polymerization initiator. By containing these substances, the bonding property is improved in using a top-emission type light emitting device as shown in FIG. 22. As the binder polymer, it is possible to use binder resins described as one material constituting the fine-structure layer 12 (12*a*). As the reactive diluent, it is possible to use the photopolymerizable radical polymerization-system resin, photopolymerizable cation polymerization-system resin, or mixtures thereof described as one material constituting the fine-structure layer 12 (12*a*). As the polymerization initiator, it is possible to use the photoinitiator or photoacid generator described as one material constituting the fine-structure layer 12 (12*a*).

In the substrate for optics 1 (1*a*) according to this Embodiment, since the size of the fine concavo-convex structure is the nanoscale, it is possible to flatten the interface between the transparent dielectric layer 72 and the transparent conductive film layer with ease in preparing the organic EL light emitting device using the substrate for optics 1 (1*a*).

The substrate for optics 1 (1*a*) of the present invention may be provided with a barrier layer in an interface position between the substrate 11 (11*a*) and the fine-structure layer 12 (12*a*) or on the surface on the side opposite to the fine-structure layer 12 (12*a*) of the substrate 11 (11*a*). By providing the barrier layer, reliability of the organic EL light emitting device is improved in applying the substrate for optics 1 (1*a*) of the invention to the organic EL light emitting device, and therefore, the provision is preferable. It is possible to form the barrier layer, for example, using inorganic oxides and inorganic nitrides such as silicon oxide and silicon nitride, diamond-like carbon (DLC) or the like. It is more preferable that the barrier layer is multi-layer. In order to exert sufficient gas barrier properties, the thickness of the gas barrier layer is 5 nm or more, more preferably 10 nm or more, and further preferably 50 nm or more. On the other hand, when the thickness is too thick, defects arise such that a crack occurs in the gas barrier layer, and therefore, the thickness of the gas barrier layer is preferably 10 μm or less, and further, 1 μm or less.

(Light Diffusion Substrate)

Further, in the organic EL light emitting device using the substrate for optics 1 (1*a*) according to this Embodiment, alight diffusion substrate may be disposed. It is possible to form the light diffusion substrate using a sheet (in the shape of a plate) having the light diffusion function or a film having the light diffusion function. More specifically, as the light diffusion substrate, it is possible to use a sheet or film with a light diffusion material dispersed therein, a sheet or film with a structure having light diffusion properties formed on the surface thereof, a combination of the diffusion material and the structure having light diffusion properties and the like. It is possible to apply from the substrates with consideration given to directivity of a wavelength to apply in the light emitting device and the like.

As one example of light diffusion substrates with the light diffusion material dispersed in the sheet or film, it is possible to apply OPALUS made by KEIWA Inc. As one example of light diffusion substrates with the structure having light diffusion properties formed on the sheet or film surface, it is possible to apply LIGHT SHAPING DIFFUSER made by Luminit, LLC.

As the sheet or film constituting the light diffusion substrate, it is possible to use glass, resin and the like, and in terms of good processability, light weight and the like, it is preferable using a resin. Further, as the light diffusion material, it is possible to use low refractive index materials such as air and high refractive index materials such as titanium oxide.

Since light extraction efficiency increases by reducing interface reflection of the light diffusion substrate, it is preferable to bond the sheet or film having the light diffusion capability using a pressure sensitive adhesive or adhesive. Further, also from the viewpoint of gas barrier properties, it is preferable to make a configuration without an air layer being provided by bonding the sheet or film having the light diffusion capability using a pressure sensitive adhesive or adhesive.

Described next is a manufacturing method of the substrate for optics 1 (1*a*) of the present invention. In addition, the manufacturing method as shown below is one example, and the manufacturing method of the substrate for optics 1 (1*a*) is not limited thereto.

It is possible to prepare the substrate for optics 1 (1*a*) according to this Embodiment by nanoimprint, EB lithography, photolithography, interference exposure and the like.

Figure 23:
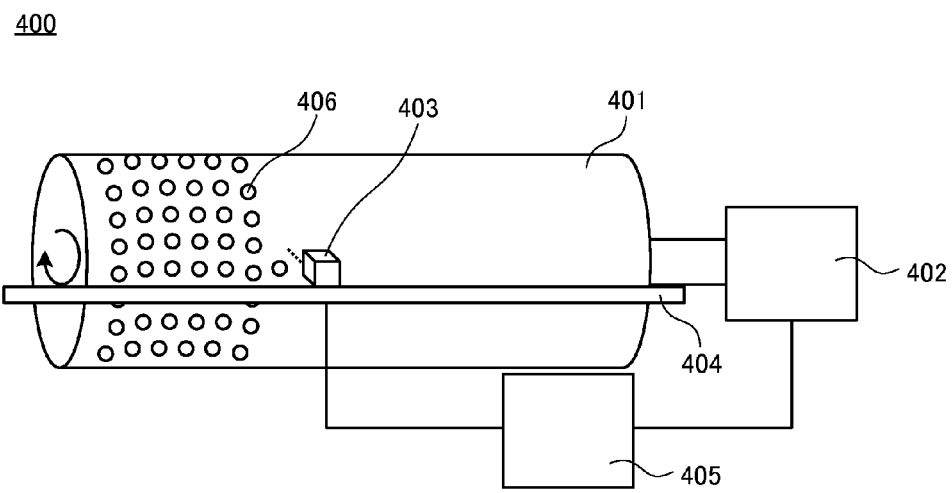
FIG. 23 is an explanatory view showing an example of a manufacturing method of the substrate for optics of the invention.

FIG. 23 is an explanatory view showing one example of the manufacturing method of the substrate for optics. As shown in FIG. 23, an exposure apparatus 400 grasps a roll-shaped member 401 coated with a resist layer with a roll grasp portion not shown, and is provided with a rotation control section 402, processing head portion 403, shift mechanism section 404, and exposure control section 405. The rotation control section 402 rotates the roll-shaped member 401 on the center of the roll-shaped member 401 as the axis. The processing head portion 403 applies laser light to expose the resist layer of the roll-shaped member 401. The shift mechanism section 404 shifts the processing head portion 403 at a control velocity along the long-axis direction of the roll-shaped member 401. The exposure control section 405 controls pulse signals of laser exposure by the processing head portion 403, based on a reference signal synchronized with rotation of the roll-shaped member 401 by the rotation control section 402.

Processing of the roll-shaped member 401 with the exposure apparatus 400 is performed by applying a pulse laser from the processing head portion 403, while rotating the roll-shaped member 401. The processing head portion 403 shifts along the long-axis direction of the roll-shaped member 401 by the shift mechanism 404, while applying the pulse laser. A pattern 406 is recorded at arbitrary pitches on the resist layer of the outer periphery of the roll-shaped member 401 in the rotation direction, from the number of revolutions of the roll-shaped member 401 and the frequency of the pulse laser. This is the pitch Py in the D1 direction in the roll-to-roll nanoimprint mold.

Further, since the scan is made along the long-axis direction of the roll-shaped member 401, when the roll-shaped member 401 rotates once from an arbitrary position, the processing head portion 403 is shifted in the long-axis direction. This is the pitch Px in the D2 direction in the roll-to-roll nanoimprint mold. As compared with the circumference length of the roll-shaped member 401, the pitches Py and Px of the pattern 406 are of the order of nanometers and are thus extremely small, and therefore, it is possible to form the line-shaped pattern with the shift amount in the D1 direction differing viewed in the long-axis direction, while maintaining the pitch Py in the D1 direction. Furthermore, as described above, since the pitches Py and Py of the pattern 406 are extremely small as compared with the circumference length of the roll-shaped member 401, the D1 direction and the D2 direction are substantially orthogonal.

The roll-shaped member 401 is obtained by providing the member formed in the shape of a cylinder with the rotating shaft, and as the materials, it is possible to apply a metal, carbon core, glass, quartz and the like. The roll-shaped member 401 needs processing precision permitting high rotation, and therefore, preferable as the materials are a metal, carbon core and the like. Further, it is possible to coat only the cylindrical surface portion undergoing laser exposure with a different material. Particularly, when a heat-reactive resist is used, in order to enhance the heat insulation effect, it is preferable to apply materials with lower thermal conductivity than that of metal, and examples thereof are glass, quartz, oxides, nitrides and the like. It is also possible to use the layer with which the cylindrical surface is coated as an etching layer to etch with a resist layer described later as a mask.

The resist to coat the roll-shaped member 401 is not limited particularly, as long as the resist is exposed to laser light, and it is possible to apply photocurable resists, light-amplification type resists, heat-reactive resists and the like. Particularly, heat-reactive resists allow pattern formation with wavelengths smaller than the wavelength of laser light, and are preferable.

As the heat-reactive resists, organic resists or inorganic resists are preferable. The resist layer formed from these resists may be a single-layer structure, or multi-layer structure obtained by combining a plurality of resist layers. In addition, it is possible to change the resist to select as appropriate according to the process, required processing precision and the like. For example, organic resists allow coating with a roll coater or the like in forming a resist layer to coat the roll-shaped member 401, and the process is thereby easy. In addition, the viscosity of the resist is limited because of coating onto a sleeve, and it is difficult to obtain coating thickness accuracy and control or multi-layer coating.

As the organic resists, as described in "Latest Resist Material Handbook" published by Johokiko Co., Ltd. and "Photo-polymer Handbook", Kogyo Chosakai Publishing Co., Ltd., examples thereof are novolac resins, mixtures of novolac resins and diazonaphthoquinone, methacrylate-based resins, polystyrene-based resins, polyethylene-based resins, phenol-based resins, polyimide-based resins, polyamide-based resins, silicone resins, polyester-based resins, epoxy-based resins, melamine-based resins, and vinyl-based resins.

Meanwhile, the inorganic resists are suitable for providing the resist layer to coat the roll-shaped member 401 by the resistance heating evaporation method, electron-beam sputtering method, vapor-phase method such as the CVD method or the like. Since these methods are basically of vacuum process, although the number of steps is required to form on the sleeve, it is possible to control the film thickness with accuracy, and it is easy to layer in multi-layer.

It is possible to select various inorganic resist materials corresponding to the reaction temperature. For example, among the inorganic resist materials are Al, Si, P, Ni, Cu, Zn, Ga, Ge, As, Se, In, Sn, Sb, Te, Pb, Bi, Ag, Au and their alloys. Further, as the inorganic resist materials, oxides, nitrides, nitrogen oxides, carbides, sulphides, sulfates, fluorides, and chlorides of Mg, Al, Si, Ca, Ti, V, Cr, Mn, Fe, Co, Ni, Cu, Zn, Ga, Ge, As, Se, Sr, Y, Zr, Nb, Mo, Pd, Ag, In, Sn, Sb, Te, Ba, Hf, Ta, W, Pt, Au, Pb, Bi, La, Ce, Sm, Gd, Tb and Dy, and mixtures of such compounds may be applied.

When the heat-reactive resist material is used as the resist to coat the roll-shaped member 401, preliminary heating for treating the resist at a temperature lower than in pattern formation may be performed before exposure for forming the pattern as described below. By applying preliminary heating, it is possible to improve pattern resolution in pattern formation. Although the mechanism that pattern resolution is improved by preliminary heating is specifically unknown, it is assumed that when the change of the material constituting the resist layer by heat energy of the heat-reactive resist material is based on a plurality of reactions, by finishing reactions except reactions in pattern formation in advance, the pattern formation reaction is simplified, and that pattern resolution is improved.

The method of preliminarily heating the resist to coat the roll-shaped member 401 is not limited particularly, and among the methods are a method of heating the entire roll-shaped member, another method of scanning the entire roll surface with lower output than in patterning the roll-shaped member 401 with laser to irradiate the resist with heat energy, and the like.

When the heat-reactive resist is used as the resist to coat the roll-shaped member 401, in the case of exposing with a pulse signal that is phase-modulated based on a reference signal synchronized with rotation described later, the diameter of each of dots forming the pattern increases or decreases corresponding to the pitch Py and/or pitch Px, and the heat-reactive resist is thus preferable. In the case of using the heat-reactive resist, although an explicit mechanism that the diameter of the dot increases/decreases corresponding to the pitch is unknown, the mechanism is assumed as described below.

In the case of a heat-reactive resist, a change occurs in the material constituting the resist layer by heat energy of a laser applied to an application portion, and a pattern is formed by etching characteristics changing. At this point, all of applied heat is not used in the change of the resist layer, and a part thereof is stored and transferred to an adjacent area. Therefore, heat energy in the adjacent area is provided with heat-transfer energy from the adjacent area in addition to application energy. In pattern formation of nano-order, a contribution of this heat-transfer energy is not neglected, a contribution of heat-transfer is inversely proportional to the distance between dots forming the pattern, and as a result, the obtained pattern diameter undergoes the effect of the distance between adjacent dots.

Herein, when the distance between dots changes by phase modulation, the contribution of heat-transfer energy as described above varies for each dot. When the distance between dots is wide, the contribution of heat-transfer energy is small, and the dot diameter decreases. When the distance between dots is narrow, the contribution of heat-transfer energy is large, and the dot diameter increases.

Further, when a heat-reactive resist is used as the resist to coat the roll-shaped member 401, the etching layer described later is provided, and the processing depth of the pattern is controlled, as in the same manner as described previously, in the case of exposing with a pulse signal that is phase-modulated based on a reference signal synchronized with rotation, the height of each of dots forming the pattern increases or decreases corresponding to the pitch Py and/or pitch Px, and such a case is thus preferable. In the case of using the heat-reactive resist and etching layer together, although a mechanism that the height of the dot increases/decreases corresponding to the pitch Px is unknown, it is possible to explain from the fact that the dot diameter increases/decreases corresponding to the distance between dots as described above.

In other words, in patterning of nano-order, the etching depth increases or decreases corresponding to the dot diameter, and there is a tendency that the etching depth is deep when the dot diameter is wide, and that the etching depth is shallow when the dot diameter is narrow. Particularly, this tendency is remarkable when the etching technique is dry etching. It is conceivable this is because exchange of an etchant or removal of etching products is not carried out promptly.

As described previously, in using the heat-reactive resist, the dot diameter is small when the distance between dots is wide, while the dot diameter is large when the distance between dots is narrow. Since there is the tendency that the etching depth increases or decreases corresponding to the dot diameter, as a result, the dot depth is shallow when the distance between dots is large, while the dot depth is deep when the distance between dots is narrow.

The effects of increases/decreases in the distance between dots, dot diameter and dot depth as described above are remarkable when the average pitch is small. It is presumed this is because the above-mentioned effect of heat-transfer energy is larger.

In the present invention, it is possible to use the resist layer for coating the roll-shaped member 401 to apply as the roll-to-roll nanoimprint mold without modification, or it is possible to form a pattern by etching the surface substrate of the roll-shaped member 401 using the resist layer as a mask.

By providing the etching layer on the roll-shaped member 401, it is possible to control the processing depth of the pattern freely, and to select a film thickness the most suitable for processing as the thickness of the heat-reactive resist layer. In other words, by controlling the thickness of the etching layer, it is possible to control the processing depth freely. Further, it is possible to control the processing depth with the etching layer, and therefore, a film thickness easy to expose and develop may be selected for the heat-reactive resist layer.

The wavelength of a laser used in the processing head portion 403 to perform exposure preferably ranges from 150 nm to 550 nm. Further, in terms of miniaturization of wavelength and easiness of availability, it is preferable to use a semiconductor laser. The wavelength of the semiconductor laser preferably ranges from 150 nm to 550 nm. This is because when the wavelength is shorter than 150 nm, output of the laser is small, and it is difficult to expose the resist layer with which the roll-shaped member 401 is coated. On the other hand, this is because when the wavelength is longer than 550 nm, it is not possible to make the spot diameter of the laser 500 nm or less, and it is difficult to form a small exposed portion.

On the other hand, to form an exposed portion with a small spot size, it is preferable to use a gas laser as the laser used in the processing head portion 403. Particularly, in gas lasers of XeF, XeCl, KrF, ArF, and F2, the wavelengths are 351 nm, 308 nm, 248 nm, 193 nm and 157 nm and thus short, it is thereby possible to focus light on an extremely small spot size, and therefore, such lasers are preferable.

Further, as the laser used in the processing head portion 403, it is possible to use a second harmonic, third harmonic and fourth harmonic of a Nd:YAG laser. The wavelengths of the second harmonic, third harmonic and fourth harmonic of the Nd:YAG laser are respectively 532 nm, 355 nm, and 266 nm, and are allowed to obtain a small spot size.

In the case of forming a fine pattern in the resist layer provided on the surface of the roll-shaped member 401 by exposure, rotation position accuracy of the roll-shaped member 401 is significantly high, and manufacturing is made ease by first adjusting the optical system of the laser so that the member surface is in the focus depth. However, it is very difficult to hold roll dimension accuracy and rotation accuracy adapted to nanoimprint. Therefore, it is preferable that the laser used in exposure is concentrated with an objective lens and is set for autofocus so that the surface of the roll-shaped member 401 always exists in the focus depth.

The rotation control section 402 is not limited particularly, as long as the section is an apparatus having the function of rotating the roll-shaped member 401 on the center of the roll as the axis, and for example, a spindle motor or the like is suitable.

As the shift mechanism section 404 that shifts the processing head portion 403 in the long-axis direction of the roll-shaped member 401, the section 404 is not limited particularly, as long as the section is able to shift the processing head portion 403 at a controlled velocity, and suitable examples are a linear servo motor and the like.

In the exposure apparatus 400 as shown in FIG. 23, in the exposure pattern formed on the surface of the roll-shaped member 401, the position of exposed portion is controlled by exposure control section 405 according to a pulse signal phase-modulated based on a reference signal that is synchronized with rotation (for example, rotation of spindle motor) of the rotation control section 402. As the reference signal, it is possible to use an output pulse from an encoder synchronized with rotation of the spindle motor.

For example, it is possible to control the pulse signal that is phase-modulated based on the reference signal synchronized with rotation as described below.

Figure 24A:
FIG. 24 contains explanatory diagrams to explain an example for setting a reference pulse signal and modulated pulse signal using, as a reference signal, an Z-phase signal of a spindle motor in the manufacturing method of the substrate for optics of the invention.
Figure 24B:
Figure 24C:

The relationship among a Z-phase signal of the spindle motor, reference pulse signal and modulated pulse signal will be described with reference to FIGS. 24A to 24C. Using the Z-phase signal as the reference, a pulse signal with the frequency m times (integer of m>2) that of the signal is a reference pulse signal, and a pulse signal with the frequency n times (integer of m/n>k and k>1) that of the signal is a modulated pulse signal. Each of the reference pulse signal and the modulated pulse signal is an integral multiple of the frequency of the Z-phase signal, and therefore, the integral pulse signal exists during the time the roll-shaped member 401 rotates once on the center axis.

Subsequently, the relationship among the reference pulse signal, modulated pulse signal and phase-modulated pulse signal will be described with reference to FIG. 25. When the phase of the reference pulse signal is increased or decreased periodically with the wavelength of the modulated pulse signal, the signal is the phase-modulated pulse signal. For example, when a reference pulse frequency fY0 is expressed by following equation (8) and a modulation frequency fYL is expressed by following equation (9), the frequency-modulated modulated pulse signal fY is expressed by following equation (10).

$$fY0 = A\sin(\omega 0 t + \phi 0) \quad (8)$$

$$fYL = B\sin(\omega 1 t + \phi 1) \quad (9)$$

$$fY = A\sin(\omega 0 t + \phi 0 + C\sin(\omega 1 t)) \quad (10)$$

Further, as expressed by following equation (11), it is also possible to obtain a phase-modulated pulse signal fY' by adding a sine wave obtained from the modulated pulse signal to the reference pulse frequency fY0.

$$fY' = fY0 + C'\sin(t \cdot fYL/fY0 \times 2\pi) \quad (11)$$

Furthermore, by adding a sine wave obtained from the wavelength LYL of the modulated pulse signal to the pulse wavelength LY0 of the reference pulse, it is possible to obtain the wavelength LY of the phase-modulated pulse signal.

Figure 25:
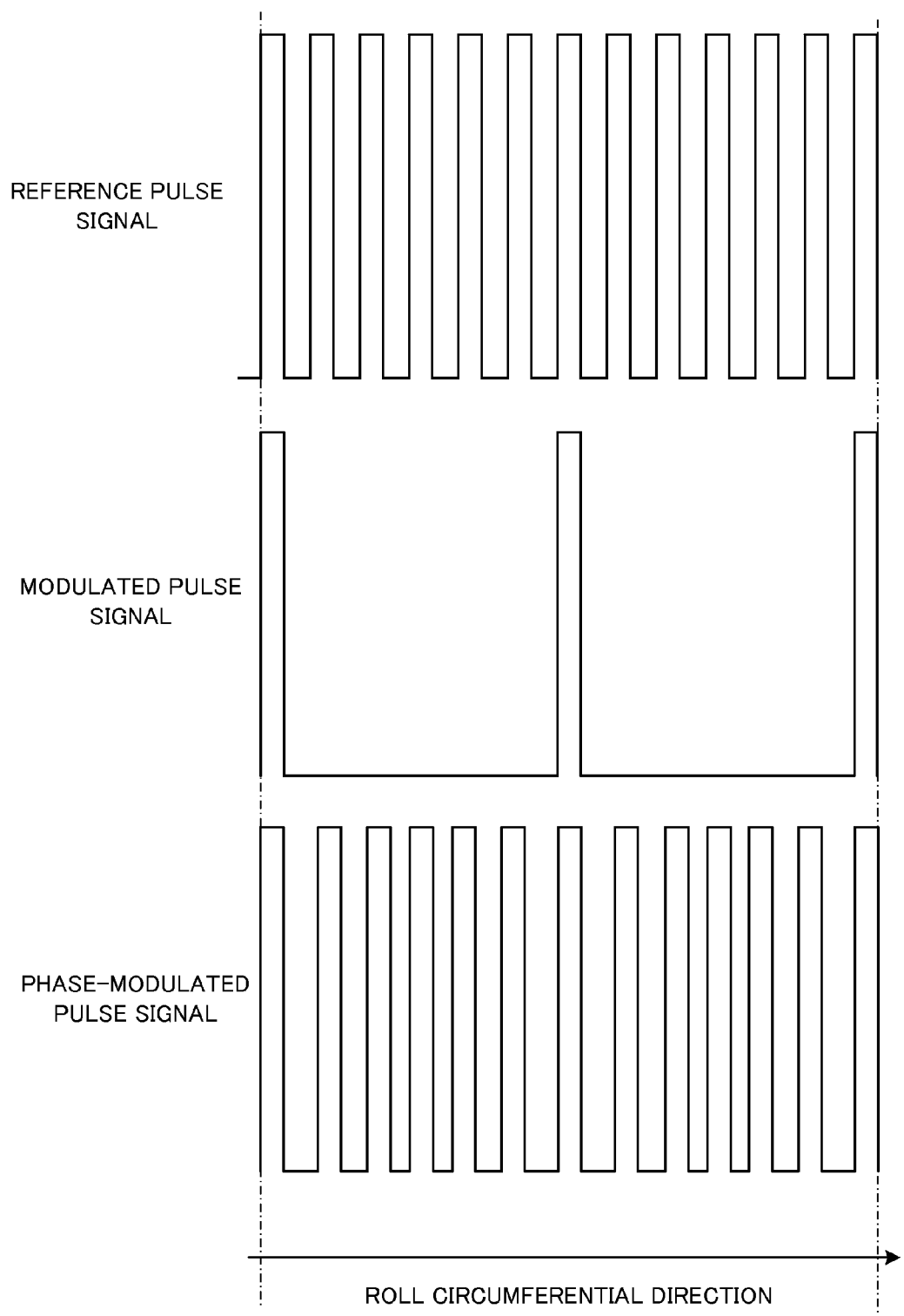
FIG. 25 is an explanatory diagram to explain an example for setting a phase-modulated pulse signal from the reference pulse signal and modulated pulse signal in the manufacturing method of the substrate for optics of the invention.

As shown in FIG. 25, the obtained phase-modulated pulse signal is a signal such that the pulse interval of the reference pulse signal increases and decreases corresponding to the signal interval of the modulated pulse signal.

Figure 26:
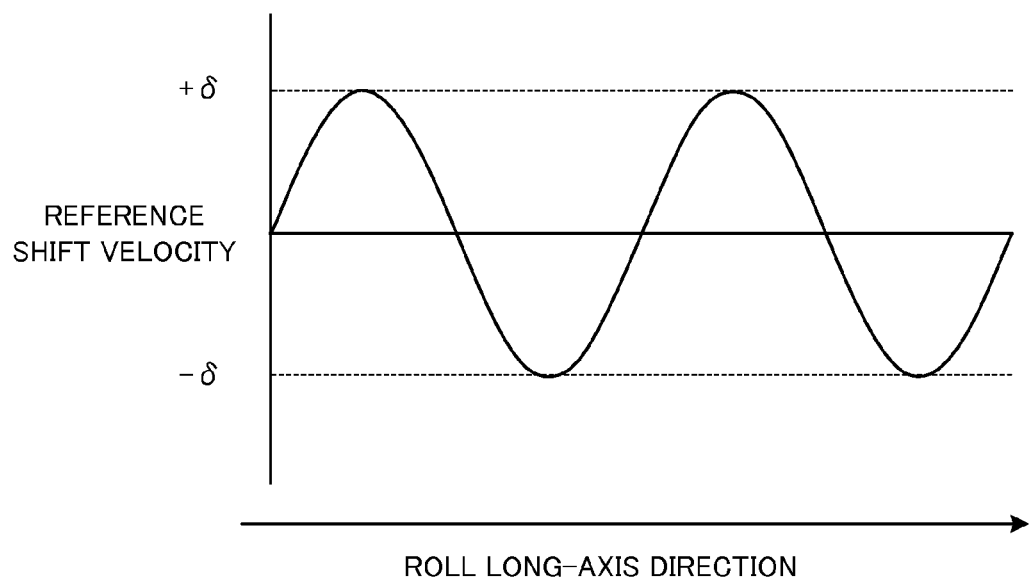
FIG. 26 is an explanatory view to explain an example of a shift velocity of a processing head portion to apply laser light in the manufacturing method of the substrate for optics of the invention.

Further, in the exposure apparatus 400, it may be configured to control a pulse signal of laser exposure by the processing head portion 403 using a reference pulse signal with a certain frequency instead of the phase-modulated pulse signal, and to increase or decrease periodically the shift velocity of the processing head portion 403 by the shift mechanism section 404. In this case, for example, as shown in FIG. 26, the shift velocity of the processing head portion 403 is periodically increased or decreased. The shift velocity as shown in FIG. 26 is an example of the shift velocity of reference shift velocity±σ. The shift velocity is preferably synchronized with rotation of the roll-shaped member 401, and for example, is controlled so that the velocity in the Z-phase signal is the velocity as shown in FIG. 26.

The above-mentioned description is of the case where the pattern 406 is control led by periodical phase modulation, and it is also possible to form the pattern 406 by random phase modulation that is not periodical. For example, in the D1 direction, the pitch Py is inversely proportional to the pulse frequency. Therefore, when random frequency modulation is performed on the pulse frequency so that the maximum phase deviation is 1/10, the pitch Py has a maximum variable 61 that is 1/10 the pitch Py, and it is possible to obtain a pattern in which the pitch Py increases and decreases randomly.

For the control frequency of the reference signal synchronized with rotation, the modulated pulse signal may be controlled by the reference signal with a frequency of a plurality of times such as each one roll rotation, or may be controlled only by the initial reference signal set at the exposure initial time. In the case of controlling only by the initial reference signal, when modulation occurs in the number of revolutions of the rotation control section 402, phase modulation occurs in the exposure pulse signal. This is because of rotation control of nano-order, and therefore, even in a minute potential variation of the rotation control section 402, a pitch variation of nano-order occurs and is accumulated. In the case of a pattern pitch with a pitch of 500 nm, when the roll outer circumferential length is 250 mm, laser exposure is performed 500,000 times, and only a deviation of 1 nm for every 10,000 times results in a deviation of 50 nm.

Figure 11:
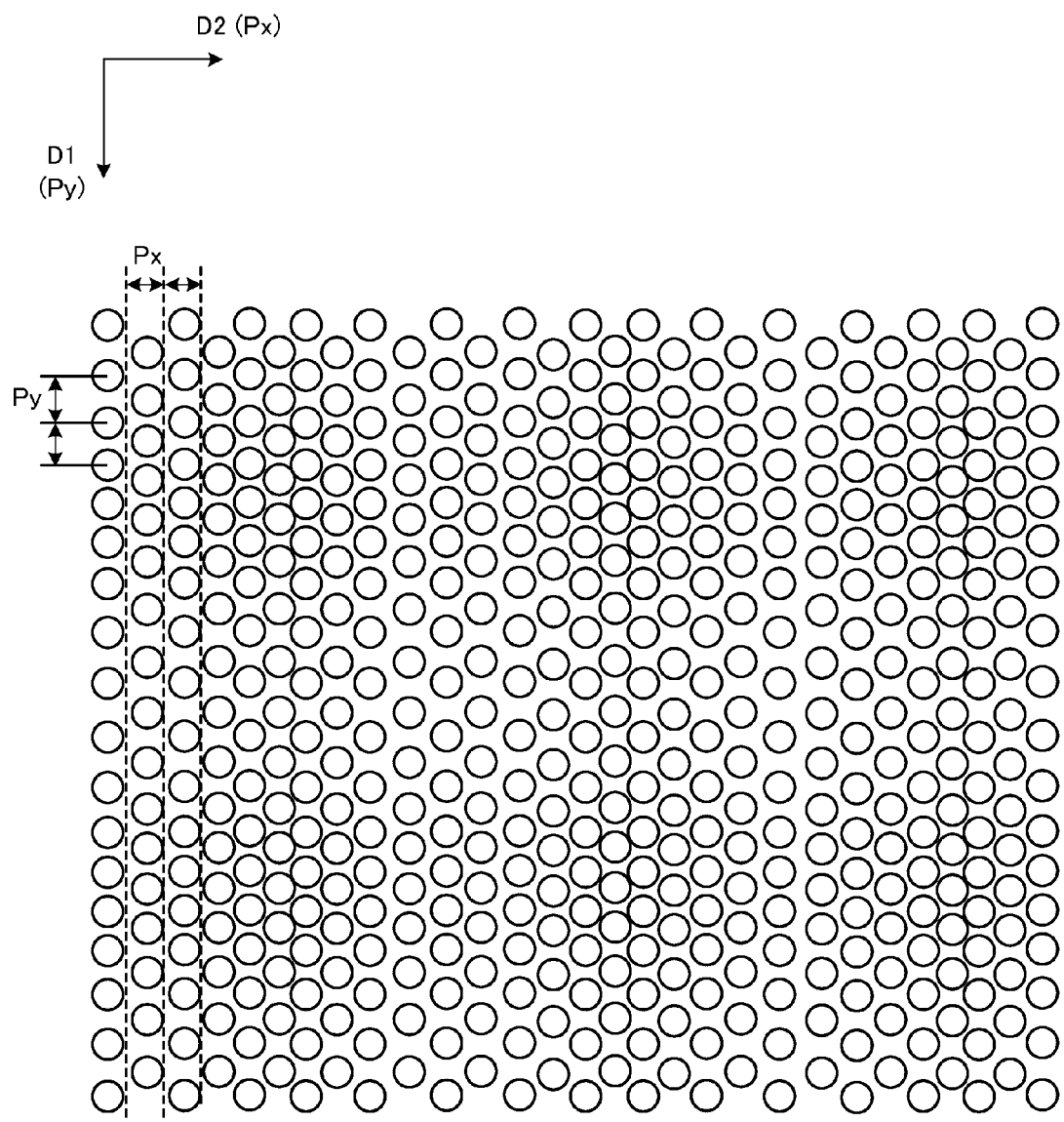
FIG. 11 is a schematic diagram showing still another example of the arrangement of a plurality of dots in the substrate for optics according to Embodiment 1.
Figure 12:
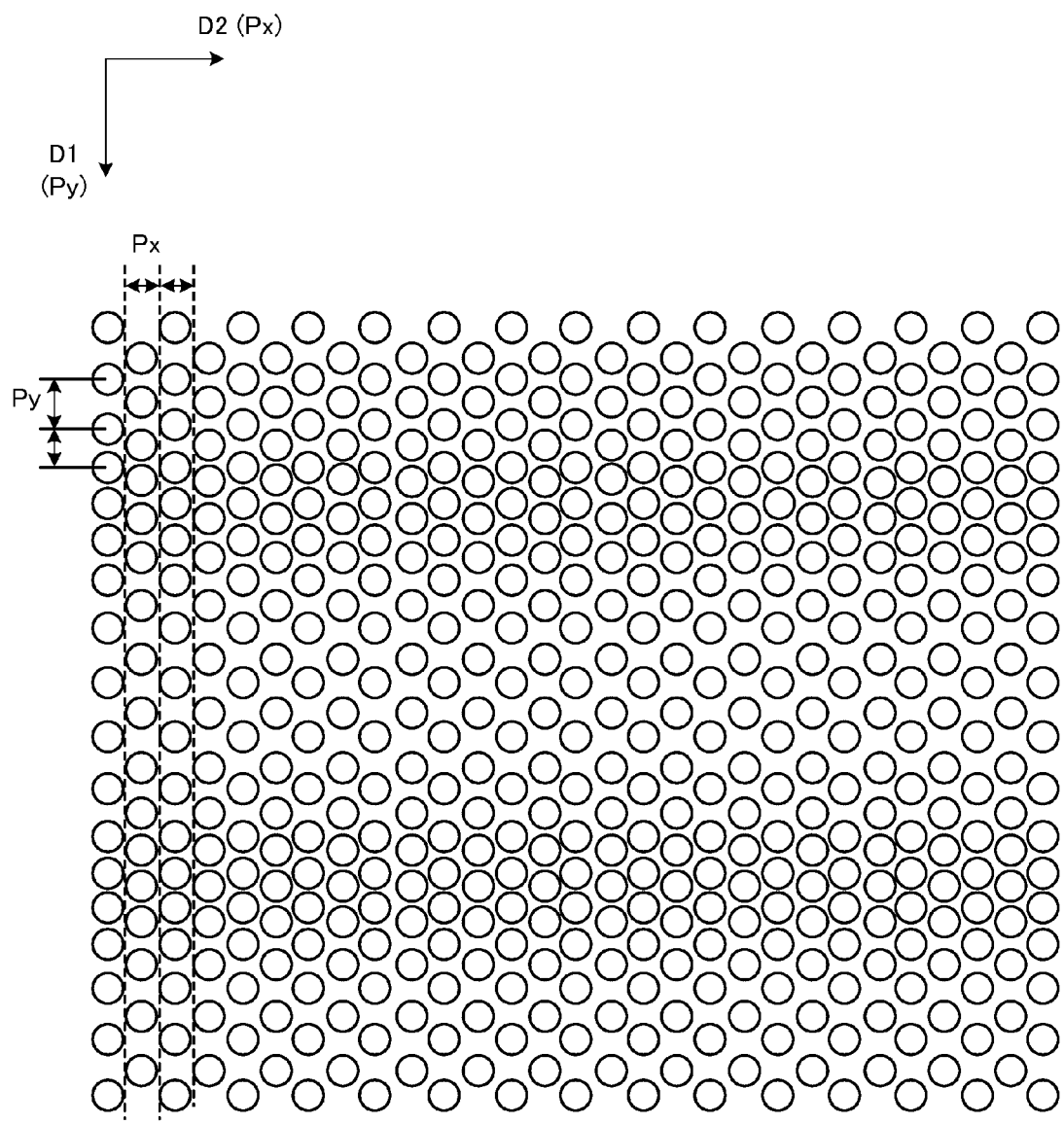
FIG. 12 is a schematic diagram showing still another example of the arrangement of a plurality of dots in the substrate for optics according to Embodiment 1.
Figure 13:
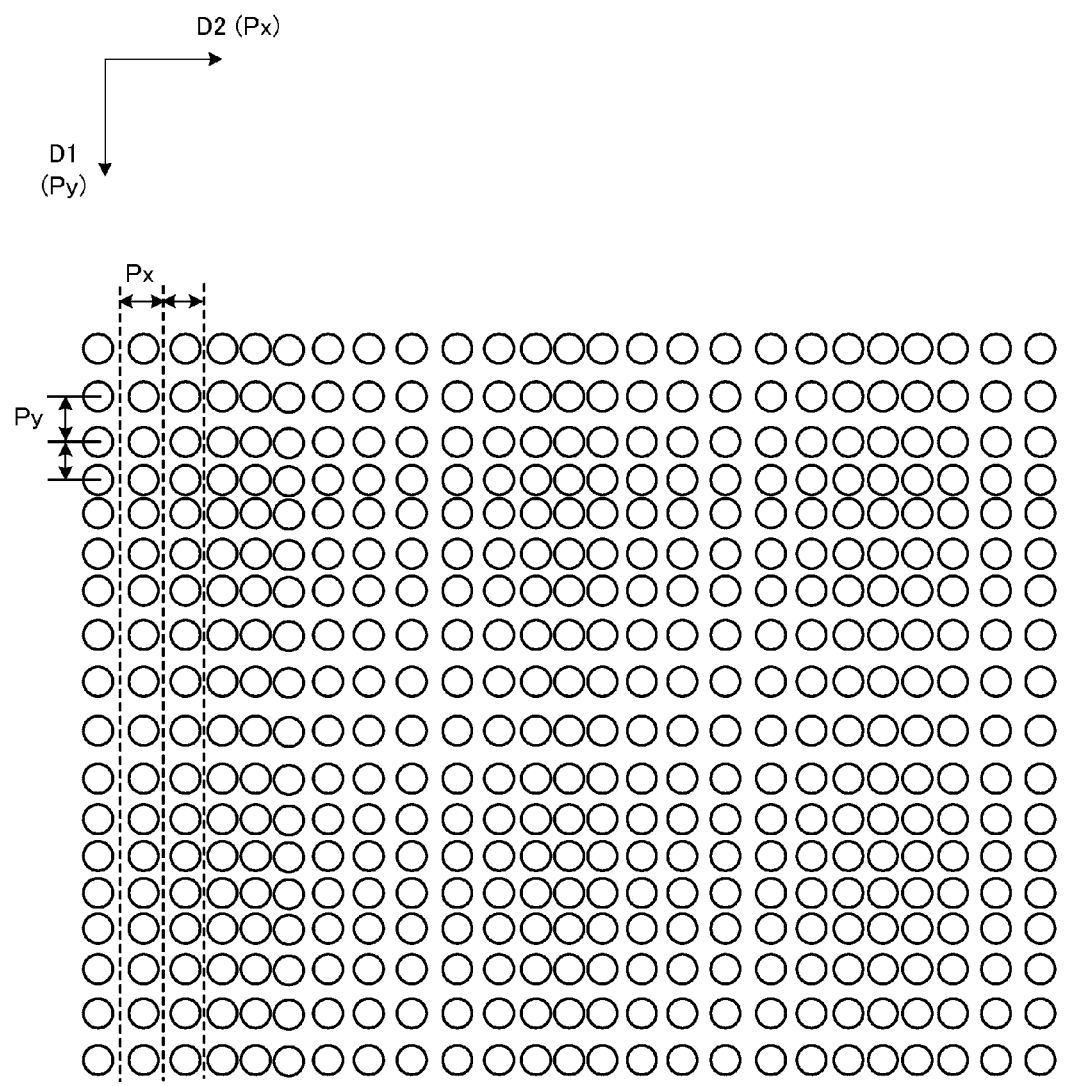
FIG. 13 is a schematic diagram showing still another example of the arrangement of a plurality of dots in the substrate for optics according to Embodiment 1.
Figure 14:
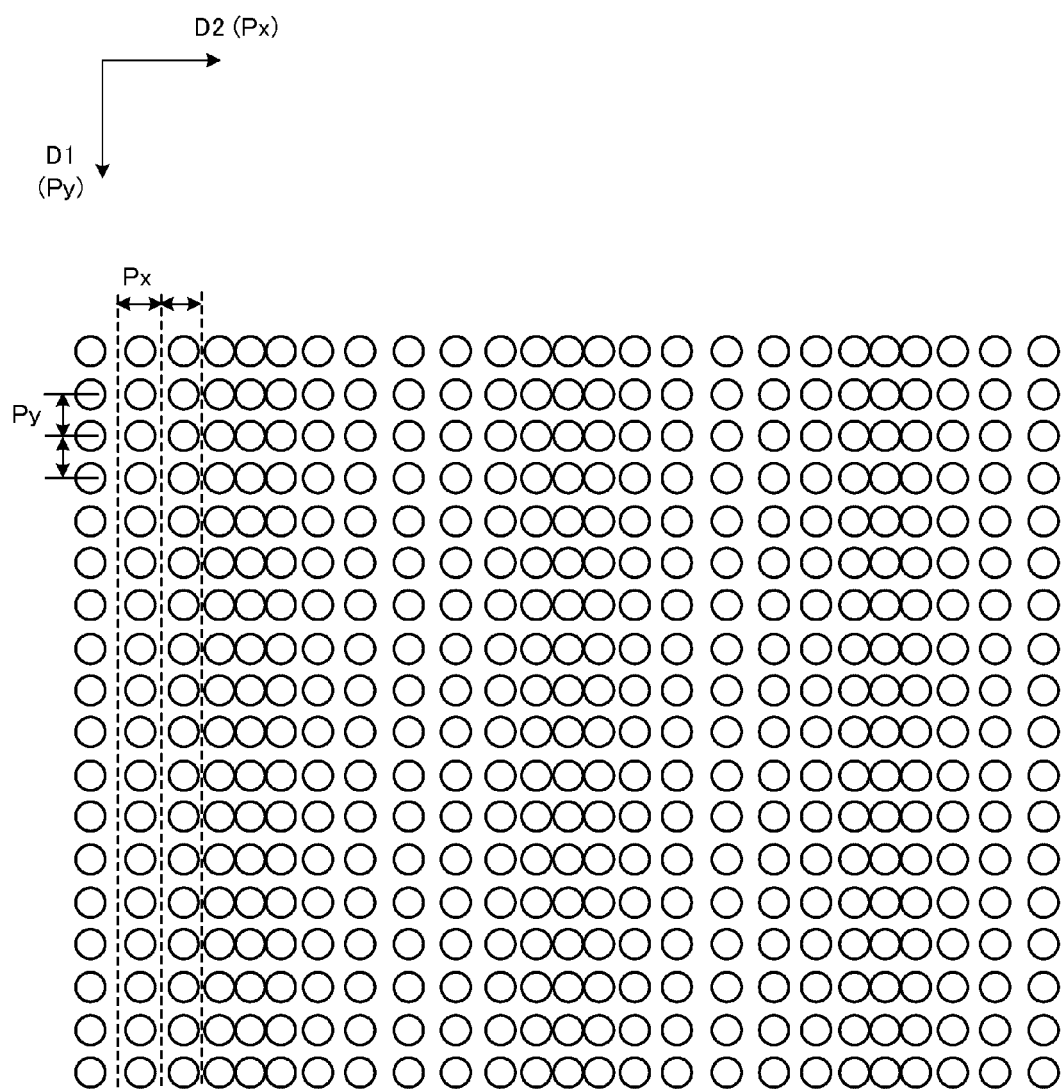
FIG. 14 is a schematic diagram showing still another example of the arrangement of a plurality of dots in the substrate for optics according to Embodiment 1.

Also in the same pitch and same long period, by adjusting the control frequency of the reference signal, it is possible to prepare the fine structure with the arrangement as shown in FIG. 9 or 11. In the case of forming the fine structure with the arrangement as shown in FIG. 9, the control frequency of the reference signal is decreased. Meanwhile, in the case of forming the fine structure with the arrangement as shown in FIG. 11, the control frequency of the reference signal is increased. Therefore, in the arrangement as shown in FIG. 11, the phases (positions) in the second direction of corresponding dots are matched, and in the arrangement as shown in FIG. 9, deviations occur in the phases (positions) in the second direction of corresponding dots. The relationship between the arrangements as shown in FIGS. 10 and 12 is the same.

Further, from the same reason, also when each of the pitch Py in the first direction and the pitch Px in the second direction is an equal pitch, as in the substrate for optics 60 according to Embodiment 2 as shown in FIG. 18, the shift amount α1 in the D1 direction between the first dot line 62-1 and the second dot line 62-2 adjacent to each other in the D2 direction and the shift amount α2 between the second dot line 62-2 and the third dot line 62-3 adjacent to the second dot line 62-2 are provided to be different from each other, and a difference between the shift amount α1 and the shift amount α2 is not constant.

According to this configuration, pitches P1 to P3 among a plurality of dots 61 in the slanting direction inside the main surface of the substrate body are irregular, periodicity of the repetition pattern is thereby reduced, and the light scattering properties due to the concavo-convex structure are more enhanced.

The roll-shaped member 401 with the resist layer provided on the surface exposed by the exposure apparatus 400 is developed, and the etching layer is etched by dry etching using the developed resist layer as a mask. After etching, by removing the residual resist layer, it is possible to obtain a roll-to-roll nanoimprint mold.

As a method of transferring the pattern 406 obtained as described above to a predetermined substrate and obtaining the substrate for optics according to this Embodiment, the method is not limited particularly. For example, a pattern is transferred to the surface of a predetermined substrate by the nanoimprint lithography method, the substrate is etched by dry etching using the transferred pattern portion as a mask, and it is thereby possible to transfer the pattern 406 to the substrate. More specifically, the roll-shaped member 401 with the pattern 406 formed is used as a cylindrical mold (roll-to-roll nanoimprint mold). A resist layer comprised of organic materials is formed on the frontside of the substrate, the cylindrical mold is pressed against the resist layer, the pattern 406 is transferred to the resist layer, then the resist layer and substrate are etched from the frontside to form the fine concavo-convex structure on the frontside of the substrate, and it is possible to obtain the substrate for optics of this Embodiment.

Further, instead of directly transferring the pattern 406 to the substrate from the cylindrical mold (roll-shaped member 401), there is another method of transferring the pattern 406 once to a film, forming a resin mold, then forming the pattern on a substrate by the nanoimprint lithography method using this resin mold, and obtaining the substrate for optics according to this Embodiment. According to this method, it is possible to increase usage efficiency of the mold, and absorb flatness of the substrate, and therefore, as the method of transferring the pattern to the substrate, the nanoimprint lithography method using the resin mold is more preferable.

The method of transferring the pattern 406 from the cylindrical mold to the resin mold is not limited particularly, and for example, it is possible to apply a direct nanoimprint method. As the direct nano imprint method, there are a thermal nanoimprint method of filling the pattern 406 of the cylindrical mold with a thermosetting resin while heating at a predetermined temperature, cooling the cylindrical mold, and then, releasing the cured thermosetting resin to transfer, and a photo-nanoimprint method of irradiating a photocurable resin filled in the pattern 406 of the cylindrical mold with light of a predetermined wavelength, curing the photocurable resin, and then, releasing the cured photocurable resin from the cylindrical mold to transfer.

The cylindrical mold (roll-shaped member 401) is a seamless cylindrical mold, and therefore, is particularly suitable for successively transferring to resin molds by roll-to-roll nanoimprint.

Further, there is a method of preparing an electrocasting mold from a resin mold with the pattern 406 transferred thereto by electrocasting, and forming the pattern by the nanoimprint lithography method using this electrocasting mold. In the case of forming an electrocasting mold, such a case is preferable in terms of extending life of the cylindrical mold that is an original mold, and also in a scheme of once forming an electrocasting mold, since it is possible to absorb flatness of the substrate, a method of further forming a resin mold is preferable.

Furthermore, in the resin mold method, repetition transfer is easy, and the method is preferable. Herein, "repetition transfer" means either or both of (1) of manufacturing a plurality of concavo-convex pattern transfer materials inversely transferred from the resin mold (+) having the concavo-convex pattern, and (2) of, in the case of particularly using a curable resin composition as a transfer agent, obtaining a transfer material (−) inverted from the resin mold (+), next using the transfer material (−) as a resin mold (−) to obtain an inversely transferred transfer material (+) and performing repetition pattern inversion transfer of convexo-concave/concavo-convex/convexo-concave/concavo-convex/ . . . /.

By transferring the pattern 406 obtained as described above to the substrate, it is possible to obtain the substrate for optics 1 (1a) according to this Embodiment. The transfer method is not limited particularly, and for example, there are a method of transferring a pattern to the substrate surface with a resin by the nanoimprint lithography method, etching the substrate by dry etching using the transferred pattern portion as a mask, and obtaining the substrate for optics 1 (1a) provided with the pattern 406, another method of transferring an inversed structure of the pattern 406 to the substrate surface by the nanoimprint method, and the like.

(Plate-Shaped Substrate for Optics 1 (1a))
<Method (1)>

A plate-shaped mold is prepared from the cylindrical mold by any one of the methods as described above. Subsequently, using the plate-shaped mold as a mold, the pattern 406 is transferred to the raw material of the fine-structure layer 12 (12a), and it is thereby possible to obtain the plate-shaped substrate for optics 1 (1a).

For example, in the case of using a photocurable resin, it is possible to obtain the plate-shaped substrate for optics 1 (1a) by the following steps (11) to (14).

(11) A photocurable resin is deposited on the pattern 406 of the plate-shaped mold by a method such as cast, spin coat method and inkjet method. Alternatively, a photocurable resin is deposited on an inorganic substrate such as a glass plate and a glass film or transparent heat-resistant resin (transparent polyimide or the like) by a method such as cast, spin coat method and inkjet method.

(12) The photocurable resin is nipped by the substrate and the plate-shaped mold.

(13) Light is applied from the plate-shaped mold side or at least one side of the substrate to cure the photocurable resin.

(14) The substrate and the plate-shaped mold are peeled off.

In addition, before the step (11), it is preferable to perform mold release treatment on the pattern 406 surface of the plate-shaped mold. Further, in order to improve adhesion to the photocurable resin, the substrate used in the step (12) may undergo easy adhesion coating (silane coupling treatment or the like), primer treatment, corona treatment, plasma treatment, UV/ozone treatment, high energy ray irradiation treatment, surface roughening treatment, porous-making treatment or the like for chemical bonds with the photocurable resin and physical bonds such as penetration. Furthermore, light irradiation in the step (13) may be performed in an environment of low oxygen. A cover film may be disposed on the pattern surface of the obtained substrate for optics 1 (1a).

In the case of using a thermosetting resin typified by PDMS, it is possible to obtain the plate-shaped substrate for optics 1 (1a) by the following steps (21) to (24).

(21) A thermosetting resin is deposited on the pattern 406 of the plate-shaped mold by a method such as cast, a spin coat method and inkjet method.

(22) The thermosetting resin undergoes leveling to be uniform.

(23) A solvent is removed in an environment of heating, while curing the thermosetting resin.

(24) The thermosetting resin and the plate-shaped mold are peeled off.

In addition, before the step (21), it is preferable to perform mold release treatment on the pattern 406 surface of the plate-shaped mold. Further, the obtained substrate for optics 1 (1a) may be laminated onto another substrate. A cover film may be disposed on the pattern surface of the obtained substrate for optics 1 (1a).

In the case of using a thermoplastic resin, it is possible to obtain the plate-shaped substrate for optics 1 (1a) by the following steps (31) to (34).

(31) A thermoplastic resin is nipped between the plate-shaped mold and a pressing plate.

(32) Pressure is applied at a temperature of Tg of the thermoplastic resin or more.

(33) Cool to temperatures lower than Tg.
(34) The thermoplastic resin and the plate-shaped mold are peeled off.

In addition, before the step (31), it is preferable to perform mold release treatment on the pattern 406 surface of the plate-shaped mold. Further, at the time of the step (31), heating may be performed on at least one of the plate-shaped mold and the pressing plate. Furthermore, in heating in the step (32), heating may be performed from at least one of the plate-shaped mold and the pressing plate, and it is preferable to heat at least the plate-shaped mold side. Still furthermore, the obtained substrate for optics 1 (1*a*) may be laminated onto another substrate. A cover film may be disposed on the pattern surface of the obtained substrate for optics 1 (1*a*).

In the case of using inorganic precursors typified by metal alkoxide, it is possible to obtain the plate-shaped substrate for optics 1 (1*a*) by the following steps (41) to (45).
(41) Inorganic precursors are deposited on the pattern 406 of the plate-shaped mold by a method such as cast, spin coat method and inkjet method. Alternatively, inorganic precursors are deposited on a substrate comprised of PDMS and resin by a method such as cast, spin coat method and inkjet method.
(42) Promote condensation of the inorganic precursors.
(43) The inorganic precursors are nipped by the substrate and the plate-shaped mold.
(44) Condensation is more promoted to cure the inorganic precursors.
(45) The substrate and the plate-shaped mold are peeled off.

In addition, it is also possible to obtain the plate-shaped substrate for optics 1 (1*a*) by peeling off the cured material of inorganic precursors and the plate-shaped mold in the step (45), without performing coating on the substrate comprised of PDMS and resin in the step (41) to omit the step (43).

In addition, before the step (41), it is preferable to perform mold release treatment on the pattern 406 surface of the plate-shaped mold. In order to improve adhesion to the inorganic precursors, the substrate used in the step (41) may undergo easy adhesion coating (silane coupling treatment or the like), primer treatment, corona treatment, plasma treatment, UV/ozone treatment, high energy ray irradiation treatment, surface roughening treatment, porous-making treatment or the like for chemical bonds with the inorganic precursors and physical bonds such as penetration. A cover film may be disposed on the pattern surface of the obtained substrate for optics 1 (1*a*).

<Method (2)>

A plate-shaped mold is prepared from the cylindrical mold. Subsequently, using the plate-shaped mold as a mold, the pattern 406 is transferred to a photocurable resin, thermosetting resin, inorganic precursors, or thermoplastic resin, residual film treatment is performed, a substrate is processed using the obtained pattern as a mask, and it is thereby possible to obtain the plate-shaped substrate for optics 1 (1*a*).

For example, in the case of using a photocurable resin, it is possible to obtain the plate-shaped substrate for optics 1 (1*a*) by the following steps (51) to (56).
(51) A photocurable resin is deposited on the pattern 406 of the plate-shaped mold by a method such as cast, spin coat method and inkjet method. Alternatively, a photocurable resin is deposited on an inorganic substrate such as a glass plate and a glass film or transparent heat-resistant resin (transparent polyimide or the like) by a method such as cast, spin coat method and inkjet method.
(52) The photocurable resin is nipped by the substrate and the plate-shaped mold and is pressed.
(53) Light is applied from the plate-shaped mold side or at least one side of the substrate to cure the photocurable resin.
(54) The substrate and the plate-shaped mold are peeled off.
(55) A residual film of the pattern that is transferred and formed on the substrate is removed.
(56) The substrate is etched using the obtained pattern as a mask.

In addition, before the step (51), it is preferable to perform mold release treatment on the pattern 406 surface of the plate-shaped mold. In order to improve adhesion to the photocurable resin, the substrate used in the step (52) may undergo easy adhesion coating (silane coupling treatment or the like), primer treatment, corona treatment, plasma treatment, UV/ozone treatment, high energy ray irradiation treatment, surface roughening treatment, porous-making treatment or the like for chemical bonds with the photocurable resin and physical bonds such as penetration.

Further, light irradiation in the step (53) may be performed in an environment of low oxygen. Furthermore, the residual film treatment in the step (55) may be performed by dry etching or wet etching, and from the viewpoint of suppressing undercut, dry etching is preferable. Still furthermore, an etching step of removing a residual of the photocurable resin may be added after the step (56). A cover film may be disposed on the pattern surface of the obtained substrate for optics 1 (1*a*).

Further, in the similar method, by using a thermosetting resin or inorganic precursors as a transfer material, it is also possible to obtain the substrate for optics according to this Embodiment. A cover film may be disposed on the pattern surface of the obtained substrate for optics 1 (1*a*).

<Method (3)>

A plate-shaped mold is prepared from the cylindrical mold. Subsequently, using the plate-shaped mold as a mold, the pattern 406 is transferred to a photocurable resin, thermosetting resin, inorganic precursors, or thermoplastic resin to obtain a mold (G1) provided with the pattern 406-inverted structure. It is possible to obtain the plate-shaped substrate for optics 1 (1*a*) using the obtained mold (G1) as a template by transferring the pattern again to the raw material of the fine-structure layer 12 (12*a*) or by electrocasting typified by Ni.

For the mold (G1), it is possible to use the substrate for optics 1 (1*a*) obtained in the method (1).

For example, in the case of using a photocurable resin, it is possible to obtain the plate-shaped substrate for optics 1 (1*a*) by the following steps (61) to (64).
(61) A photocurable resin is deposited on the pattern 406 of the mold (G1) by a method such as cast, spin coat method and inkjet method. Alternatively, a photocurable resin is deposited on an inorganic substrate such as a glass plate and a glass film or transparent heat-resistant resin (transparent polyimide or the like) by a method such as cast, spin coat method and inkjet method.
(62) The photocurable resin is nipped by the substrate and the mold (G1).
(63) Light is applied from the mold (G1) side or at least one side of the substrate to cure the photocurable resin.
(64) The substrate and the mold (G1) are peeled off.

Before the step (61), it is preferable to perform mold release treatment on the pattern 406 surface of the mold (G1). Alternatively, it is preferable that the material constituting the pattern of the mold (G1) is comprised of a fluorine-containing resin, resin containing methyl groups, silicone typified by PDMS, or mixed materials thereof. Further, before performing the mold release treatment, a layer comprised of a metal, metal oxide, or metal and metal oxide may be formed on the pattern surface of the mold (G1).

Moreover, in order to improve adhesion to the photocurable resin, the substrate used in the step (62) may undergo easy adhesion coating (silane coupling treatment or the like), primer treatment, corona treatment, plasma treatment, UV/ozone treatment, high energy ray irradiation treatment, surface roughening treatment, porous-making treatment or the like for chemical bonds with the photocurable resin and physical bonds such as penetration. Further, light irradiation in the step (63) may be performed in an environment of low oxygen.

In the case of using an inorganic substrate with low flexibility as the substrate used in the step (61), it is preferable that the mold (G1) has a configuration with flexibility, and in the case of using a film substrate with high flexibility as the substrate used in the step (61), it is possible to use both a configuration with low flexibility and a configuration with high flexibility as the mold (G1). A cover film may be disposed on the pattern surface of the obtained substrate for optics 1 (1a).

In the case of using a thermosetting resin typified by PDMS, it is possible to obtain the plate-shaped substrate for optics 1 (1a) by the following steps (71) to (74).
(71) A thermosetting resin is deposited on a pattern 33 of the mold (G1) by a method such as case, spin coat method, inkjet method.
(72) The thermosetting resin undergoes leveling to be uniform.
(73) A solvent is removed in an environment of heating, while curing the thermosetting resin.
(74) The thermosetting resin and the mold (G1) are peeled off.

In addition, before the step (71), it is preferable to perform mold release treatment on the pattern 406 surface of the mold (G1). Further, the obtained substrate for optics 1 (1a) may be laminated onto another substrate. As the mold (G1), it is preferable to select a mold having a configuration that is not changed at a heat curing temperature. A cover film may be disposed on the pattern surface of the obtained substrate for optics 1 (1a).

In the case of using a thermoplastic resin, it is possible to obtain the plate-shaped substrate for optics 1 (1a) by the following steps (81) to (84).
(81) A thermoplastic resin is nipped between the mold (G1) and a pressing plate.
(82) Pressure is applied at a temperature of Tg of the thermoplastic resin or more.
(83) Cool to temperatures lower than Tg.
(84) The thermoplastic resin and the mold (G1) are peeled off.

Before the step (81), it is preferable to perform mold release treatment on the pattern 406 surface of the mold (G1). Further, at the time of the step (81), heating may be performed on at least one of the mold (G1) and the pressing plate. Furthermore, in heating in the step (82), heating may be performed from at least one of the mold (G1) and the pressing plate, and it is preferable to heat at least the mold (G1) side. Still furthermore, the obtained substrate for optics 1 (1a) may be laminated onto another substrate. As the mold (G1), it is preferable to select a mold having a configuration that is not changed at a heating temperature used in the step (82). A cover film may be disposed on the pattern surface of the obtained substrate for optics 1 (1a).

In the case of using inorganic precursors typified by metal alkoxide, it is possible to obtain the plate-shaped substrate for optics 1 (1a) by the following steps (91) to (95).
(91) Inorganic precursors are deposited on the pattern 406 of the mold (G1) by a method such as cast, spin coat method and inkjet method. Alternatively, inorganic precursors are deposited on a substrate comprised of PDMS and resin by a method such as cast, spin coat method and inkjet method.
(92) Promote condensation of the inorganic precursors.
(93) The inorganic precursors are nipped by the substrate and the mold (G1).
(94) Condensation is more promoted to cure the inorganic precursors.
(95) The substrate and the mold (G1) are peeled off.

In addition, it is also possible to obtain the plate-shaped substrate for optics 1 (1a) by peeling off the cured material of inorganic precursors and the mold (G1) in the step (95), without performing coating on the substrate comprised of PDMS and resin in the step (91) to omit the step (93).

Before the step (91), it is preferable to perform mold release treatment on the pattern 406 surface of the mold (G1). In order to improve adhesion to the inorganic precursors, the substrate used in the step (91) may undergo easy adhesion coating (silane coupling treatment or the like), primer treatment, corona treatment, plasma treatment, UV/ozone treatment, high energy ray irradiation treatment, surface roughening treatment, porous-making treatment or the like for chemical bonds with the inorganic precursors and physical bonds such as penetration.

It is also possible to obtain the substrate for optics 1 (1a) by performing the residual film treatment as in (2) on the substrate for optics 1 (1a) obtained by using a photocurable resin, thermosetting resin or inorganic precursors, and next processing the substrate by dry etching. A cover film may be disposed on the pattern surface of the obtained substrate for optics 1 (1a).

<Method (4)>

A plate-shaped mold is prepared from the cylindrical mold. Subsequently, using the plate-shaped mold as a mold, the pattern 406 is transferred to a photocurable resin, thermosetting resin, inorganic precursors, or thermoplastic resin to obtain the mold (G1) provided with the pattern 406-inverted structure. A mold (G2) provided with the same structure as the pattern 406 is obtained using the obtained mold (G1) as a template by transferring the pattern again to a photocurable resin, thermosetting resin, inorganic precursors, or thermoplastic resin or by electrocasting typified by Ni. It is possible to obtain the plate-shaped substrate for optics 1 (1a) using the obtained mold (G2) as a template by transferring the pattern again to the raw material of the fine-structure layer 12 (12a) or by electrocasting typified by Ni.

It is possible to obtain the mold G(1) by the method (3). Further, for the mold (G2), it is possible to use the substrate for optics 1 (1a) obtained in the method (3). It is possible to prepare the plate-shaped substrate for optics 1 (1) by reading the mold (G1) with the mold G(2) in the method (3).

In addition, when the pattern of the mold G(1) is comprised of the photocurable resin (G1) and the pattern of the mold (G2) is also comprised of the photocurable resin (G2), it is preferable that both of the photocurable resins (G1, G2) are fluorine-containing photocurable resins. By being fluorine-containing photocurable resins, it is possible to cause segregation of fluorine components to the pattern portion surface of the photocurable resin (G1). By this means, the mold (G1) has mold release properties of the pattern portion and is capable of ensuring adhesion to the substrate, and it is thereby possible to obtain the mold (G2) with excellence. In such a mold (G1) or mold (G2), it is preferable that the fluorine element concentration (Es) in the surface portion is higher than the average fluorine element concentration (Eb) in the resin forming the pattern.

In the case where the ratio (Es/Eb) between the average fluorine element concentration (Eb) in the resin layer forming the mold (G1) and/or mold (G2) and the fluorine element concentration (Es) in the fine pattern surface portion of the resin layer forming the mold (G1) and/or mold (G2) meets 1≤Es/Eb≤30000, the above-mentioned effect is more exerted, and therefore, such a case is more preferable. Particularly, the ranges of from 3≤Es/Eb≤1500 to 10≤Es/Eb≤100 further improve mold release properties, and are preferable.

In addition, in the range of 20≤Es/Eb≤200 within the aforementioned widest range (1<Es/Eb≤30000), the fluorine element concentration (Es) in the resin layer surface portion forming the mold (G1) and/or mold (G2) is sufficiently higher than the average fluorine element concentration (Eb) in the resin layer, free energy on the surface of the mold (G1) and/or mold (G2) decreases effectively, and mold release properties from the transfer material resin and the materials constituting the substrate for optics are thereby improved. Further, by lowering the average fluorine element concentration (Eb) in the resin layer forming the mold (G1) and/or mold (G2) relative to the fluorine element concentration (Es) in the resin layer surface portion forming the mold (G1) and/or mold (G2), the strength of the resin itself is improved, while free energy can be kept high near the substrate, and therefore, adhesion to the substrate is improved.

By this means, it is possible to obtain the mold (G1) and/or mold (G2) which is excellent in adhesion to the substrate, excellent in mold release properties from the transfer material and the materials constituting the substrate for optics 1 (1a), and which enables the concave-convex shape of the nanometer size to be transferred repeatedly from resin to resin, and therefore, such a range is particularly preferable. Further, in the range of 26≤Es/Eb≤189, it is possible to further lower free energy on the resin layer surface forming the mold (G1) and/or mold (G2), repetition transfer properties are excellent, and therefore, the range is preferable. Furthermore, in the range of 30≤Es/Eb≤160, it is possible to maintain the strength of the resin while decreasing free energy on the resin layer surface forming the mold (G1) and/or mold (G2), repetition transfer properties are further improved, the range is thereby preferable, and the range of 31≤Es/Eb≤155 is more preferable. The range of 46≤Es/Eb≤155 enables the aforementioned effects to be further exerted, and is preferable.

For example, the pattern surface side area of the resin layer forming the mold (G1) and/or mold (G2) means an intrusion portion of approximately 1% to 10% in the thickness direction or an intrusion portion of 2 nm to 20 nm in the thickness direction, from the pattern surface side surface of the resin layer forming the mold (G1) and/or mold (G2) toward the substrate side.

In addition, it is possible to quantify the fluorine element concentration (Es) in the pattern surface side area of the resin layer forming the mold (G1) and/or mold (G2) by an XPS method. The penetration length of X-rays of the XPS method is several nanometers, thus shallow, and therefore, is suitable for quantifying the Es value. As another analysis method, it is also possible to calculate Es/Eb using energy dispersive X-ray spectroscopy (TEM-EDX) using a transmission electron microscope.

Further, it is possible to calculate the average fluorine element concentration (Eb) in the resin constituting the resin layer forming the mold (G1) and/or mold (G2) from the amount of charge. Alternatively, it is possible to measure by gas chromatography-mass spectrometry (GC/MS). For example, it is possible to identify the average fluorine element concentration by physically peeling off the resin layer forming the mold (G1) and/or mold (G2) and applying gas chromatography-mass spectrometry. On the other hand, it is also possible to identify the average fluorine element concentration (Eb) in the resin by decomposing, by a flask combustion method, a slice obtained by physically peeling off the resin layer forming the mold (G1) and/or mold (G2), and then, applying ion chromatography analysis.

<Method (5)>

It is possible to prepare the plate-shaped substrate for optics 1 (1a) by further preparing a mold (G3) from the mold (G2) obtained by the method (4) and reading the mold (G1) with the mold (G3) in the method (3). Similarly, it is possible to prepare the plate-shaped substrate for optics 1 (1a) by preparing a mold (GN+1) from a mold (GN) and reading the mold (G1) with the mold (GN+1) in the method (3).

(Film-Shaped, Reel-Shaped Substrate for Optics 1 (1a))

<Method (6)>

Using the cylindrical mold prepared by the above-mentioned method as a template, by transferring the pattern 406 to the raw material of the fine-structure layer 12 (12a), it is possible to obtain a reel-shaped substrate for optics 1 (1a). By using the cylindrical mold as a template, it is possible to obtain the substrate for optics 1 (1a) by continuous process by roll-to-roll.

For example, in the case of using a photocurable resin, it is possible to obtain the reel-shaped substrate for optics 1 (1a) by the following steps (101) to (104).

(101) A photocurable resin is applied onto a film substrate such as a PET film, TAC film, glass film, and transparent polyimide by a method such as a gravure coater, micro-gravure coater, slit coat and inkjet.

(102) Next, the photocurable resin is nipped by the film substrate and the cylindrical mold.

(103) Subsequently, light is applied from the cylindrical mold side or at least one side of the substrate to cure the photocurable resin.

(104) Finally, the substrate and the cylindrical mold are peeled off.

Before the step (101), it is preferable to perform mold release treatment on the pattern 406 surface of the cylindrical mold. Further, as coating of the photocurable resin, as well as the gravure coater method and micro-gravure coater method, it is possible to adopt a blade coater, wire bar coater, air knife coater, dip coater, comma knife coater, spray coater, curtain coater and the like.

In order to improve adhesion to the photocurable resin, the film substrate used in the step (102) may undergo easy adhesion coating (silane coupling treatment or the like), primer treatment, corona treatment, plasma treatment, UV/ozone treatment, high energy ray irradiation treatment, surface roughening treatment, porous-making treatment or the like for chemical bonds with the photocurable resin and physical bonds such as penetration. Further, in nipping the photocurable resin, it is preferable to press with a nip roll from the surface on the side opposite to the side on which the photocurable resin is applied of the film substrate.

Light irradiation in the step (103) may be performed in an environment of low oxygen. Further, a cover film may be laminated to the pattern surface of the obtained substrate for optics 1 (1a) to wind and collect.

In the case of using a thermosetting resin typified by PDMS, it is possible to obtain the reel-shaped substrate for optics 1 (1a) by the following steps (111) to (114).

(111) A thermosetting resin is applied onto a film substrate having Tg higher than a curing temperature of the thermosetting resin by a method such as a gravure coater, micro-gravure coater, inkjet and slit coat.

(112) Next, a solvent is removed in an environment of heating.

(113) Subsequently, the thermosetting resin is pressed against the pattern surface of the cylindrical mold and is heated.

(114) Finally, peel off from the substrate and the cylindrical mold.

Before the step (111), it is preferable to perform mold release treatment on the pattern 406 surface of the cylindrical mold. Further, as coating of the thermosetting resin, as well as the gravure coater method and micro-gravure coater method, it is possible to adopt a blade coater, wire bar coater, air knife coater, dip coater, comma knife coater, spray coater, curtain coater and the like.

The film substrate used in the step (111) preferably has Tg higher than the curing temperature of the thermosetting resin. Further, the film substrate may undergo easy adhesion coating (silane coupling treatment or the like), primer treatment, corona treatment, plasma treatment, UV/ozone treatment, high energy ray irradiation treatment, surface roughening treatment, porous-making treatment or the like for chemical bonds with the photocurable resin and physical bonds such as penetration. Furthermore, in nipping the thermosetting resin, it is preferable to press with a nip roller from the surface on the side opposite to the side on which the thermosetting resin is applied of the film substrate. Still furthermore, a cover film may be laminated to the pattern surface of the obtained substrate for optics 1 (1a) to wind and collect.

In the case of using a thermoplastic resin, it is possible to obtain the reel-shaped substrate for optics 1 (1a) by the following steps (121) to (124).

(121) A film substrate comprised of a thermoplastic resin is nipped between the cylindrical mold and a pressing roll.

(122) Next, pressure is applied at a temperature of Tg of the thermoplastic resin or more.

(123) Subsequently, cool to temperatures lower than Tg.

(124) Finally, the thermoplastic resin film and the cylindrical mold are peeled off.

Before the step (121), it is preferable to perform mold release treatment on the pattern 406 surface of the cylindrical mold. Further, at the time of the step (121), heating may be performed on at least one of the cylindrical mold and the pressing roll.

In heating in the step (122), heating may be performed from at least one of the cylindrical mold and the pressing roll, and it is preferable to heat at least the cylindrical mold side. Further, the obtained substrate for optics 1 (1a) may be laminated onto another substrate.

In the case of using inorganic precursors typified by metal alkoxide, it is preferable to use inorganic precursors and a photocurable resin, a thermosetting resin, or a transfer material with a photocurable resin and thermosetting resin mixed. It is possible to obtain the substrate for optics 1 (1a) by applying the above-mentioned method in the case of using the photocurable resin or in the case of using the thermosetting resin. Further, a cover film may be laminated to the pattern surface of the obtained substrate for optics 1 (1a) to wind and collect.

In addition, it is possible to use the substrate for optics 1 (1a) manufactured by continuous process as a mold to obtain the plate-shaped substrates for optics 1 (1a) of (1) to (5). By cutting the substrate for optics 1 (1a) obtained in the continuous process, it is possible to use as a mold of (1) to (5) to manufacture the plate-shaped substrate for optics 1 (1a).

<Method (7)>

A reel-shaped mold (G1) provided with the pattern 406-inverted structure is obtained from the cylindrical mold by using the method (6). Using the obtained mold (G1) as a template, by transferring the pattern again to the raw material of the fine-structure layer 12 (12a), it is possible to obtain a reel-shaped substrate for optics 1 (1a) by continuous process.

As the mold (G1), it is possible to use the substrate for optics 1 (1a) obtained in the method (6).

For example, in the case of using a photocurable resin, it is possible to obtain the substrate for optics 1 (1a) by continuous process of film-to-film in the following steps (131) to (134).

(131) A photocurable resin is deposited on the pattern 406 of the mold (G1) by a method such as a gravure coater and micro-gravure coater. Alternatively, a photocurable resin is deposited on a film-shaped substrate such as a glass film, PET film, and TAC film by a method such as a gravure coater and micro-gravure coater.

(132) Next, the photocurable resin is nipped by the substrate and the mold (G1).

(133) Subsequently, light is applied from the mold (G1) side or at least one side of the substrate to cure the photocurable resin.

(134) Finally, the substrate and the mold (G1) are peeled off.

Before the step (131), it is preferable to perform mold release treatment on the pattern 406 surface of the mold (G1). Alternatively, it is preferable to form the material constituting the pattern of the mold (G1) using a fluorine-containing resin, resin containing methyl groups, silicone typified by PDMS, or a material in combination thereof. Further, before performing the mold release treatment, a layer comprised of a metal, metal oxide, or metal and metal oxide may be formed on the pattern surface of the mold (G1). Furthermore, as coating of the photocurable resin, as well as the gravure coater method and micro-gravure coater method, it is possible to adopt a blade coater, wire bar coater, air knife coater, dip coater, comma knife coater, spray coater, curtain coater and the like.

In order to improve adhesion to the photocurable resin, the substrate used in the step (132) may undergo easy adhesion coating (silane coupling treatment or the like), primer treatment, corona treatment, plasma treatment, UV/ozone treatment, high energy ray irradiation treatment, surface roughening treatment, porous-making treatment or the like for chemical bonds with the photocurable resin and physical bonds such as penetration.

Light irradiation in the step (133) may be performed in an environment of low oxygen. Further, in nipping the photocurable resin, it is preferable to press with a nip roll from the surface on the side opposite to the side on which the photocurable resin is applied of the film substrate. Furthermore, light irradiation in the step (133) may be performed in an environment of low oxygen. Still furthermore, a cover film may be laminated to the pattern surface of the obtained substrate for optics 1 (1a) to wind and collect.

In the case of using a thermosetting resin typified by PDMS, it is possible to obtain the substrate for optics 1 (1*a*) by continuous process of film-to-film in the following steps (141) to (144).

(141) A thermosetting resin is deposited on the pattern 406 of the mold (G1) by a method such as a gravure coater and micro-gravure coater. Alternatively, a thermosetting resin is deposited on a film substrate by a method such as a gravure coater and micro-gravure coater.

(142) Next, a solvent is removed in an environment of heating.

(143) Subsequently, the thermosetting resin is pressed against the pattern surface of the mold (G1) and is heated.

(144) Finally, peel off from the thermosetting resin and the mold (G1).

The mold (G1) and film substrate preferably have Tg higher than the curing temperature of the thermosetting resin. Further, before the step (111), it is preferable to perform mold release treatment on the pattern 406 surface of the mold (G1). Alternatively, it is preferable to form the material constituting the pattern of the mold (G1) by using a fluorine-containing resin, resin containing methyl groups, silicone typified by PDMS, or a material in combination thereof. Further, before performing the mold release treatment, a layer comprised of a metal, metal oxide, or metal and metal oxide may be formed on the pattern surface of the mold (G1).

As coating of the thermosetting resin, as well as the gravure coater method and micro-gravure coater method, it is possible to adopt a blade coater, wire bar coater, air knife coater, dip coater, comma knife coater, spray coater, curtain coater and the like.

The film substrate used in the step (141) preferably has Tg higher than the curing temperature of the thermosetting resin. Further, the film substrate may undergo easy adhesion coating (silane coupling treatment or the like), primer treatment, corona treatment, plasma treatment, UV/ozone treatment, high energy ray irradiation treatment, surface roughening treatment, porous-making treatment or the like for chemical bonds with the photocurable resin and physical bonds such as penetration. Furthermore, in nipping the thermosetting resin, it is preferable to press with a nip roller from the surface on the side opposite to the side on which the thermosetting resin is applied of the film substrate. Sill furthermore, a cover film may be laminated to the pattern surface of the obtained substrate for optics 1 (1*a*) to wind and collect.

In the case of using a thermoplastic resin, it is possible to obtain the substrate for optics 1 (1*a*) by continuous process of film-to-film in the following steps (151) to (154).

(151) A film substrate comprised of a thermoplastic resin is nipped between the mold (G1) and a pressing roll.

(152) Next, pressure is applied at a temperature of Tg of the thermoplastic resin or more.

(153) Subsequently, cool to temperatures lower than Tg.

(154) Finally, the thermoplastic resin film and the mold (G1) are peeled off.

The mold (G1) preferably has Tg higher than Tg of the thermoplastic resin. Further, before the step (151), it is preferable to perform mold release treatment on the pattern 406 surface of the mold (G1). Alternatively, it is preferable to form the material constituting the pattern of the mold (G1) by using a fluorine-containing resin, resin containing methyl groups, silicone typified by PDMS, or a material in combination thereof. Further, before performing the mold release treatment, a layer comprised of a metal, metal oxide, or metal and metal oxide may be deposited on the pattern surface of the mold (G1).

At the time of the step (151), heating may be performed on at least one of the mold (G1) and the pressing roll. Further, in heating in the step (152), heating may be performed from at least one of the mold (G1) and the pressing roll, and it is preferable to heat at least the mold (G1) side. Furthermore, the obtained substrate for optics 1 (1*a*) may be laminated onto another substrate. Still furthermore, a cover film may be laminated to the pattern surface of the obtained substrate for optics 1 (1*a*) to wind and collect.

In the case of using inorganic precursors typified by metal alkoxide, it is preferable to use inorganic precursors, and a photocurable resin, a thermosetting resin, or a transfer material with a photocurable resin and thermosetting resin mixed. It is possible to obtain the substrate for optics 1 (1*a*) by applying the above-mentioned method in the case of using the photocurable resin or in the case of using the thermosetting resin. Further, a cover film may be laminated to the pattern surface of the obtained substrate for optics 1 (1*a*) to wind and collect.

In addition, it is possible to use the substrate for optics 1 (1*a*) manufactured by continuous process as a mold to obtain the plate-shaped substrates for optics 1 (1*a*) of (1) to (5). By cutting the substrate for optics 1 (1*a*) obtained in the continuous process, it is possible to use as a mold of (1) to (5) to manufacture the plate-shaped substrate for optics 1 (1*a*).

Further, by likening the obtained reel-shaped substrate for optics 1 (1*a*) to the mold (G2), and replacing the mold (G1) as described above with the mold (G2), it is possible to further obtain the substrate for optics 1 (1*a*) by continuous process of roll-to-roll. By also likening the substrate for optics 1 (1*a*) (G3) obtained herein to the mold (G1) as described above, it is possible to obtain the substrate for optics 1 (1*a*). Similarly, a mold (GN+1) is prepared from a mold (GN), and by likening the mold (GN+1) to the mold (G1) as described above, it is possible to obtain the substrate for optics 1 (1*a*).

In addition, when the pattern of the mold (GN) is comprised of the photocurable resin (GN) and the pattern of the mold (GN+1) is also comprised of the photocurable resin (GN+1), it is preferable that both of the photocurable resins (GN, GN+1) are fluorine-containing photocurable resins. By being fluorine-containing photocurable resins, it is possible to cause segregation of fluorine components to the pattern portion surface of the photocurable resin (GN). By this means, the mold (GN) has mold release properties of the pattern portion and is capable of ensuring adhesion to the substrate, and it is thereby possible to obtain the mold (GN+1) with excellence. In such a mold (GN) or mold (GN+1), it is preferable that the fluorine element concentration (Es) in the surface portion is higher than the average fluorine element concentration (Eb) in the resin forming the pattern.

In the case where the ratio (Es/Eb) between the average fluorine element concentration (Eb) in the resin layer forming the mold (GN) and/or mold (GN+1) and the fluorine element concentration (Es) in the fine pattern surface portion of the resin layer forming the mold (GN) and/or mold (GN+1) meets $1 \leq Es/Eb \leq 30000$, the above-mentioned effect is more exerted, and therefore, such a case is more preferable. Particularly, the ranges of from $3 \leq Es/Eb \leq 1500$ to $10 \leq Es/Eb \leq 100$ further improve mold release properties, and are preferable.

In addition, in the range of 20≤Es/Eb≤200 within the aforementioned widest range (1<Es/Eb≤30000), the fluorine element concentration (Es) in the resin layer surface portion forming the mold (GN) and/or mold (GN+1) is sufficiently higher than the average fluorine element concentration (Eb) in the resin layer, free energy on the surface of the mold (GN) and/or mold (GN+1) decreases effectively, and mold release properties from the transfer material resin and the materials constituting the substrate for optics 1 (1*a*) are thereby improved. Further, by lowering the average fluorine element concentration (Eb) in the in the resin layer forming the mold (GN) and/or mold (GN+1) relative to the fluorine element concentration (Es) in the resin layer surface portion forming the mold (GN) and/or mold (GN+1), the strength of the resin itself is improved, while free energy can be kept high near the substrate, and therefore, adhesion to the substrate is improved. By this means, it is possible to obtain the mold (GN) and/or mold (GN+1) which is excellent in adhesion to the substrate, excellent in mold release properties from the transfer material and the materials constituting the substrate for optics 1 (1*a*), and which enables the concave-convex shape of the nanometer size to be transferred repeatedly from resin to resin, and therefore, such a range is particularly preferable. Further, in the range of 26≤Es/Eb≤189, it is possible to further lower free energy on the resin layer surface forming the mold (GN) and/or mold (GN+1), repetition transfer properties are excellent, and therefore, the range is preferable. Furthermore, in the range of 30≤Es/Eb≤160, it is possible to maintain the strength of the resin while decreasing free energy on the resin layer surface forming the mold (GN) and/or mold (GN+1), repetition transfer properties are further improved, the range is thereby preferable, and the range of 31≤Es/Eb≤155 is more preferable. The range of 46≤Es/Eb≤155 enables the aforementioned effects to be further exerted, and is preferable.

For example, the pattern surface side area of the resin layer forming the mold (GN) and/or mold (GN+1) means an intrusion portion of approximately 1% to 10% in the thickness direction or an intrusion portion of 2 nm to 20 nm in the thickness direction, from the pattern surface side surface of the resin layer forming the mold (GN) and/or mold (GN+1) toward the substrate side. In addition, it is possible to quantify the fluorine element concentration (Es) in the pattern surface side area of the resin layer forming the mold (GN) and/or mold (GN+1) by an XPS method. The penetration length of X-rays of the XPS method is several nanometers, thus shallow, and therefore, is suitable for quantifying the Es value. As another analysis method, it is also possible to calculate Es/Eb using energy dispersive X-ray spectroscopy (TEM-EDX) using a transmission electron microscope. Further, it is possible to calculate the average fluorine element concentration (Eb) in the resin constituting the resin layer forming the mold (GN) and/or mold (GN+1) from the amount of charge. Alternatively, it is possible to measure by gas chromatography-mass spectrometry (GC/MS). For example, it is possible to identify the average fluorine element concentration by physically peeling off the resin layer forming the mold (GN) and/or mold (GN+1) and applying gas chromatography-mass spectrometry. On the other hand, it is also possible to identify the average fluorine element concentration (Eb) in the resin by decomposing, by a flask combustion method, a slice obtained by physically peeling off the resin layer forming the mold (GN) and/or mold (GN+1), and then, applying ion chromatography analysis.

<Method (8)>

The pattern 406 of the substrate for optics 1 (1*a*) manufactured from the cylindrical mold by the method (6) or (7) is transferred and formed by electrocasting typified by Ni. The obtained Ni electrocasting is processed in the shape of a cylinder, and is likened to the cylindrical mold of the method (6), and it is thereby possible to obtain the substrate for optics 1 (1*a*) by roll-to-roll process. In addition, by using the Ni electrocasting in the shape of a plate without processing in the shape of a cylinder, it is possible to use as the mold to obtain the plate-shaped substrates 1 (1*a*) of the methods (1) to (5).

(Substrate for Optics 71)

Described next is a manufacturing method of the substrate for optics 71 as shown in FIG. 21.

<Method (9)>

It is possible to obtain the substrate for optics 71 by depositing a film of the transparent dielectric layer 72 on the fine concavo-convex structure surface of the substrate for optics 1 (1*a*) obtained in any one of the methods (1) to (8).

In the case of using the reel-shaped substrate for optics 1 (1*a*) as the substrate for optics 1 (1*a*), a material of the transparent dielectric layer 72 is applied on the fine concavo-convex structure surface of the substrate for optics 1 (1*a*) with a gravure coater, micro-gravure coater method, blade coater, wire bar coater, air knife coater, dip coater, comma knife coater, spray coater, curtain coater or the like. Next, a solvent is removed, and leveling is performed on the material of the transparent dielectric layer 72 (the surface 73 on the side opposite to the fine-structure layer of the transparent dielectric layer 72 is flattened.) Subsequently, the material of the transparent dielectric layer 72 is cured (reacted), and it is thereby possible to obtain the substrate for optics 71 by continuous process. Further, a cover film may be laminated to the pattern surface of the obtained substrate for optics 71 to wind and collect.

In the case of using the plate-shaped substrate for optics 1 (1*a*) as the substrate for optics 1 (1*a*), a material of the transparent dielectric layer 72 is applied on the fine concavo-convex structure surface of the substrate for optics 1 (1*a*) by a method such as a cast method, slit coat method, inkjet method and spin coat method or a combination thereof (for example, the spin coat method is performed after performing the cast method and slit coat method.) Next, a solvent is removed, and leveling is performed on the material of the transparent dielectric layer 72 (the surface 73 on the side opposite to the fine-structure layer of the transparent dielectric layer 72 is flattened.) Subsequently, the material of the transparent dielectric layer 72 is cured (reacted), and it is thereby possible to obtain the substrate for optics 71 by a batch scheme.

<Method (10)>

It is possible to obtain the substrate for optics 71 by continuous process in the following steps (161) to (167).

(161) A material of the transparent dielectric layer 72 is applied on a substrate with surface accuracy typified by a silicon wafer by a method such as a cast method, inkjet method, spin coat method and slit coat method or a combination thereof (for example, the spin coat method is performed after performing the cast method and slit coat method.)

(162) Next, the fine concavo-convex structure surface side of the substrate for optics 1 (1*a*) obtained in any one of the above-mentioned methods (1) to (9) is pressed against the material of the transparent dielectric layer 72.

(163) After curing the material of the transparent dielectric layer 72, by peeling off the substrate for optics 1 (1*a*), the transparent dielectric layer 72 provided with the inverted shape of the pattern of the substrate for optics 1 (1a) is formed on the substrate.
(164) A film of the fine-structure layer material is deposited on the substrate by a method such as the cast method, inkjet method and spin coat method.
(165) The pattern comprised of the transparent dielectric layer 72 obtained in the step (164) is pressed.
(166) The fine-structure layer material is cured.
(167) Finally, the substrate is peeled off.
<Method (11)>

In the steps (161) and (162), the material of the transparent dielectric layer 72 is applied onto the substrate for optics 1 (1a), and then, a substrate with surface accuracy such as a silicon wafer may be pressed. Examples of the substrates with surface accuracy are silicon wafers, and resins such that the mirror surface of the silicon wafer is transferred.

In addition, a mold release layer is preferably provided on the substrate. From the viewpoint of transfer accuracy, the thickness of the mold release layer is preferably 30 nm or less, and is preferably a thickness of a single molecular layer or more. The thickness of the mold release layer is more preferably 2 nm or more from the viewpoint of mold release properties, while being more preferably 20 nm or less from the viewpoint of transfer accuracy.

Materials constituting the mold release layer are not limited, and examples of publicly-known commercially available materials are Zonyl TC coat (made by Du Pont.), Cytop CTL-107M (made by Asahi Glass Co, Ltd.), Cytop CTL-107A (made by Asahi Glass Co., Ltd.), Novec EGC-1720 (made by 3M Company), OPTOOL DSX (made by Daikin Industries, Ltd.), OPTOOL DACHP (made by Daikin industries, Ltd.), DURASURF HD-2101Z (made by Daikin Industries, Ltd.), DURASURF HD2100 (made by Dc kin Industries, Ltd.), DURASURF HD-1101Z (made by Daikin Industries, Ltd.), FTERGENT made by NEOS Company Limited (for example, M series: FTERGENT 251, FTERGENT 215M, FTERGENT 250, FIX-245M, FIX-290M; series: FIX 207S, FIX-211S, FIX-220S, FIX-230S; F series: FIX-209F, FIX-21 FTERGENT 222F, FTX-233F, FTERGENT 245F; G series: FTERGENT 208G, FTX-218G, FTX-230G, FTS-240 G; Oligomer series: FTERGENT 730FM, FTERGENT 730LM, FTERGENT P series: FTERGENT 710FL; FTX-710HL, etc.), "MEGAFAC" made by DIC Corporation (for example, F-114, F-410, F-493, F-494, F-443F-444, F-445, F-470, F-471, F-474, F-475, F-477, F-479, F-480SF, F-482, F-483, F-489, F-172D, F-178K, F-178RM, MCF-350SF, etc.), "OPTOOL™" (for example, DSX, DAC, AES) "EFTONE™" (for example, AT-100), "ZEFFLE™" (for example, GH-701), "UNIDYNE™", "DATFREE™" and "OPTOACE™" made by Dalkin Industries, Ltd., "Novec EGC-1720" made by Sumitomo 3M Limited, "Fluoro Surf" etc. made by Fluoro Technology, silicone-based resins (dimethyl silicone-based oil KF96 (made by Shin-Etsu silicone corporation), as commercially available products of modified silicone, specific examples thereof are TSF4421 (made by GE Toshiba silicone corporation), XF42-334 (made by GE Toshiba silicone corporation), XF42-B3629 (made by GE Toshiba silicone corporation), XF42-A3161 (made by GE Toshiba silicone corporation), FZ-3720 (made by Dow Corning Toray Co., Ltd.), BY 16-839 (made by Dow Corning Toray Co., Ltd.), SF8411 (made by Dow Corning Toray Co., Ltd.), FZ-3736 (made by Dow Corning Toray Co., Ltd.), BY16-876 (made by Dow Coring Toray Co., Ltd.), SF8421 (made by Dow Corning bray Co., Ltd.), SF8416 (made by Dow Corning Toray Co., Ltd.), SH203 (made by Dow Corning Toray Co., Ltd.), SH230 (made by Dow Corning Toray Co., Ltd.), SH510 (made by Dow Corning Toray Co., Ltd.), SH550 (made by Dow Corning Toray Co., Ltd.), SH710 (made by Dow Corning Toray Co., Ltd.), SF8419 (made by Dow Corning Toray Co., Ltd.), SF8422 (made by Dow Corning Toray Co., Ltd.), BY16 series (made by Dow Corning Toray Co., Ltd.), FZ3785 (made by Dow Corning Toray Co., Ltd.), KF-410 (made by Shin-Etsu Chemical Co., Ltd.), KF-412 (made by Shin-Etsu Chemical Co., Ltd.), KF-413 (made by Shin-Etsu Chemical Co Ltd.), KF-414 (made by Shin-Etsu Chemical Co., Ltd.), KF-415 (made by Shin-Etsu Chemical Co., Ltd.), KF-351A (made by Shin-Etsu Chemical Co., Ltd.), KF-4003 (made by Shin-Etsu Chemical Co., Ltd.), KF-4701 (made by Shin-Etsu Chemical. Co., Ltd.), KF-4917 (made by Shin-Etsu Chemical Co., Ltd.), KF-7235 (made by Shin-Etsu Chemical Co., Ltd.), KR213 (made by Shin-Etsu Chemical Co., Ltd.), KR500 (made by Shin-Etsu Chemical Co., Ltd.) KF-9701 (made by Shin-Et su Chemical Co., Ltd.), X-21-5841 (made by Shin-Etsu Chemical Co, Ltd.), X-22-2000 (made by Shin-Etsu Chemical Co., Ltd.), X-22-3710 (made by Shin-Etsu Chemical Co., Ltd.), X-22-7322 (made by Shin-Etsu Chemical Co., Ltd.), X-22-1877 (made by Shin-Etsu Chemical Co., Ltd.), X-22-2516 (made by Shin-Etsu Chemical Co., Ltd.) and PAM-E (made by Shin-Et su Chemical Co., Ltd. and alkane-based resins (SAMLAY forming an alkyl-based single molecular membrane and the like).

Particularly, from the viewpoint of mold release properties, materials constituting the mold release layer are preferably materials containing methyl groups, materials containing silicones and materials containing fluorine. Particularly, a silane coupling agent or silicone-based resin pi fled by PMDS enables the film thickness of the mold release layer to be thinned with ease, while enabling transfer accuracy to be held, and is therefore preferable. As the materials used in the mold release layer, a single kind may be used, or a plurality of kinds may be used at the same time. Further, in the materials forming the mold release layer, the contact angle with respect to water is preferably 90 degrees or more. Herein the contact angle means a contact angle in preparing a flat film (film without a fine pattern) using the materials forming the mold release layer.

In curing of the transparent dielectric layer 72 in the step (163), curing may be accelerated by heat and light. Further, a cover film may be disposed on the pattern surface of the obtained substrate for optics 71.
<Method (12)>

It is possible to obtain the substrate for optics 71 by continuous process in the following steps (171) to (173).
(171) A material of the transparent dielectric layer 72 is applied on a substrate with surface accuracy typified by a silicon wafer.
(172) Next, the fine concavo-convex structure surface side of the substrate for optics 1 (1a) obtained in any one of the above-mentioned methods (1) to (9) is pressed against the material of the transparent dielectric layer 72.
(173) After curing the material of the transparent dielectric layer 72, the substrate for optics 1 (1a) is peeled off.

In addition, in the steps (171) and (172), the material of the transparent dielectric layer 72 is applied onto the substrate for optics 1 (1a), and then, a substrate with surface accuracy such as a silicon wafer may be pressed. Examples of the substrates with surface accuracy are silicon wafers, and resins such that the mirror surface of the silicon wafer is transferred.

A mold release layer is preferably provided on the substrate. From the viewpoint of transfer accuracy, the thickness of the mold release layer is preferably 30 nm or less, and is preferably a thickness of a single molecular layer or more. The thickness of the mold release layer is more preferably 2 nm or more from the viewpoint of mold release properties, while being more preferably 20 nm or less from the viewpoint of transfer accuracy.

Materials constituting the mold release layer are not limited, and examples of publicly-known commercially available materials are Zonyl TC coat (made by Du Pont.), Cytop CTL-107M (made by Asahi Glass Co, Ltd.), Cytop CTL-107A (made by Asahi Glass Co., Ltd.), Novec EGC-1720 (made by 3M Company), OPTOOL DSX (made by Daikin Ltd.), OPTOOL DACHP (made by Daikin Industries, Ltd.), DURASURF HD-2101Z (made by Daikin Industries, Ltd.), DURASURF HD2100 (made by Daikin Industries, Ltd.), DURASURF HD-1101Z (made by Daikin industries, Ltd.), FTERGENT made by NEOS Company Limited (for example, M series: FTERGENT 251, FTERGENT 215M, FTERGENT 250, FTX-245M, FTX-290M; series: FTX-207S, FTX-211S, FTX-220S, FTX-230S; F series: FTX-209F, FTX-213F, FTERGENT 222F, FTX-233F, FTERGENT 245F; G series: FTERGENT 208G, FTX-218G, FTX-230G, FTS-240G. Oligomer series: FTERGENT 730FM, FTERGENT 730LM, FTERGENT P series: FTERGENT 710FL; FTX-710HL, etc.), "MEGAFAC" made by DIC Corporation (for example, F-114, F-410, F-493, F-494, F-443, F-444, F-445, F-470, F-471, F-474, F-475, F-477, F-479, F-40SF, F-482, F-483, F-489, F-172D, F-178K, F-178RM, MCF-350SF, etc.), "OPTOOL™" (for example, DSX, DAC, AES), "EFTONE™" (for example, AT-100), "ZEFFLE™" (for example, GH-701), "UNIDYNE™", "DAIFREE™" and "OPTOACE™" made by Daikin Industries, Ltd., "Novec EGC-1720" made by Suitomo 3M Limited, "Fluoro Surf" etc. made by Fluoro Technology, silicone-based resins (dimethyl silicone-based oil KF96 (made by Shin-Etsu silicone corporation), as commercially available products of modified silicone, specific examples thereof are TSF4421 (made by GE Toshiba silicone corporation), XF42-334 (made by GE Toshiba silicone corporation), XF42-B3629 (made by GE Toshiba silicone corporation), XF42-A3161 (made by GE Toshiba silicone corporation), FZ-3720 (made by Dow Corning bray Co., Ltd.), BY 16-839 (made by Dow Corning Toray Co., Ltd.), SF8411 (made by Dow Corning Toray Co., Ltd.), FZ-3736 (made by Dow Corning Toray Co., Ltd.) BY16-876 (made by Dow Corning Toray Co., Ltd., SF8421 (made by Dow Corning Toray Co., Ltd.), SF8416 (made by Dow Corning Toray Co., Ltd.), SH203 (made by Dow Corning Toray Co., Ltd.), SH230 (made by Dow Corning bray Co., Ltd.), SH510 (made by Dow Corning bray Co., Ltd.), SH550 (made by Dow Corning Toray Co., Ltd.), SH710 (made by Dow Corning Toray Co., Ltd.), SF8419 (made by Dow Corning Toray Co., Ltd.), SF8422 (made by Dow Corning Toray Co., Ltd.), BY16 series (made by Dow Corning Toray Co., Ltd.), FZ3785 (made by Dow Corning Toray Co., Ltd.), KF-410 (made by Shin-Etsu Chemical Co., Ltd.), KF-412 (made by Shin-Etsu Chemical Co., Ltd.), KF-413 (made by Shin-Etsu Chemical Co., Ltd.), KF-414 (made by Shin-Etsu Chemical Co., Ltd.), KF-41.5 (made by Shin-Etsu Chemical. Co., Ltd.), KF-351A (made by Shin-Etsu Chemical Co., Ltd.), KF-4003 (made by Shin-Etsu Chemical Co., Ltd.) KF-4701 (made by Shin-Etsu Chemical Co., Ltd.), KF-4917 (made by Shin-Etsu Chemical Co., Ltd.), KF-7235B (made by Shin-Etsu Chemical Co., Ltd.), KR213 (made by Shin-Etsu Chemical Co., Ltd.), KR500 (made by Shin-Etsu Chemical Co., Ltd.), KF-9701 (made by Shin-Etsu Chemical Co., Ltd.), X-21-5841 (made by Shin-Etsu Chemical Co., Ltd.) X-22-2000 (made by Shin-Etsu Chemical Co., Ltd.), X-22-3710 (made by Shin-Etsu Chemical Co., Ltd.), X-22-7322 (made by Shin-Etsu Chemical Co., Ltd.), X-22-1877 (made by Shin-Etsu Chemical Co., Ltd.), X-22-2516 (made by Shin-Etsu Chemical Co., Ltd.) and PAM-E (made by Shin-Etsu: Chemical Co., Ltd. and alkane-based resins (SAMLAY forming an alkyl-based single molecular membrane and the like).

Particularly, from the viewpoint of mold release properties, materials forming the mold release layer are preferably materials containing methyl groups, materials containing silicones and materials containing fluorine. Particularly, a silane coupling agent or silicone-based resin typified by PMDS enables the film thickness of the mold release layer to be thinned with ease, while enabling transfer accuracy to be held, and is therefore preferable. As the materials used in the mold release layer, a single kind may be used, or a plurality of kinds may be used at the same time. Further, in the materials forming the mold release layer, the contact angle with respect to water is prefer ably 90 degrees or more. Herein, contact angle means a contact angle in preparing a flat film (film without a fine pattern) using the materials forming the mold release layer.

In curing of the transparent dielectric layer 72 in the step (173), curing may be accelerated by heat and light. Further, a cover film may be disposed on the pattern surface of the obtained substrate for optics 71.

EXAMPLES

The present invention will specifically be described below based on Examples performed to clarify the effects of the invention. In addition, materials, used compositions, processing steps and the like in the following Examples are illustrative, and are capable of being carried into practice with modifications thereof as appropriate. Moreover, it is possible to carry into practice with modifications as appropriate without departing from the scope of the invention. Therefore, the invention is not limited to the following Examples at all.

Example 1

Cylindrical Mold Preparation

Preparation of a Mold for Resin Mold Preparation

Used as a substrate of a cylindrical mold was a cylindrical quartz glass roll with a diameter of 80 mm and a length of 50 mm. A fine structure (fine concavo-convex structure) was formed on the cylindrical quartz glass roll surface by a direct-write lithography method using a semiconductor laser by the following method.

First, a resist layer is deposited on the fine structure on the quartz glass surface by a sputtering method. The sputtering method was carried out with power of RF 100 W using CuO (containing 8 atm % of Si) as a target (resist layer). The film thickness of the resist layer after deposition was 20 nm. The cylindrical mold prepared as described above was exposed on the following conditions while rotating at linear speed s=1.0 msec.

Exposure semiconductor laser wavelength: 405 nm
Exposure laser power: 3.5 mV
D2 direction pitch Px: 398 nm
Variable width δ2 with respect to the D2 direction pitch Px: 80 nm Long period PxL in the D2 direction of the variable width δ2: 5 μm D1 direction pitch Py: 460 nm Variable width δ1 with respect to the D1 direction pitch Py: 100 nm Long period PyL in the D1 direction of the variable width δ1: 5 μm The D1 direction pitch Py is determined as described below.

Time T required for one circumference is measured using a Z-phase signal of a spindle motor as a reference, a circumferential length L is calculated from the linear speed s, and following equation (12) is obtained.

$$L = T \times s \tag{12}$$

Assuming a target pitch as Py, a value of 0.1% or less of the target pitch Py is added to adjust so that L/Py is an integer, and an effective pitch Py' is obtained by following equation (13).

$$L/Py' = m \text{ (}m \text{ is an integer)} \tag{13}$$

With respect to the target pitch Py and effective pitch Py', although strictly Py≠Py', since L/Py≈$10^7$, the equation of |Py−Py'|/Py"≈$10^{-7}$ holds, and it is possible to handle so that Py and Py' are substantially equal. Similarly, with respect to the long period PyL, an effective long period PyL' is obtained by following equation (14) so that L/PyL is an integer.

$$L/PyL' = n \text{ (}n \text{ is an integer)} \tag{14}$$

Also in this case, although strictly PyL≠PyL', since L/PyL≈$10^5$, the equation of |PyL−PyL'|/PyL'≈$10^{-5}$ holds, and it is possible to handle so that PyL and PyL' are substantially equal.

Next, from the effective pitch Py', a reference pulse frequency fy0 and modulation frequency fyL are calculated by equations (15) and (16).

$$fy0 = s/Py' \tag{15}$$

$$fyL = s/PyL' \tag{16}$$

Finally, from equations (15) and (16), a pulse frequency fy at elapsed time t from the Z-phase signal of the spindle motor is determined as in equation (17).

$$fy = fy0 + \delta1 \times \sin(t \times (fyL/fy0) \times 2\pi) \tag{17}$$

An axis feed velocity in the D2 direction is determined as described below.

The time T required for one circumference is measured using the Z-phase signal of the spindle motor as a reference, and a reference feed velocity Vx0 in the axis direction is determined from the D2 direction pitch Px as in following equation (18).

$$Vx0 = Px/T \tag{18}$$

The axis feed velocity Vx at time t is determined from the long period PxL in the D2 direction by following equation (19) and scanning is performed.

$$Vx = Vx0 + V\delta2 \cdot \sin(Px/PxL \times t \times 2\pi) \tag{19}$$

Herein, Vδ2 is a velocity variable width in the long period PxL in the D2 direction, and is expressed with the pitch variable width δ2 of the long period PxL, Px and Vx0 by following equation (20).

$$V\delta2 = \delta2 \times Vx0/Px \tag{20}$$

Next, the resist layer was developed. Development of the resist layer was carried out using 0.03 wt % of glycine aqueous solution on the condition of treatment time of 240 seconds. Next, using the developed resist layer as a mask, etching of the etching layer was performed by dry etching. Dry etching was carried out using $SF_6$ as an etching gas on the conditions of the treatment gas pressure of 1 Pa, treatment power of 300 W, and treatment time of 5 minutes. Next, only the residual resist layer was peeled off from the cylindrical mold provided with the fine structure on the surface on the condition of 6 minutes using hydrochloric acid of pH1 to prepare a cylindrical mold (mold for transfer).

(Preparation of a Resin Mold)

The obtained cylindrical quartz glass roll surface (mold for transfer) was coated with Durasurf HD-1101Z (made by Daikin Industries, Ltd.), heated at 60° C. for 1 hour, and then, allowed to stand at room temperature for 24 hours to fix. Then, cleaning was performed three times using Durasurf HD-ZV (made by Daikin Industries, Ltd.), and release treatment was performed.

Next, a reel-shaped resin mold was prepared from the obtained cylinder mold. OPTOOL DAC HP (made by Daikin Industries, Ltd.), trimethylolpropane triacrylate (made by TOAGOSEI Co., Ltd. M350), and Irgacure 184 (made by Ciba) were mixed in a ratio of 10:100:5 in parts by weight to prepare a photocurable resin. Next, the photocurable resin was coated on an easy adhesion surface of a PET film (A4100, made by Toyobo Co., Ltd.: width 300 mm, thickness 100 μm) by Micro Gravure coating (made by Yasui Seiki Co., Ltd.) so that the coating film thickness was 6 μm.

Next, the PET film coated with the photocurable resin was pressed against the cylinder mold (cylindrical mold) with a nip roll (0.1 MPa), and was irradiated with ultraviolet rays at a temperature of 25° C. and moisture of 60% under atmospheric pressure using a UV exposure apparatus (made by Fusion UV Systems Japan Co., Ltd., H bulb) so that the integral amount of exposure below the center of the lamp was 600 mJ/$cm^2$, photo-curing was carried out successively, and obtained was a reel-shaped transparent resin mold (length 200 m, width 300 mm) with the fine structure inversely transferred to the surface.

When the resin mold was observed with a scanning electron microscope, convex portions of cross-sectional shape with φ400 nm±40 nm and h800 nm±80 nm were formed in periodical structure having the following long period structure.

D2 direction pitch Px: 398 nm

Variable width δ2 with respect to the D2 direction pitch Px: 80 nm

Long period PxL in the D2 direction of the variable width δ2: 5 μm

D1 direction pitch Py: 460 nm

Variable width δ1 with respect to the D1 direction pitch Py: 100 nm

Long period PyL in the D1 direction of the variable width δ1: 5 μm

The maximum values of the dot diameter and dot height were observed in dots with the shortest dot distance from surrounding dots, the minimum values of the dot diameter and dot height were observed in dots with the widest dot distance from surrounding dots, and the dot diameters therebetween exhibited the same modulation curve as in modulation of the variable width of the distance between dots.

(Electron Microscope)

Apparatus; HITACHI s-5500

Acceleration voltage; 10 kV

MODE; Normal (Preparation of an Inversed Resin Mold)

Next, OPTOOL DAC HP (made by Daikin Industries, Ltd.), trimethylolpropane triacrylate (made by TOAGOSEI Co., Ltd. M350), and Irgacure 184 (made by Ciba) were mixed in a ratio of 10:100:5 in parts by weight to prepare a photocurable resin. The photocurable resin was coated on the easy adhesion surface of the PET film (A4100, made by Toyobo Co., Ltd.: width 300 mm, thickness 100 μm) by Micro Gravure coating (made by Yasui Seiki Co., Ltd.) so that the coating film thickness was 2 μm.

Next, the PET film coated with the photocurable resin was pressed against the above-mentioned reel-shaped resin mold with the nip roll (0.1 MPa), and was irradiated with ultraviolet rays at a temperature of 25° C. and moisture of 60% under atmospheric pressure using the UV exposure apparatus (made by Fusion UV Systems Japan Co., Ltd., H bulb) so that the integral amount of exposure below the center of the lamp was 600 mJ/cm$^2$, photo-curing was carried out successively, and obtained was a transparent resin mold sheet (length 200 mm, width 300 mm) with the fine structure inversely transferred to the surface.

(Preparation of an Organic EL Device)

An organic EL device was prepared, using the above-mentioned transparent resin mold sheet as the substrate for optics. On the surface with the fine concavities and convexities formed were layered a buffer layer, cathode, electron transport layer, hole transport layer and anode in this order. The material, film thickness and film formation method of each layer are as described below.

(1) Buffer layer: $SiO_2$ 100 nm Vacuum deposition
(2) Cathode: Ag 40 nm Vacuum deposition
(3) Electron transport layer: Tris-(8-hydroxyquinoline) aluminum (Alq3) 40 nm Vacuum deposition
(4) Hole transport layer: N,N'-diphenyl-N,N'-bis(1-naphtyl)-(1,1'-biphenyl)-(4,4'-diamine) (NPB) 60 nm Vacuum deposition
(5) Anode: ITO 150 nm Sputtering Example 2

A cylindrical mold prepared as in Example 1 was exposed on the following conditions while rotating at linear speed s=1.0 m/sec.
Exposure semiconductor laser wavelength: 405 nm
Exposure laser power: 3.5 mV
D2 direction pitch Px: 606 nm
Variable width δ2 with respect to the D2 direction pitch Px: 61 nm
Long period PxL in the D2 direction of the variable width δ2: 6 μm
D1 direction pitch Py: 700 nm
Variable width δ1 with respect to the D1 direction pitch Py: 70 nm
Long period PyL in the D1 direction of the variable width δ1: 7 μm Next, as in Example 1, obtained was a reel-shaped transparent resin mold (length 200 m, width 300 mm) with the fine structure inversely transferred. Using the reel-shaped transparent resin mold, an organic EL device (Example 2) was prepared as in Example 1.

Example 3

A cylindrical mold prepared as in Example 1 was exposed on the following conditions while rotating at linear speed s=1.0 m/sec.
Exposure semiconductor laser wavelength: 405 nm
Exposure laser power: 3.5 mV
D2 direction pitch Px: 700 nm
D1 direction pitch Py: 700 nm Control of the reference signal of the pitch Py was made only initially.

Next, as in Example 1, obtained was a reel-shaped transparent resin mold (length 200 m, width 300 mm) with the surface structure inversely transferred.

The surface of the prepared reel-shaped transparent resin mold was observed with the scanning electron microscope. Convex portions were arranged in the shape of lines with the set pitch Py in the D1 direction. Further, the line-shaped convex portions were repeatedly provided with the predetermined pitch Px in the D2 direction. Furthermore, the shift amounts σ were irregular among line-shaped convex portions arranged adjacent to one another in the D2 direction.

Using the reel-shaped transparent resin mold, an organic EL device (Example 3) was prepared as in Example 1.

Comparative Example 1

Using a smooth Ni plate without having a periodical structure, an organic EL device (Comparative Example 1) was formed on a PET substrate with a flat UV cure resin layered by the completely same operation as in Example 1.

Comparative Example 2

A fine structure was formed on a cylindrical quartz glass roll surface with a diameter of 80 mm and length of 50 mm by the same manufacturing method as in Example 1. In addition, exposure was performed on the following conditions.
Exposure semiconductor laser wavelength: 405 nm
Exposure laser power: 3.5 mV
D2 direction pitch Px: 398 nm
D1 direction pitch Py: 460 nm Next, by the same method as in Example 1, obtained was a reel-shaped resin mold (length 200 m, width 300 mm) with the fine structure inversely transferred to the surface. When the resin mold was observed with the scanning electron microscope, convex portions with cross-sectional shape of ⌀400 nm and h800 nm were formed in periodical structure having the following long-period structure.
D2 direction pitch Px: 398 nm
D1 direction pitch Py: 460 nm By the same method as in Example 1, a transparent resin mold sheet (length 200 m, width 300 mm) with the fine structure inversely transferred onto the PET film was obtained from the above-mentioned reel-shaped resin mold.

Further, using the above-mentioned transparent resin mold sheet, in the same layer configuration as in Example 1, the buffer layer, cathode, electron transport layer, hole transport layer and anode were layered in this order on the surface with the fine concavities and convexities formed to form an organic E1 device (Comparative Example 2).

(Light Emission Properties)

Luminous efficiency properties of the organic EL devices of Examples 1 to 3 and Comparative Examples 1 and 2 were measured with Spectroradiometer CS-2000 made by Konica Minolta, Inc. Results of intensity ratios with the light emission intensity of Comparative Example 1 being 1.0 are shown in following Table 1.

(Evaluation of Color Shift)

In a state in which each of the organic EL devices of Examples 1 to 3 and Comparative Examples 1 and 2 emitted light, white cylindrical paper was put around the sample, and an image projected to the paper was observed visually.

TABLE 1

| | Light emission intensity | Color sift |
|---|---|---|
| Example 1 | 1.9 | Absence |
| Example 2 | 2 | Absence |
| Example 3 | 1.7 | Absence |
| Comparative Example 1 | 1 | Absence |
| Comparative Example 2 | 1.7 | Presence |

As can be seen from Table 1, in the organic EL devices of Examples 1 to 3 and Comparative Example 1, shades of color of the entire surface were equal. In contrast thereto, in the organic EL device of Comparative Example 2, spectra like a rainbow were observed in the particular angle direction, and the color shift occurred. This is because the emitted light was separated for each wavelength by diffraction caused by the periodical structure in the organic EL device of Comparative Example 2. On the other hand, in the organic EL device of Example 1, the fine structure did not have a particular periodical structure, the scattering effect was strong due to the long-period structure, light was not observed as spectra, and the color shift did not occur.

Example 4

Substrate for Optics 1

The inversed resin mold prepared as described above was cut to the length of 50 cm.

Next, a material 1 was applied on a glass film (refractive index 1.52) with a width of 300 mm and length of 600 mm by a bar coating method. The coating film thickness was adjusted so that the solid film thickness subsequent to solvent evaporation was 1000 nm. After coating, the film was allowed to stand at room temperature for 2 minutes, and then, allowed to stand for 30 seconds in an atmosphere of 80 degrees.

Next, the fine-structure surface side of the cut inversed resin mold was laminated to the material 1 surface under a pressure of 0.01 MPa, and was allowed to stand for 24 hours in an environment of a temperature of 25° C. and moisture of 50%.

Finally, the inversed resin mold was peeled off, and obtained was the substrate for optics 1 provided with the fine structure on the glass film. When the obtained structure was observed with the electron microscope, convex portions with cross-sectional shape of φ400 nm and h800 nm were formed in periodical structure having the following long-period structure.

- D2 direction pitch Px: 433 nm
- Variable width δ2 with respect to the D2 direction pitch Px: 108 nm
- Long period PxL in the D2 direction of the variable width δ2: 5000 nm
- D1 direction pitch Py: 500 nm
- Variable width δ1 with respect to the D1 direction pitch Py: 125 nm
- Long period PyL in the D1 direction of the variable width δ1: 5000 nm (Material 1)

The material 1 was prepared by stirring and mixing TTB:3APTMS:SH710:I.184=39.5 g:39.5 g:19.7 g:1.34 g in an environment of a temperature of 25° C. and moisture of 50%. The refractive index of the material 1 was 1.513 at a wavelength of 460 nm and 1.507 at a wavelength of 550 nm.

(Substrate for Optics 2)

A silicon wafer substrate surface of 4-inch Φ was treated with UV-O3 for 15 minutes. Next, a film of Durasurf 1101Z was deposited by spin coating, and was allowed to stand in an atmosphere of a temperature of 25° C. and moisture of 50% for 12 hours. Then, using a Durasurf HD-ZV solution, spin coat cleaning was performed three times.

The substrate for optics 1 was subjected to heat treatment in an environment of a temperature of 300° C. for 1 hour. After naturally cooling, the following material 2 was applied onto the fine structure surface of the substrate for optics 1 by a bar coat method so as to obtain a solid film thickness of 10000 nm. After coating, the resultant was allowed to stand in an environment of moisture of 50% for 5 minutes, and further, was heated at 80° C. for 30 seconds.

Next, the surface coated with the material 1 was laminated onto the surface-treated silicon wafer under a pressure of 0.01 Mpa. After laminating, the resultant was allowed to stand in an atmosphere of moisture of 50% for 24 hours.

Finally, by peeling off the silicon wafer, the substrate for optics 2 was obtained. As surface accuracy on the material 1 surface side of the substrate for optics 2, Ra was 1 nm or less. The obtained substrate for optics 2 was subjected to heat treatment in an environment of a temperature of 300° C. for 1 hour.

(Material 2)

The material 2 was prepared by stirring and mixing TTB:DEDFS:TEOS:SH710=93.3 g:2.38 g:2.38 g:2.38 g in an environment of a temperature of 25° C. and moisture of 50%, next dropping 1706 ul of water diluted with ethanol to 3.25% in an atmosphere of a temperature of 80° C. while stirring, and after dropping, stirring for 6 hours. The refractive index of the material 2 was 1.893 at a wavelength of 460 nm and 1.861 at a wavelength of 550 nm.

(Preparation of an Organic EL Device)

An organic EL device (Example 4) was prepared, using the above-mentioned substrate for optics 2 prepared from the substrate for optics 1. An anode, hole transport layer, electron transport layer, cathode were layered in this order on the flattened surface comprised of the cured material of the material 1 of the substrate for optics 2.

The material, film thickness and film formation method of each layer are as described below.

- Anode: ITO 130 nm Sputtering
- Hole transport layer: N,N'-diphenyl-N,N'-bis(1-naphtyl)-(1,1'-biphenyl)-(4,4'-diamine) (NPB) 60 nm Vacuum deposition
- Electron transport layer: Tris-(8-hydroxyquinoline) aluminum (Alq3) 40 nm Vacuum deposition
- Cathode: Al 100 nm Vacuum deposition

Comparative Examples 3 to 5

Using substrates different from those of the substrates for optics 1 and 2 according to this Embodiment, organic EL devices (Comparative Examples 3 to 5) were prepared by the same methods as described above. In addition, in the organic EL device of Comparative Example 3 was used the glass substrate (flat substrate) used in preparation of the substrate for optics 1. In the organic EL device of Comparative Example 4 was used the substrate for optics 1 (in addition, without variations in the long period of the fine structure) with the fine structure of pitch 500 nm formed. In the organic EL device of Comparative Example 5 was used the substrate for optics 1 (in addition, without variations in the long period of the fine structure) with the fine structure of pitch 5000 nm formed.

The organic EL device of Comparative Example 3 was prepared in the same way as in Example 4 except the flat substrate as a substitute for the substrate for optics 2. The organic EL devices of Comparative Examples 4 and 5 were prepared in the same way as in Example 4 except that the fine structure having the respective pitch was formed on the cylindrical mold surface.

Luminous efficiency and glare were examined as described above on the organic EL devices of Example 4 and Comparative Examples 3 to 5. In addition, for luminous efficiency, "1" is set on the case of the flat substrate of the organic EL element of Comparative Example 3. For the glare, ○ indicates a state in which the glare was softened, and X indicates a state in which the glare was observed.

are capable of being modified as appropriate within the scope of exhibiting the effects of the invention. Moreover, the invention is capable of being carried into practice with modifications thereof as appropriate without departing from the scope of the object of the invention.

The present application is based on Japanese Patent Application No. 2011-284820 filed on Dec. 27, 2011 and Japanese Patent Application No. 2012-024035 filed on Feb. 7, 2012, entire contents of which are expressly incorporated by reference herein.

The invention claimed is:

1. A substrate for optics applied to an organic EL light emitting device comprised of at least an anode, a cathode

TABLE 2

| | | | | | Substrate for optics 1 | | Substrate for optics 2 | Organic EL device | |
|---|---|---|---|---|---|---|---|---|---|
| | Type | Refractive Index | Fine strcutre shape | Long period | Refractive index of fine structure | Refractive index of transparent dielectric layer | Luminous efficiency | Glare |
| Comparative Example 3 | Glass | 1.52 | None (Flat) | None | — | None | 1 | — |
| Comparative Example 4 | | | Dot shape | Px = 433 nm Py = 500 nm | | 1.507 | 1.861 | 1.28 | x |
| Comparative Example 5 | | | | Px = 4330 nm Py = 5000 nm | | | | 1.14 | x |
| Example 4 | | | | Px = 433 nm Py = 500 nm | PxL = PyL = 5000 nm | | | 1.39 | ○ |

As can be seen from Table 2, it is understood that luminous efficiency was improved in the organic EL devices (Comparative Example 4, Comparative Example 5, Example 4) using the substrates for optics each provided with the fine structure, as compared with the case (Comparative Example 3) of the organic EL device without having the fine structure. Particularly, with respect to the fine structure size, efficiency was more excellent in the case of nano-order (Comparative Example 4, Example 4) than in the case of micro-order (Comparative Example 5). Further, improvements in efficiency were the maximum in the organic EL device (Example 4) using the substrate for optics having also the long-period variation. Furthermore, in the organic EL devices of Comparative Examples 4 and 5, the glare based on diffraction was observed in visually identifying the emitted light. In contrast thereto, in the organic EL device of Example 4, since the substrate for optics having also the long-period variation was used, it was observed that the glare was softened and that viewability was improved.

Thus, according to the substrates for optics, it is possible to apply to substrates for optics for light extraction improvements, plasmonic polycrystal and the like, and it is possible to reduce the color shift caused by diffraction of light. Further, it is possible to provide light emitting devices for improving luminance, and enabling the color shift caused by diffraction of light to be reduced. The substrates for optics and light emitting devices of the present invention have high luminous efficiency while suppressing the color shift, enable power to be used effectively, and are capable of significantly contributing to energy saving.

The present invention is not limited to the above-mentioned Embodiments, and is capable of being carried into practice with various modifications thereof. In the above-mentioned Embodiments, the size, shape and the like shown in the accompanying drawings are not limited thereto, and and a light emitting layer in which the light emitting layer has one or more organic layers, comprising:

a base substrate; and a fine-structure layer formed on a main surface of the base substrate facing the light emitting layer, the fine-structure layer including a plurality of dots comprised of a plurality of convex portions or concave portions extending in a direction of from the main surface of the base substrate to outside the surface, wherein the fine-structure layer forms a plurality of dot lines in which the plurality of dots is arranged with a pitch Py in a first direction inside the main surface of the substrate, while the plurality of dot lines forms a plurality of dot lines arranged with a pitch Px in a second direction orthogonal to the first direction inside the main surface of the substrate, and one of the pitch Py and the pitch Px is a constant interval of nano-order, while the other one is an inconstant interval of nano-order, or both are inconstant intervals of nano-order, wherein the pitch Py with the inconstant interval is equal to a distance between centers of respective dots, the pitch Px with the inconstant interval is equal to a distance among centers of adjacent dot lines that the plurality of dots are arranged with the pitch Py, the pitch Py and the pitch Px are larger than a diameter of each dot, pitches Pyn among at least four or more and m or less of adjacent dots ($3 \leq n \leq 2a$ or $3 \leq n \leq 2a+1$, in addition, m and a are positive integers, $m > 4$, and $n = m-1$) meet a relationship of following equation (1) while dot groups formed with the pitches Py1 to Pyn are repeatedly arranged in the first direction when the pitch Py is the inconstant interval, and when the pitch Px is the inconstant interval, pitches Pxn among at least four or more and m or less of adjacent dots ($3 \leq n \leq 2a$ or $3 \leq n \leq 2a+1$, in addition, m and a are positive integers, $m>4$, and $n=m-1$) meet a relationship of following equation (2) while dot line groups formed with the pitches Px1 to Pxn are repeatedly arranged in the second direction, $$Py1<Py2<Py3<\ldots<Pya>\ldots>Pyn \quad (1), \text{ and}$$

$$Px1<Px2<Px3<\ldots<Pxa>\ldots>Pxn \quad (2).$$

2. The substrate for optics according to claim 1, wherein the diameter of each of the dots increases or decreases corresponding to the one or both pitch Py and the pitch Px,
dot diameters Dyn of at least four or more and m or less of adjacent dots ($3 \leq n \leq 2a$ or $3 \leq n \leq 2a+1$, in addition, m and a are positive integers, $m>4$ and $n=m-1$) forming the pitch meet a relationship of following equation (3) while dot groups formed with the dot diameters Dy1 to Dyn are repeatedly arranged in the first direction when the pitch Py is the inconstant interval,
and when the pitch Px is the inconstant interval, dot diameters Dxn of at least four or more and m or less of adjacent dots ($3 \leq n \leq 2a$ or $3 \leq n \leq 2a+1$, in addition, m and a are positive integers, $m>4$, and $n=m-1$) forming the pitch meet a relationship of following equation (4) while dot groups formed with the dot diameters Dx1 to Dxn are repeatedly arranged in the second direction, $$Dy1<Dy2<Dy3<\ldots<Dya>\ldots>Dyn \quad (3), \text{ and}$$

$$Dx1<Dx2<Dx3<\ldots<Dxa>\ldots>Dxn \quad (4).$$

3. The substrate for optics according to claim 2, wherein a height of each of the dots increases or decreases corresponding to one or both the pitch Py and the pitch Px,
dot heights Hyn of at least four or more and m or less of adjacent dots ($3 \leq n \leq 2a$ or $3 \leq n \leq 2a+1$, in addition, m and a are positive integers, $m>4$, and $n=m-1$) forming the pitch meet a relationship of following equation (5) while dot groups formed with the dot heights Hy1 to Hyn are repeatedly arranged in the first direction when the pitch Py is the inconstant interval,
and when the pitch Px is the inconstant interval, dot heights Hxn of at least four or more and m or less of adjacent dots ($3 \leq n \leq 2a$ or $3 \leq n \leq 2a+1$, in addition, m and a are positive integers, $m>4$ and $n=m-1$) forming the pitch meet a relationship of following equation (6) while dot groups formed with the dot heights Hx1 to Hxn are repeatedly arranged in the second direction, $$Hy1<Hy2<Hy3<\ldots<Hya>\ldots>Hyn \quad (5), \text{ and}$$

$$Hx1<Hx2<Hx3<\ldots<Hxa>\ldots>Hxn \quad (6).$$

4. The substrate for optics according to claim 1, wherein the substrate for optics is comprised of a resin.

5. The substrate for optics according to claim 1, wherein the substrate for optics is comprised of at least the base substrate and a material constituting the fine-structure layer, and a difference between a refractive index of the material constituting the fine-structure layer and a refractive index of the substrate is 0.15 or less.

6. The substrate for optics according to claim 1, wherein a surface of the substrate for optics is coated with a metal film.

7. The substrate for optics according to claim 1, wherein the base substrate is comprised of a metal.

8. The substrate for optics according to claim 1, further comprising:
a transparent dielectric layer, provided on the dots or the lines of the fine-structure layer of the substrate for optics, having a fine concavo-convex structure of a shape associated with the dots comprised of the plurality of convex portions or concave portions or the lines comprised of the plurality of convex portions of the fine-structure layer,
wherein a surface on the side opposite to a surface having the fine concavo-convex structure of the transparent dielectric layer is flattened.

9. A light emitting device having at least one substrate for optics according to claim 1,
wherein the light emitting layer is disposed opposite the main surface on the fine-structure layer side of the substrate for optics.

* * * * *